US009892823B2

(12) United States Patent
Gundel et al.

(10) Patent No.: US 9,892,823 B2
(45) Date of Patent: Feb. 13, 2018

(54) HIGH DENSITY SHIELDED ELECTRICAL CABLE AND OTHER SHIELDED CABLES, SYSTEMS, AND METHODS

(71) Applicant: 3M INNOVATIVE PROPERTIES COMPANY, St. Paul, MN (US)

(72) Inventors: Douglas B. Gundel, Cedar Park, TX (US); Rocky D. Edwards, Lago Vista, TX (US); Mark M. Lettang, Cedar Park, TX (US); Charles F. Staley, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 15/596,262

(22) Filed: May 16, 2017

(65) Prior Publication Data

US 2017/0256333 A1 Sep. 7, 2017

Related U.S. Application Data

(63) Continuation of application No. 15/433,183, filed on Feb. 15, 2017, which is a continuation of application (Continued)

(51) Int. Cl.
*H05K 9/00* (2006.01)
*H01B 9/02* (2006.01)
(Continued)

(52) U.S. Cl.
CPC ......... *H01B 7/0807* (2013.01); *H01B 7/0838* (2013.01); *H01B 7/0861* (2013.01); *H01B 11/002* (2013.01); *H01B 11/203* (2013.01)

(58) Field of Classification Search
CPC ... H01B 7/0861; H01B 7/0823; H01B 11/002
(Continued)

(56) References Cited

U.S. PATENT DOCUMENTS

| | | | |
|---|---|---|---|
| 2,952,728 | A | 9/1960 | Yokose |
| 3,496,281 | A | 2/1970 | McMahon |

(Continued)

FOREIGN PATENT DOCUMENTS

| | | |
|---|---|---|
| DE | 911277 | 9/1954 |
| DE | 2644252 | 9/1976 |

(Continued)

OTHER PUBLICATIONS

PCT International Search Report for PCT/US2010/060625 dated Jun. 29, 2011, 5 pages.

(Continued)

*Primary Examiner* — Timothy Thompson
*Assistant Examiner* — Rhadames J Alonzo Miller
(74) *Attorney, Agent, or Firm* — Robert S. Moshrefzadeh

(57) ABSTRACT

A shielded electrical ribbon cable includes a plurality of conductor sets. Each conductor set is surrounded by a shield and includes two insulated conductors. First and second non-conductive polymeric layers are disposed on opposite sides of the cable. The polymeric layers include cover portions and pinched portions. The cover portions surround the plurality of conductor sets, and the pinched portions form pinched portions on each side of the cable. The cable includes a transition portion on each side of the cable. At least one of the polymeric layers has a radius of curvature of at least 50 microns across an entire width of the cable. For at least one of the polymeric layers, the ratio of the minimum radius of curvature in the cover portions to the minimum radius of curvature in the transition portions is from 2 to 15.

9 Claims, 33 Drawing Sheets

Related U.S. Application Data

No. 15/427,565, filed on Feb. 8, 2017, now Pat. No. 9,666,332, which is a continuation of application No. 15/298,369, filed on Oct. 20, 2016, now Pat. No. 9,627,106, which is a continuation of application No. 15/245,735, filed on Aug. 24, 2016, now Pat. No. 9,595,371, which is a continuation of application No. 15/235,138, filed on Aug. 12, 2016, now Pat. No. 9,502,154, which is a continuation of application No. 14/822,075, filed on Aug. 10, 2015, now Pat. No. 9,449,738, which is a continuation of application No. 14/457,557, filed on Aug. 12, 2014, now Pat. No. 9,443,644, which is a continuation of application No. 13/574,627, filed as application No. PCT/US2010/060625 on Dec. 16, 2010, now Pat. No. 8,841,554.

(60) Provisional application No. 61/378,856, filed on Aug. 31, 2010.

(51) Int. Cl.

| | |
|---|---|
| ***H01B 7/18*** | (2006.01) |
| ***H01B 7/08*** | (2006.01) |
| ***H01B 11/20*** | (2006.01) |
| ***H01B 11/00*** | (2006.01) |

(58) Field of Classification Search
USPC .......................................................... 174/350
See application file for complete search history.

(56) References Cited

U.S. PATENT DOCUMENTS

| | | | | |
|---|---|---|---|---|
| 3,775,552 | A | 11/1973 | Schumacher | |
| 3,790,697 | A * | 2/1974 | Buckingham | H01B 9/02 174/102 R |
| 3,993,394 | A | 11/1976 | Cooper | |
| 4,099,323 | A | 7/1978 | Bouvier | |
| 4,149,026 | A | 4/1979 | Fritz et al. | |
| 4,185,162 | A * | 1/1980 | Bogese, II | H01B 7/0838 174/115 |
| 4,234,759 | A | 11/1980 | Harlow | |
| 4,287,385 | A | 9/1981 | Dombrowsky | |
| 4,297,522 | A | 10/1981 | Jesse et al. | |
| 4,382,236 | A | 5/1983 | Suzuki | |
| 4,404,424 | A | 9/1983 | King et al. | |
| 4,412,092 | A | 10/1983 | Hansell, III | |
| 4,413,469 | A | 11/1983 | Paquin | |
| 4,449,778 | A | 5/1984 | Lane | |
| 4,468,089 | A | 8/1984 | Brorein | |
| 4,470,195 | A | 9/1984 | Lang | |
| 4,475,006 | A * | 10/1984 | Olyphant, Jr. | H01B 7/0861 174/102 R |
| 4,481,379 | A * | 11/1984 | Bolick, Jr. | H01B 7/0838 174/117 F |
| 4,487,992 | A * | 12/1984 | Tomita | H01B 7/0838 174/115 |
| 4,490,574 | A * | 12/1984 | Tomita | H01B 7/0861 174/115 |
| 4,492,815 | A | 1/1985 | Maros | |
| 4,611,656 | A | 9/1986 | Kendall et al. | |
| 4,705,332 | A | 11/1987 | Sadigh-Behzadi | |
| 4,720,155 | A | 1/1988 | Schildkraut et al. | |
| 4,735,583 | A | 4/1988 | Rudy, Jr. et al. | |
| 4,767,345 | A | 8/1988 | Gutter et al. | |
| 4,767,891 | A | 8/1988 | Biegon et al. | |
| 4,780,157 | A | 10/1988 | Coon | |
| 4,800,236 | A | 1/1989 | Lemke | |
| 4,850,898 | A | 7/1989 | Gallusser | |
| 4,920,234 | A | 4/1990 | Lemke | |
| 5,008,489 | A | 4/1991 | Weeks et al. | |
| 5,057,646 | A | 10/1991 | Nichols et al. | |
| 5,084,594 | A | 1/1992 | Cady et al. | |
| 5,090,911 | A | 2/1992 | Welsh | |
| 5,132,489 | A | 7/1992 | Yamano | |
| 5,144,098 | A | 9/1992 | VanDeusen | |
| 5,162,611 | A * | 11/1992 | Nichols, III | H01B 7/0823 174/115 |
| 5,171,161 | A | 12/1992 | Kachlic | |
| 5,184,965 | A | 2/1993 | Myschik et al. | |
| 5,235,132 | A | 8/1993 | Ainsworth et al. | |
| 5,244,415 | A | 9/1993 | Marsilio et al. | |
| 5,250,127 | A | 10/1993 | Hara | |
| 5,268,531 | A | 12/1993 | Nguyen et al. | |
| 5,279,415 | A | 1/1994 | Edgley et al. | |
| 5,286,924 | A * | 2/1994 | Loder | H01B 7/0838 156/52 |
| 5,306,869 | A | 4/1994 | Springer et al. | |
| 5,380,216 | A | 1/1995 | Broesteeg et al. | |
| 5,416,268 | A | 5/1995 | Ellis | |
| 5,441,424 | A | 8/1995 | Morlion et al. | |
| 5,446,239 | A | 8/1995 | Mizutani et al. | |
| 5,460,533 | A | 10/1995 | Broeksteeg et al. | |
| 5,477,159 | A | 12/1995 | Hamling | |
| 5,483,020 | A | 1/1996 | Hardie et al. | |
| 5,507,653 | A | 4/1996 | Stoner | |
| 5,511,992 | A | 4/1996 | Thalhammer | |
| 5,518,421 | A | 5/1996 | Davis | |
| 5,524,766 | A | 6/1996 | Marchek et al. | |
| 5,600,544 | A | 2/1997 | Thalhammer | |
| 5,632,634 | A | 5/1997 | Soes | |
| 5,702,258 | A | 12/1997 | Provencher et al. | |
| 5,743,765 | A | 4/1998 | Andrews et al. | |
| 5,766,036 | A | 6/1998 | Ahmad et al. | |
| 5,767,442 | A | 6/1998 | Eisenberg et al. | |
| 5,775,924 | A | 7/1998 | Miskin et al. | |
| 5,804,768 | A | 9/1998 | Sexton | |
| 5,900,588 | A | 5/1999 | Springer et al. | |
| 5,934,942 | A | 8/1999 | Patel et al. | |
| 5,938,476 | A | 8/1999 | Wu et al. | |
| 5,941,733 | A | 8/1999 | Lai | |
| 6,007,385 | A | 12/1999 | Wu | |
| 6,039,606 | A | 3/2000 | Chiou | |
| 6,089,916 | A | 7/2000 | Kuo | |
| 6,207,901 | B1 | 3/2001 | Smith et al. | |
| 6,367,128 | B1 | 4/2002 | Galkiewicz et al. | |
| 6,403,887 | B1 | 6/2002 | Kebabjian et al. | |
| 6,444,902 | B1 | 9/2002 | Tsao et al. | |
| 6,524,135 | B1 | 2/2003 | Feldman et al. | |
| 6,546,604 | B2 | 4/2003 | Galkiewicz et al. | |
| 6,588,074 | B2 | 7/2003 | Galkiewicz et al. | |
| 6,630,624 | B2 | 10/2003 | Tsao et al. | |
| 6,717,058 | B2 | 4/2004 | Booth et al. | |
| 6,763,556 | B2 | 7/2004 | Fagan et al. | |
| 6,803,518 | B2 | 10/2004 | Chang | |
| 6,815,611 | B1 | 11/2004 | Gareis | |
| 6,831,230 | B2 * | 12/2004 | Ide | H01B 7/0861 174/84 R |
| 7,267,575 | B1 | 9/2007 | Hwang | |
| 7,294,786 | B2 | 11/2007 | Aldereguia | |
| 7,329,141 | B2 | 2/2008 | Kumakura et al. | |
| 7,485,809 | B2 | 2/2009 | Aldereguia | |
| 7,601,010 | B1 | 10/2009 | Wu | |
| 7,807,927 | B2 | 10/2010 | Yeh | |
| 8,841,554 | B2 | 9/2014 | Gundel et al. | |
| 2002/0020545 | A1 * | 2/2002 | Suzuki | H01B 7/0861 174/117 F |
| 2003/0085052 | A1 * | 5/2003 | Tsao | H01B 7/0861 174/113 R |
| 2003/0102148 | A1 | 6/2003 | Ohara et al. | |
| 2003/0213610 | A1 * | 11/2003 | Ide | H01B 7/0861 174/117 F |
| 2006/0013315 | A1 | 1/2006 | Song | |
| 2006/0016615 | A1 | 1/2006 | Schilson et al. | |
| 2006/0054334 | A1 | 3/2006 | Vaupotic et al. | |
| 2006/0172588 | A1 | 8/2006 | Peng | |
| 2006/0207784 | A1 | 9/2006 | Chang | |
| 2007/0240898 | A1 | 10/2007 | Reichert et al. | |
| 2010/0051314 | A1 | 3/2010 | Watanabe et al. | |
| 2010/0126752 | A1 | 5/2010 | Watanabe | |
| 2010/0186225 | A1 * | 7/2010 | Reichert | H01B 7/0838 29/825 |
| 2012/0090866 | A1 | 4/2012 | Gundel | |

(56) References Cited

U.S. PATENT DOCUMENTS

| | | | | |
|---|---|---|---|---|
| 2012/0090872 | A1 | 4/2012 | Gundel | |
| 2012/0090873 | A1 | 4/2012 | Gundel | |
| 2012/0097421 | A1 | 4/2012 | Gundel | |
| 2012/0267159 | A1 | 10/2012 | Gundel | |
| 2012/0285723 | A1 | 11/2012 | Gundel et al. | |
| 2012/0298395 | A1 | 11/2012 | Gundel | |
| 2013/0105196 | A1 | 5/2013 | Gundel et al. | |
| 2013/0146326 | A1 | 6/2013 | Gundel et al. | |
| 2013/0146327 | A1* | 6/2013 | Gundel ................ | H01B 7/0861 174/103 |
| 2013/0168149 | A1 | 7/2013 | Gundel | |
| 2014/0000931 | A1* | 1/2014 | Gundel ................ | H01B 7/0861 174/105 R |
| 2014/0014406 | A1* | 1/2014 | Gundel ................ | H01B 7/0861 174/350 |

FOREIGN PATENT DOCUMENTS

| | | |
|---|---|---|
| DE | 2547152 | 4/1977 |
| DE | 2758472 | 12/1977 |
| DE | 3522173 | 7/1986 |
| EP | 0 082 700 | 6/1983 |
| EP | 103430 | 3/1984 |
| EP | 0 284 245 | 9/1988 |
| EP | 0 366 046 | 5/1990 |
| EP | 0 446 980 | 9/1991 |
| EP | 0 477 006 | 3/1992 |
| EP | 0 548 942 | 6/1993 |
| EP | 0 654 859 | 5/1995 |
| EP | 0 696 085 | 2/1996 |
| EP | 0 907 221 | 4/1999 |
| EP | 0 961 298 | 12/1999 |
| EP | 2 086 058 | 8/2009 |
| GB | 1 546 609 | 5/1979 |
| JP | S60-124315 | 7/1985 |
| JP | 60 140309 | 9/1985 |
| JP | 61 133914 | 8/1986 |
| JP | S61-194218 | 12/1986 |
| JP | S61-292814 | 12/1986 |
| JP | S62-226508 | 10/1987 |
| JP | 1023947 | 1/1989 |
| JP | H03-48808 U | 7/1989 |
| JP | H01-298605 | 12/1989 |
| JP | 4 36906 | 2/1992 |
| JP | H06-5042 | 1/1994 |
| JP | 08-203350 | 8/1996 |
| JP | 1998-223056 | 8/1998 |
| JP | H10-223056 | 8/1998 |
| JP | 2000082346 | 3/2000 |
| JP | 2001135157 | 5/2001 |
| JP | 2001-326007 | 11/2001 |
| JP | 2002-117731 | 4/2002 |
| JP | 2003-045240 | 2/2003 |
| JP | 2003281944 | 10/2003 |
| JP | 2005-108754 | 4/2005 |
| JP | 2005-116300 | 4/2005 |
| JP | 2006 286480 | 10/2006 |
| JP | 2007-059323 | 3/2007 |
| JP | 2007265640 | 10/2007 |
| JP | 2008-77952 | 4/2008 |
| JP | 4164979 | 8/2008 |
| JP | 2009093934 | 4/2009 |
| JP | 2009-181792 | 8/2009 |
| JP | 2010 097882 | 4/2010 |
| WO | 2006/113702 | 10/2006 |
| WO | 2009/130859 | 10/2009 |

OTHER PUBLICATIONS

PCT International Search Report for PCT/US2010/060640 dated Jul. 21, 2011, 5 pages.

PCT International Search Report for PCT/US2010/060629 dated Oct. 17, 2011, 7 pages.

Extended European Search Report from EP 13183059.8 dated May 16, 2014, 8 pages.

De Araujo, D.N. et al. "Full-Wave, TwinAx, Differential Cable Modeling", IEEE, 2008 Electronic Components and Technology Conference, pp. 1684-1689.

* cited by examiner

HIGH DENSITY SHIELDED ELECTRICAL CABLE AND OTHER SHIELDED CABLES, SYSTEMS, AND METHODS

FIELD OF THE INVENTION

This invention relates generally to shielded electrical ribbon cables suitable for data transmission and associated articles, systems, and methods, with particular application to ribbon cables that can be mass-terminated and provide high speed electrical properties.

BACKGROUND

Electrical cables for transmission of electrical signals are known. One common type of electrical cable is a coaxial cable. Coaxial cables generally include an electrically conductive wire surrounded by an insulator. The wire and insulator are surrounded by a shield, and the wire, insulator, and shield are surrounded by a jacket. Another common type of electrical cable is a shielded electrical cable comprising one or more insulated signal conductors surrounded by a shielding layer formed, for example, by a metal foil. To facilitate electrical connection of the shielding layer, a further un-insulated conductor is sometimes provided between the shielding layer and the insulation of the signal conductor or conductors. Both these common types of electrical cable normally require the use of specifically designed connectors for termination and are often not suitable for the use of mass-termination techniques, i.e., the simultaneous connection of a plurality of conductors to individual contact elements, such as, e.g., electrical contacts of an electrical connector or contact elements on a printed circuit board. Although electrical cables have been developed to facilitate these mass-termination techniques, these cables often have limitations in the ability to mass-produce them, in the ability to prepare their termination ends, in their flexibility, and in their electrical performance. In view of the advancements in high speed electrical and electronic components, a continuing need exists for electrical cables that are capable of transmitting high speed signals, facilitate mass-termination techniques, are cost-effective, and can be used in a large number of applications.

BRIEF SUMMARY

We have developed shielded electrical cables suitable for high speed data transmission that have unique and beneficial properties and characteristics, as well as systems utilizing such cables, and methods relating to such cables and systems. The cables are typically in a generally planar or ribbon format, with multiple channels or conductor sets extending along a length dimension of the cable and spaced apart from each other along a width dimension of the cable.

Some cables provide high packing density in a limited cable width, preferably while maintaining adequate high frequency electrical isolation and/or low crosstalk between different channels or conductor sets of the cable. Some cables provide an on-demand or localized drain wire feature. Some cables provide multiple drain wires, and attach the drain wires differently to different termination components on opposite ends of the cable. Some cables provide mixed conductor sets, e.g., one or more conductor sets adapted for high speed data transmission, and one or more conductor sets adapted for lower speed data transmission or power transmission. Some cables may provide only one of these beneficial design features, while others may provide combinations of some or all of these features.

The present application therefore discloses, inter alia, a shielded electrical ribbon cable that may include conductor sets each including one or more insulated conductors, and a first and second shielding film on opposite sides of the cable. In transverse cross section, cover portions of the shielding films may substantially surround each conductor set, and pinched portions of the films may form pinched portions of the cable on each side of each conductor set. Dense packing can be achieved while maintaining high frequency electrical isolation between conductor sets. When the cable is laid flat, a quantity S/Dmin may be in a range from 1.7 to 2, where S is a center-to-center spacing between nearest insulated conductors of two adjacent conductor sets, and Dmin is the lesser of the outer dimensions of such nearest insulated conductors. Alternatively, a first and second conductor set each having only one pair of insulated conductors can satisfy a condition that $\Sigma/\sigma$ is in a range from 2.5 to 3, where $\Sigma$ is a center-to-center spacing of the conductor sets, and $\sigma$ is a center-to-center spacing of the pair of insulated conductors of one of the conductor sets.

In some cases, each pair of adjacent conductor sets in the plurality of conductor sets may have a quantity corresponding to S/Dmin in the range from 1.7 to 2. In some cases, each of the conductor sets may have only one pair of insulated conductors, and a quantity $\Sigma avg/\sigma avg$ may be in a range from 2.5 to 3, where $\sigma avg$ is an average center-to-center spacing of the pair of insulated conductors for the various conductor sets, and $\Sigma avg$ is an average center-to-center spacing between adjacent conductor sets. In some cases, cover portions of the first and second shielding films in combination substantially surround each conductor set by encompassing at least 75% of a periphery of each conductor set. In some cases, the first conductor set may have a high frequency isolation between adjacent insulated conductors characterized by a crosstalk C1 at a specified frequency in a range from 3-15 GHz and for a 1 meter cable length, and a high frequency isolation between the first and second conductor sets may be characterized by a crosstalk C2 at the specified frequency, and C2 may be at least 10 dB lower than C1. In some cases, one or both shielding films may include a conductive layer disposed on a dielectric substrate. In some cases, the cable may include a first drain wire in electrical contact with at least one of the first and second shielding films. Second cover portions of the first and second shielding films may substantially surround the first drain wire in transverse cross section. The first drain wire may be characterized by a drain wire distance $\sigma\mathbf{1}$ to a nearest insulated wire of a nearest conductor set, and the nearest conductor set may be characterized by a center-to-center spacing of insulated conductors of $\sigma\mathbf{2}$, and $\sigma\mathbf{1}/\sigma\mathbf{2}$ may be greater than 0.7.

The cable may also include at least eight conductor sets, each conductor set having only one pair of insulated conductors, and the width of the cable may be no greater than 16 mm when laid flat, even in cases where the cable includes at least one or two drain wires. This compact width dimension can allow the flat cable to connect to one end of a standard 4 channel or 4 lane mini-SAS paddle card, whose approximate width is 15.6 mm. With such a configuration, 4 high speed shielded transmit pairs and 4 high speed shielded receive pairs can be accommodated in a mini-SAS paddle card using only one ribbon cable, rather than having to connect multiple ribbon cables to such paddle card. Attaching only one ribbon cable to the paddle card increases fabrication speed and reduces complexity, and allows for increased flexibility and reduced bending radius since one ribbon cable bends more readily than two ribbon cables stacked atop each other.

The cables may be combined with a paddle card or other substrate having a plurality of conductive paths thereon each extending from a first end to a second end of the substrate. Individual conductors of the insulated conductors of the cable may attach to corresponding ones of the conductive paths at the first end of the substrate. In some cases, all of the corresponding conductive paths may be disposed on one major surface of the substrate. In some cases, at least one of the corresponding conductive paths may be disposed on one major surface of the substrate, and at least another of the corresponding conductive paths may be disposed on an opposed major surface of the substrate. In some cases, at least one of the conductive paths may have a first portion on a first major surface of the substrate at the first end, and a second portion on an opposed second major surface of the substrate at the second end. In some cases, alternating ones of the conductor sets may attach to conductive paths on opposite major surfaces of the substrate.

The present application also discloses shielded electrical cable that includes a plurality of conductor sets, a first shielding film, and a first drain wire. The plurality of conductor sets extend along a length of the cable and are spaced apart from each other along a width of the cable, each conductor set including one or more insulated conductors. The first shielding film may include cover portions and pinched portions arranged such that the cover portions cover the conductor sets and the pinched portions are disposed at pinched portions of the cable on each side of each conductor set. The first drain wire may be in electrical contact with the first shielding film and may also extend along the length of the cable. Electrical contact of the first drain wire to the first shielding film may be localized at at least a first treated area.

The electrical contact of the first drain wire to the first shielding film at the first treated area may be characterized by a DC resistance of less than 2 ohms. The first shielding film may cover the first drain wire at the first treated area and at a second area, the second area being at least as long as the first treated area, and a DC resistance between the first drain wire and the first shielding film may be greater than 100 ohms at the second area. In some cases, a dielectric material may separate the first drain wire from the first shielding film at the second area, and at the first treated area there may be little or no separation of the first drain wire from the first shielding film by the dielectric material.

In a related method, a cable may be provided that includes a plurality of conductor sets, a first shielding film, and a drain wire. The first shielding film may include cover portions and pinched portions arranged such that the cover portions cover the conductor sets and the pinched portions are disposed at pinched portions of the cable on each side of each conductor set. The first drain wire may extend along the length of the cable. The method may further include selectively treating the cable at a first treated area to locally increase or establish electrical contact of the first drain wire to the first shielding film in the first treated area.

A DC resistance between the first drain wire and the first shielding film at the first treated area may be greater than 100 ohms before the selectively treating step, and less than 2 ohms after the selectively treating step. The selectively treating may include selectively applying force to the cable at the first treated area. The selectively treating may also include selectively heating the cable at the first treated area. The cable may also include a second drain wire extending along the length of the cable but spaced apart from the first drain wire, and the selectively treating may not substantially increase or establish electrical contact of the second drain wire to the first shielding film. In some cases, the cable may further include a second shielding film, and the selectively treating may also locally increase or establish electrical contact of the first drain wire to the second shielding film in the first treated area.

The present application also discloses shielded electrical cable that includes a plurality of conductor sets, a first shielding film, and first and second drain wires. The plurality of conductor sets may extend along a length of the cable and be spaced apart from each other along a width of the cable, each conductor set including one or more insulated conductors. The first shielding film may include cover portions and pinched portions arranged such that the cover portions cover the conductor sets and the pinched portions are disposed at pinched portions of the cable on each side of each conductor set. The first and second drain wires may extend along the length of the cable, and may be electrically connected to each other at least as a result of both of them being in electrical contact with the first shielding film. For example, a DC resistance between the first shielding film and the first drain wire may be less than 10 ohms, or less than 2 ohms. This cable may be combined with one or more first termination components at a first end of the cable and one or more second termination components at a second end of the cable.

In such combination, the first and second drain wires may be members of a plurality of drain wires extending along the length of the cable, and a number n1 of the drain wires may connect to the one or more first termination components, and a number n2 of the drain wires may connect to the one or more second termination components. The number n1 may not be equal to n2. Furthermore, the one or more first termination components may collectively have a number m1 of first termination components, and the one or more second termination components may collectively have a number m2 of second termination components. In some cases, n2>n1, and m2>m1. In some cases, m1=1. In some cases, m1=m2. In some cases, m1<m2. In some cases, m1>1 and m2>1.

In some cases, the first drain wire may electrically connect to the one or more first termination components but may not electrically connect to the one or more second termination components. In some cases, the second drain wire may electrically connect to the one or more second termination components but may not electrically connect to the one or more first termination components.

The present application also discloses shielded electrical cable that includes a plurality of conductor sets and a first shielding film. The plurality of conductor sets may extend along a length of the cable and be spaced apart from each other along a width of the cable, each conductor set including one or more insulated conductors. The first shielding film may include cover portions and pinched portions arranged such that the cover portions cover the conductor sets and the pinched portions are disposed at pinched portions of the cable on each side of each conductor set. Advantageously, the plurality of conductor sets may include one or more first conductor sets adapted for high speed data transmission and one or more second conductor sets adapted for power transmission or low speed data transmission.

The electrical cable may also include a second shielding film disposed on an opposite side of the cable from the first shielding film. In some cases, the cable may include a first drain wire in electrical contact with the first shielding film and also extending along the length of the cable. A DC resistance between the first shielding film and the first drain wire may be less than 10 ohms, or less than 2 ohms, for example. The one or more first conductor sets may include a first conductor set comprising a plurality of first insulated conductors having a center-to-center spacing of σ1, and the one or more second conductor sets may include a second conductor set comprising a plurality of second insulated conductors having a center-to-center spacing of σ2, and σ1 may be greater than σ2. The insulated conductors of the one or more first conductor sets may all be arranged in a single plane when the cable is laid flat. Furthermore, the one or more second conductor sets may include a second conductor set having a plurality of the insulated conductors in a stacked arrangement when the cable is laid flat. The one or more first conductor sets may be adapted for maximum data transmission rates of at least 1 Gbps (i.e., 1 giga-bit per second, or about 0.5 GHz), up to e.g. 25 Gbps (about 12.5 GHz) or more, or for a maximum signal frequency of at least 1 GHz, for example, and the one or more second conductor sets may be adapted for maximum data transmission rates that are less than 1 Gbps (about 0.5 GHz) or less than 0.5 Gbps (about 250 MHz), for example, or for a maximum signal frequency of less than 1 GHz or 0.5 GHz, for example. The one or more first conductor sets may be adapted for maximum data transmission rates of at least 3 Gbps (about 1.5 GHz).

Such an electrical cable may be combined with a first termination component disposed at a first end of the cable. The first termination component may include a substrate and a plurality of conductive paths thereon, the plurality of conductive paths having respective first termination pads arranged on a first end of the first termination component. The shielded conductors of the first and second conductor sets may connect to respective ones of the first termination pads at the first end of the first termination component in an ordered arrangement that matches an arrangement of the shielded conductors in the cable. The plurality of conductive paths may have respective second termination pads arranged on a second end of the first termination component that are in a different arrangement than that of the first termination pads on the first end.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

Figure 18A:
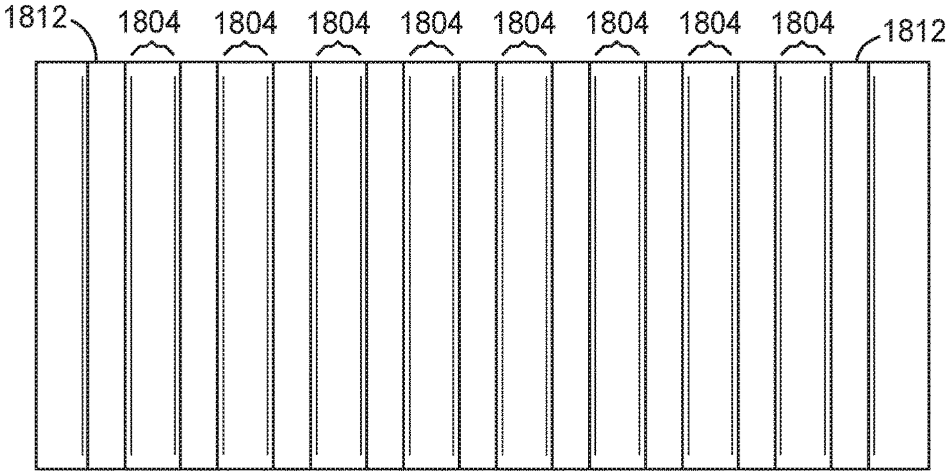
Figure 18B:
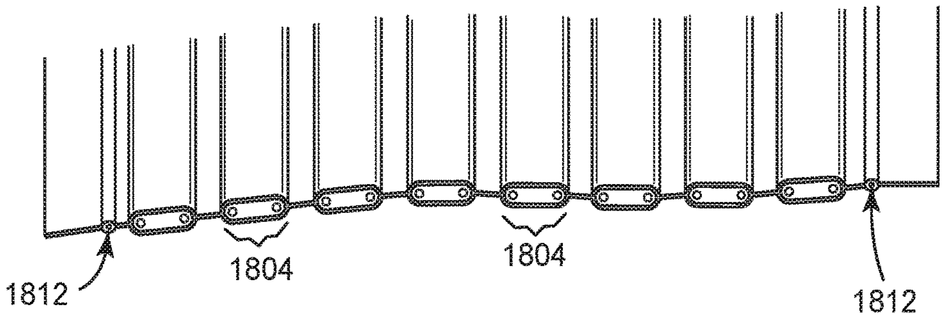

The resulting cable made by this process was photographed and is shown in top view in FIG. 18*a*, and an oblique view of the end of the cable is shown in FIG. 18*b*.

Figure 19:
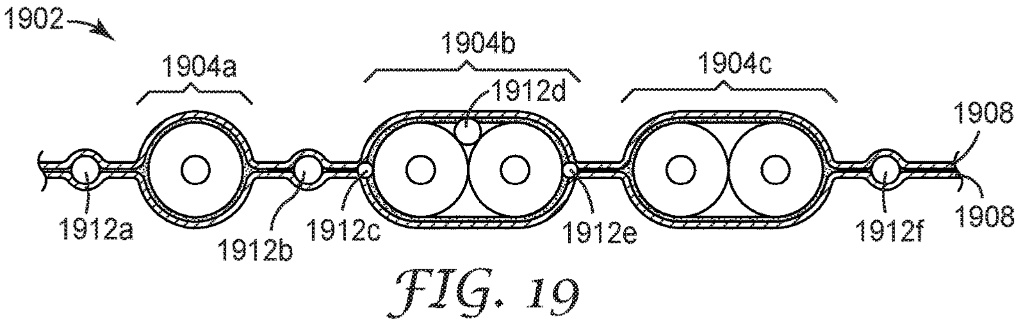
Figure 20A:
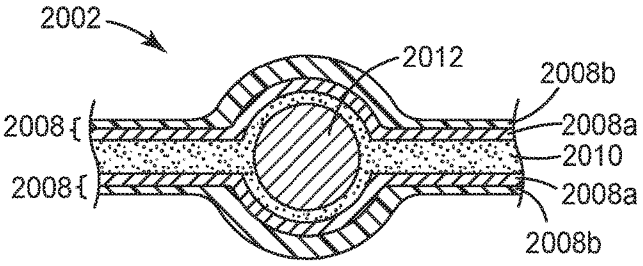
Figure 20B:
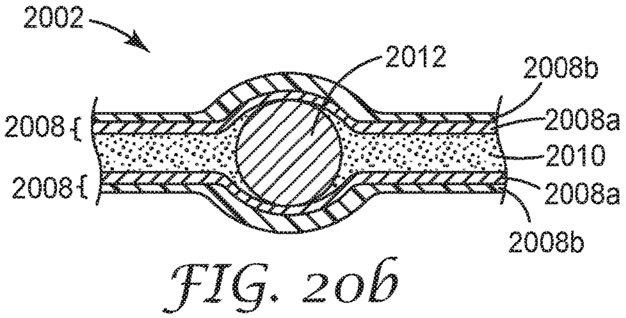
Figure 21:
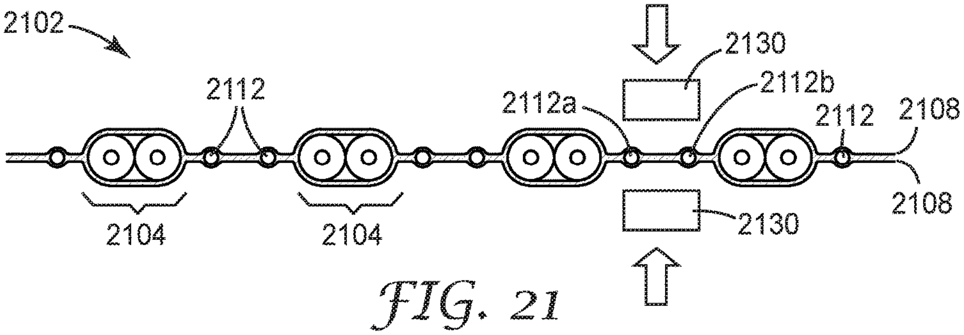
Figure 22A:
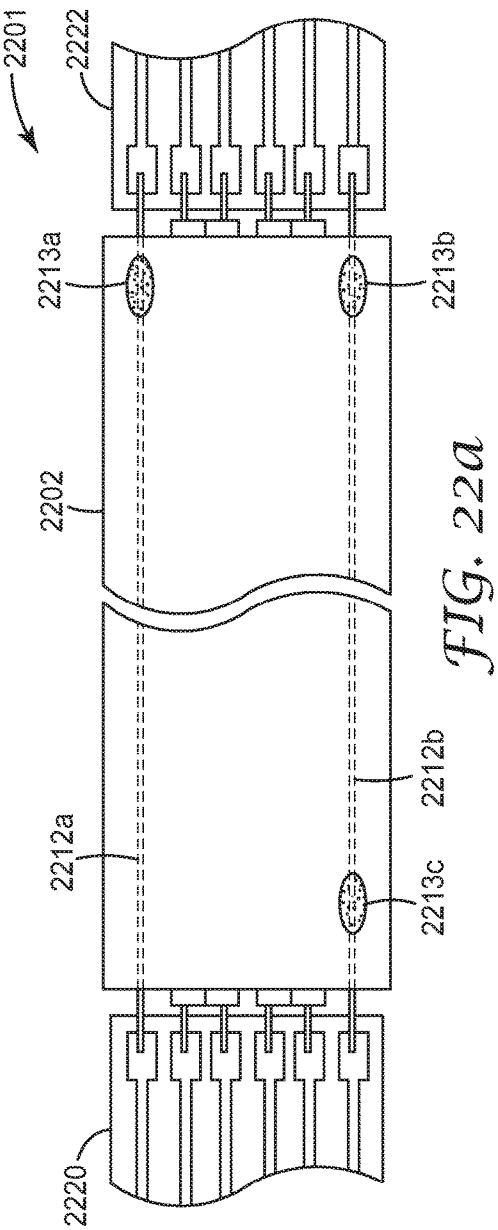
Figure 22B:
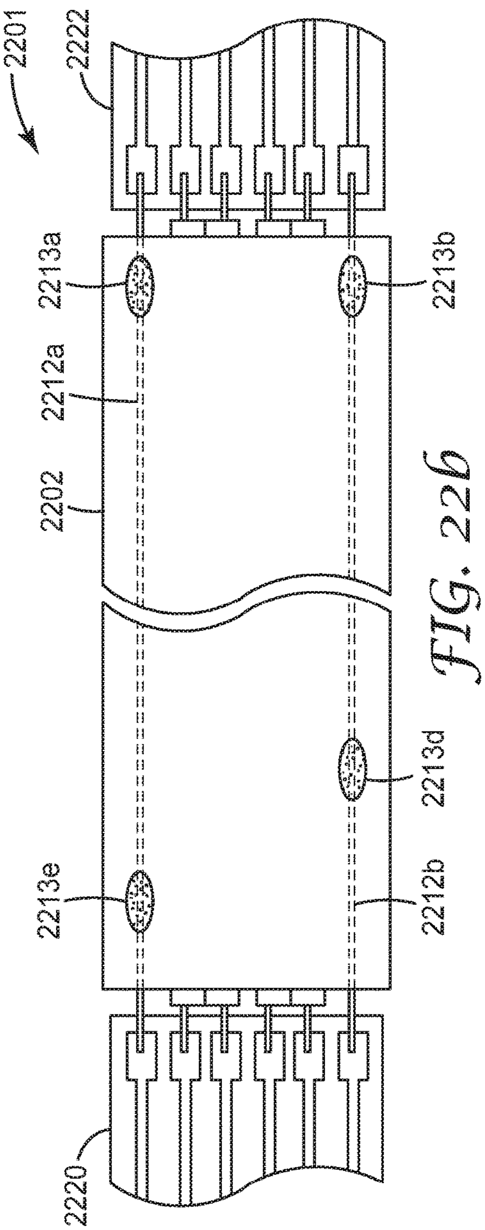
Figure 23:
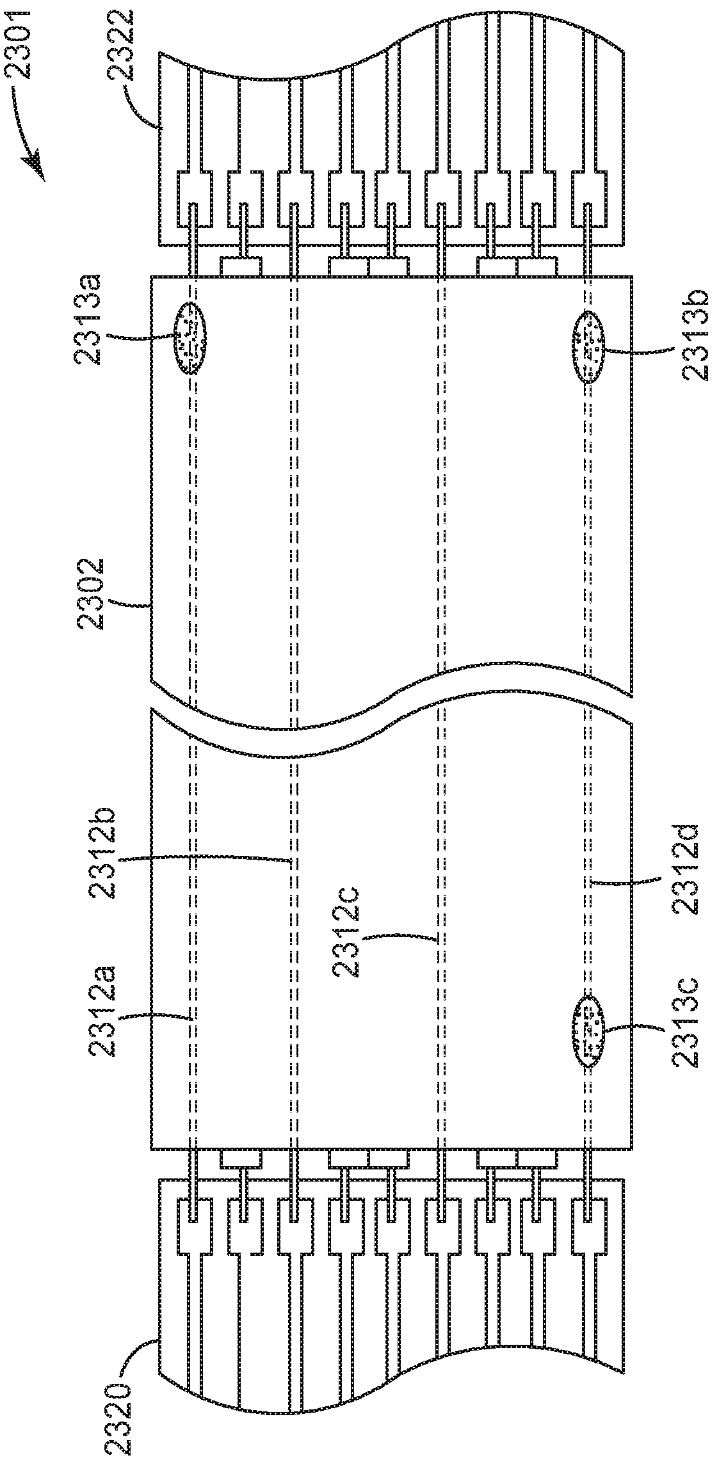
Figure 24A:
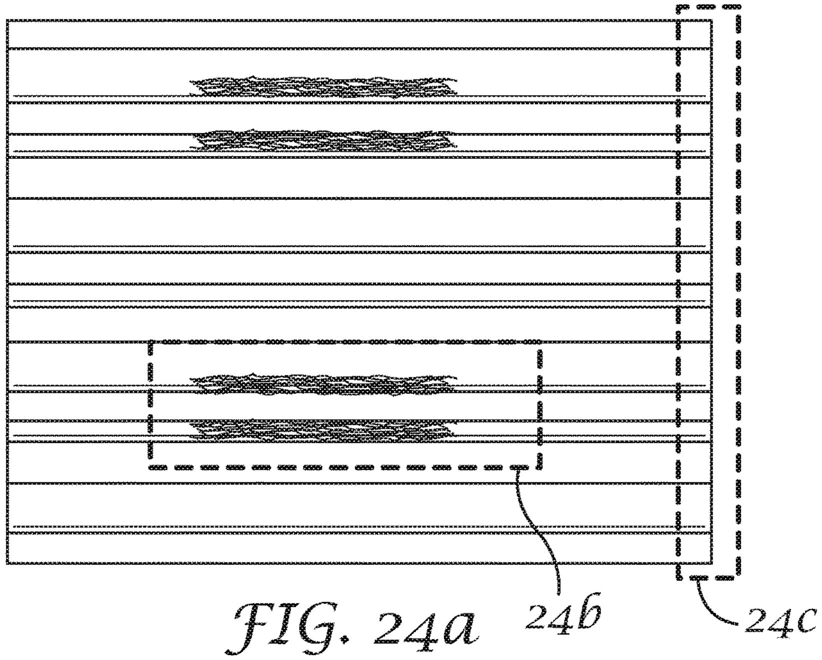
Figure 24B:
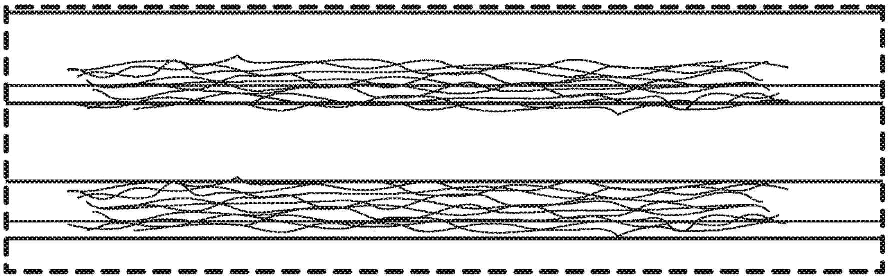
Figure 24C:
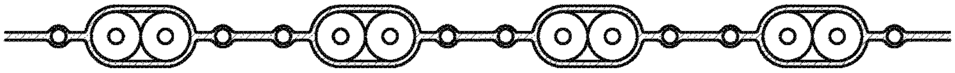

FIGS. 18*a* and 18*b* are photographs of a shielded electrical cable that was fabricated, with FIG. 18*a* being a top view thereof and FIG. 18*b* showing an oblique view of an end of the cable;

FIG. 19 is a front cross-sectional view of an exemplary shielded electrical cable showing some possible drain wire positions;

FIGS. 20*a* and 20*b* are detailed front cross-sectional views of a portion of a shielded cable, demonstrating one technique for providing on-demand electrical contact between a drain wire and shielding film(s) at a localized area;

FIG. 21 is a schematic front cross-sectional view of a cable showing one procedure for treating the cable at a selected area to provide on-demand contact;

FIGS. 22*a* and 22*b* are top views of a shielded electrical cable assembly, showing alternative configurations in which one may choose to provide on-demand contact between drain wires and shielding film(s);

FIG. 23 is a top view of another shielded electrical cable assembly, showing another configuration in which one may choose to provide on-demand contact between drain wires and shielding film(s);

FIG. 24*a* is a photograph of a shielded electrical cable that was fabricated and treated to have on-demand drain wire contacts, and FIG. 24*b* is an enlarged detail of a portion of FIG. 24*a*, and FIG. 24*c* is a schematic representation of a front elevational view of one end of the cable of FIG. 24*a;*

Figure 25:
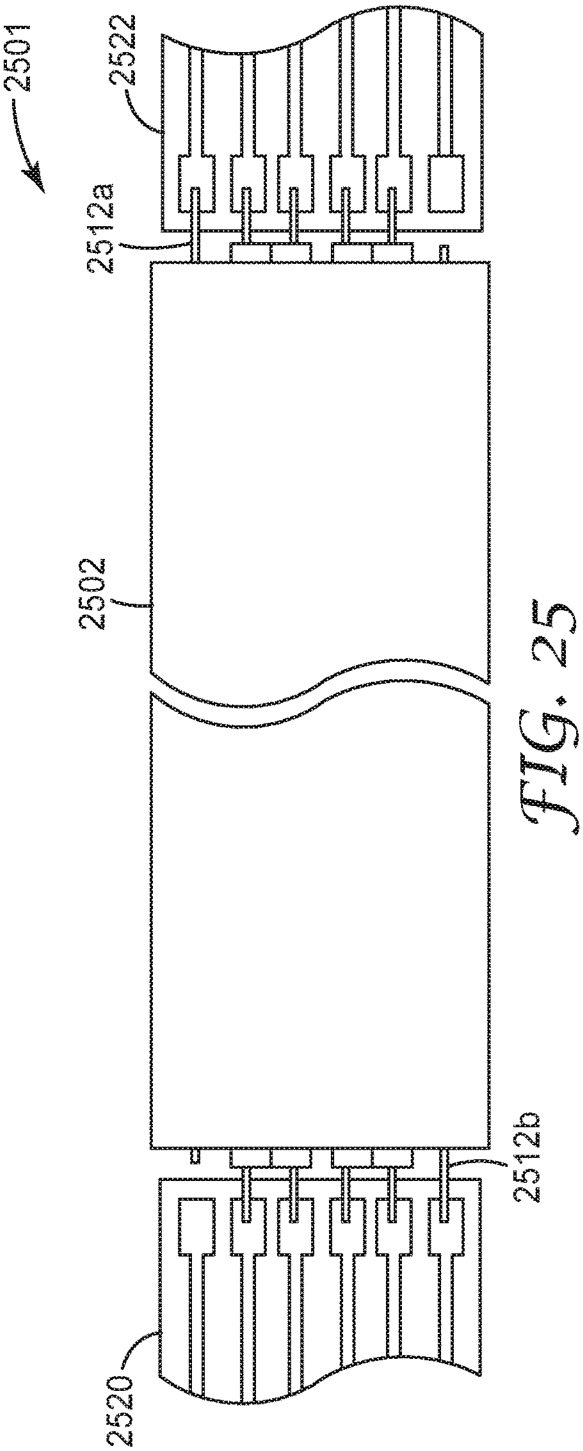
Figure 26A:
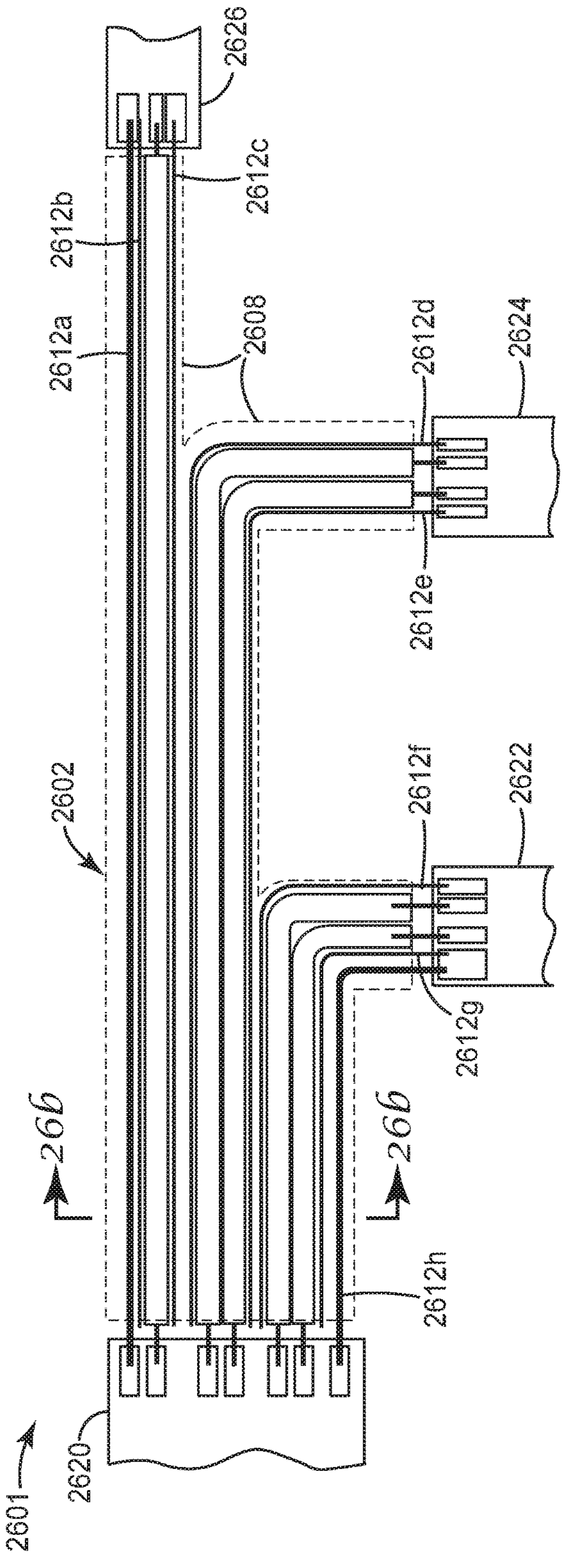
Figure 26B:
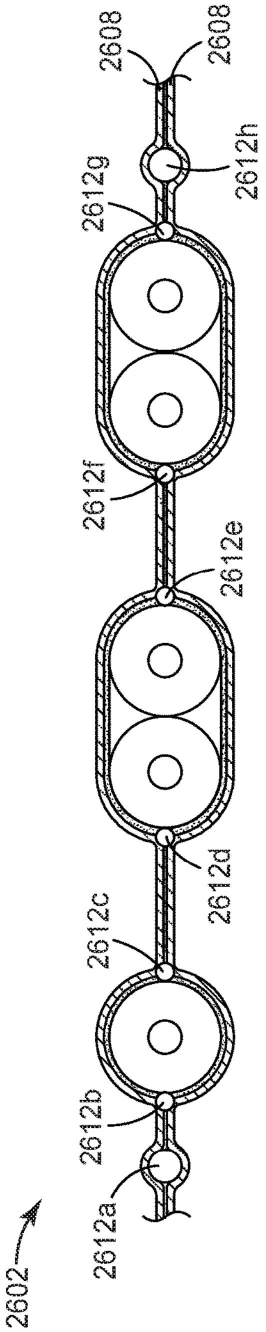

FIG. 25 is a top view of a shielded electrical cable assembly that employs multiple drain wires coupled to each other through a shielding film;

FIG. 26*a* is a top view of another shielded electrical cable assembly that employs multiple drain wires coupled to each other through a shielding film, the assembly being arranged in a fan-out configuration, and FIG. 26*b* is a cross-sectional view of the cable at line 26*b*-26*b* of FIG. 26*a;*

Figure 27A:
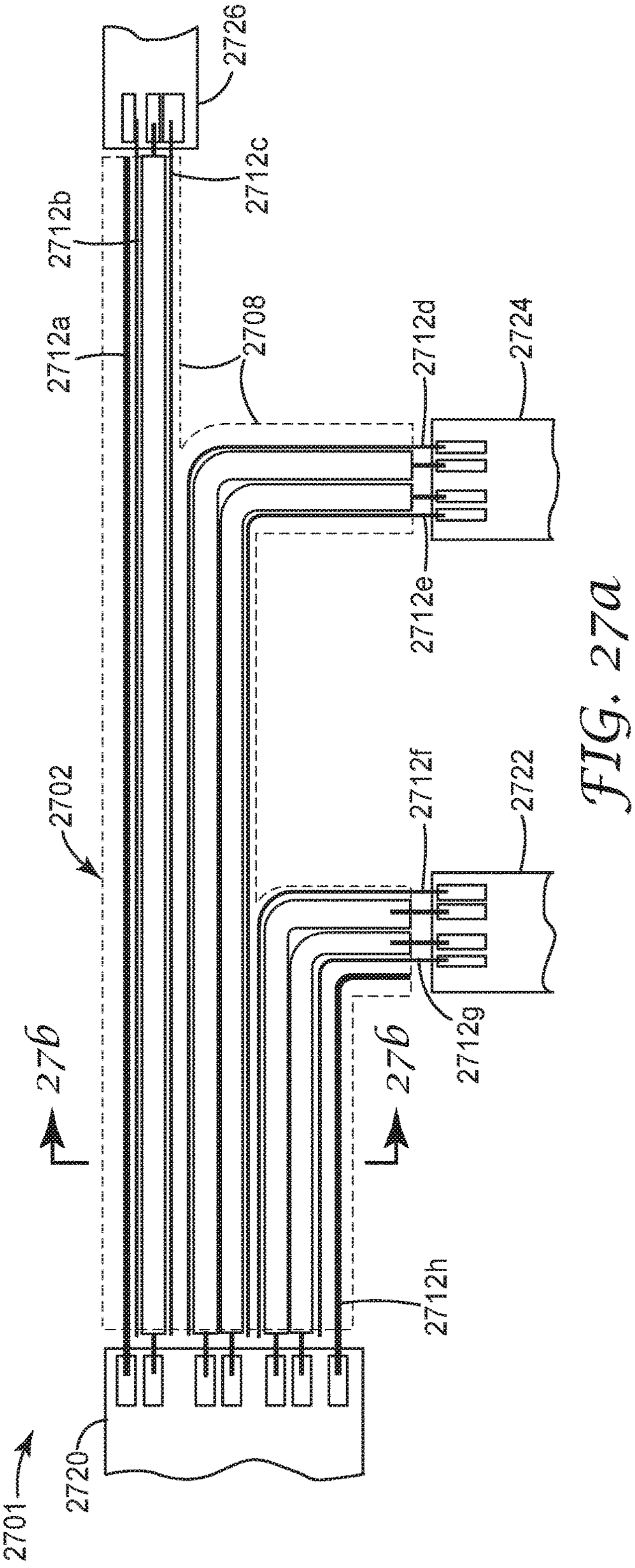
Figure 27B:
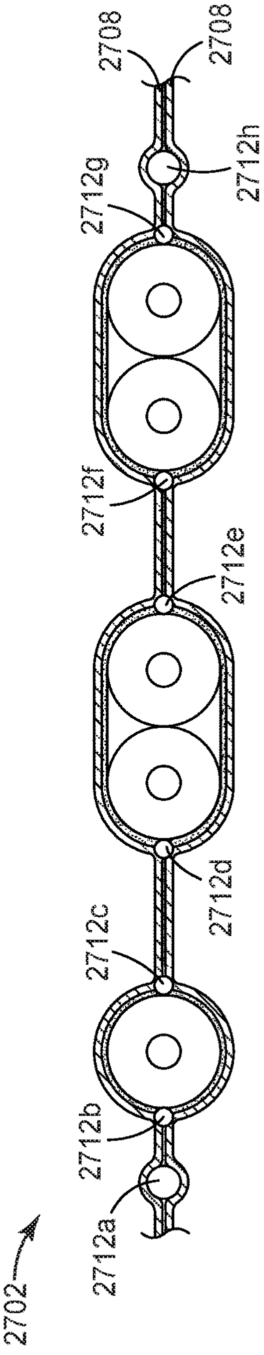

FIG. 27*a* is a top view of another shielded electrical cable assembly that employs multiple drain wires coupled to each other through a shielding film, the assembly also being arranged in a fan-out configuration, and FIG. 27*b* is a cross-sectional view of the cable at line 27*b*-27*b* of FIG. 27*a;*

Figure 29:
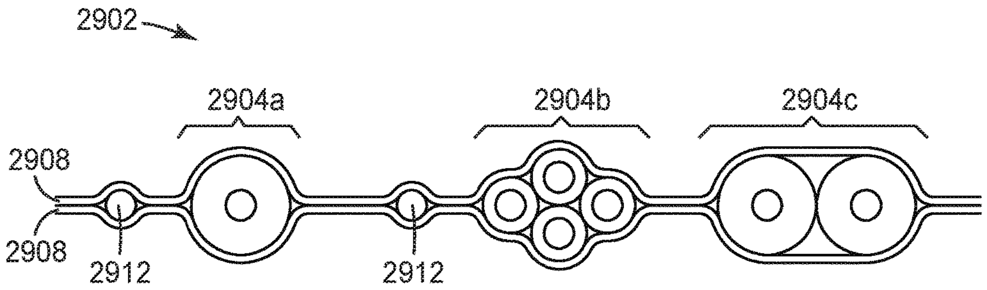
Figure 29A:
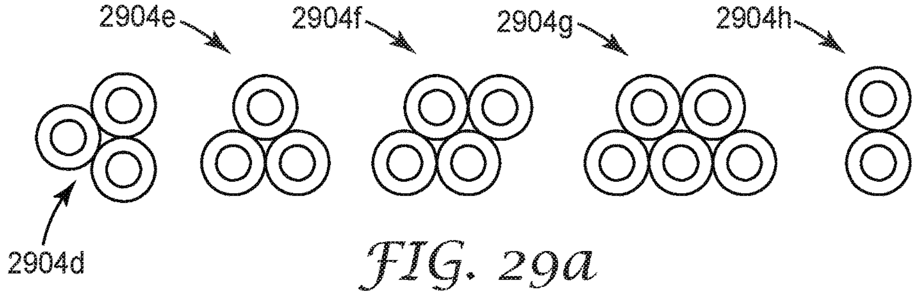
Figure 30A:
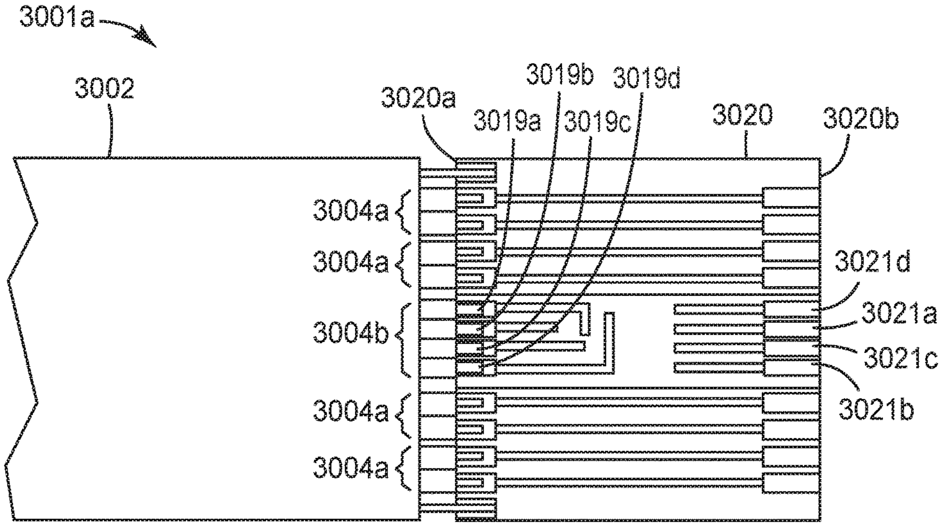
Figure 30B:
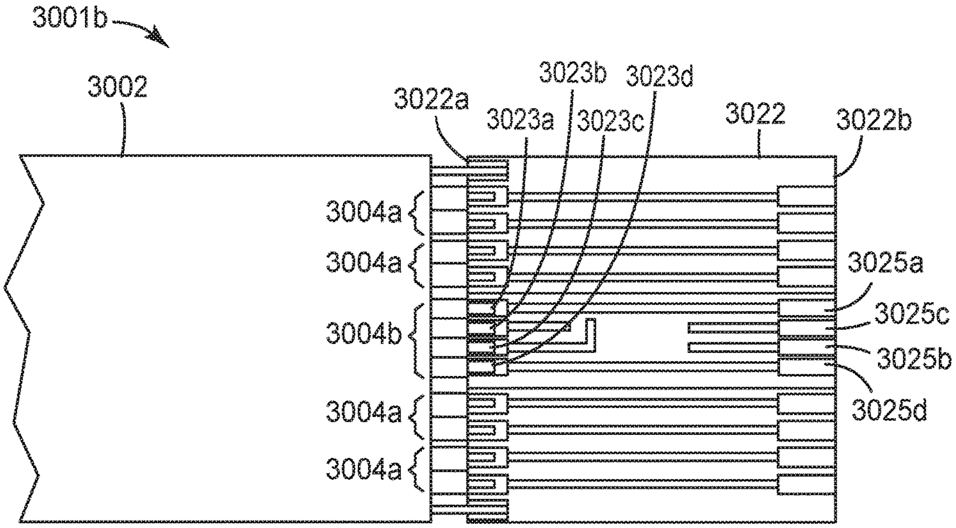
Figure 31:
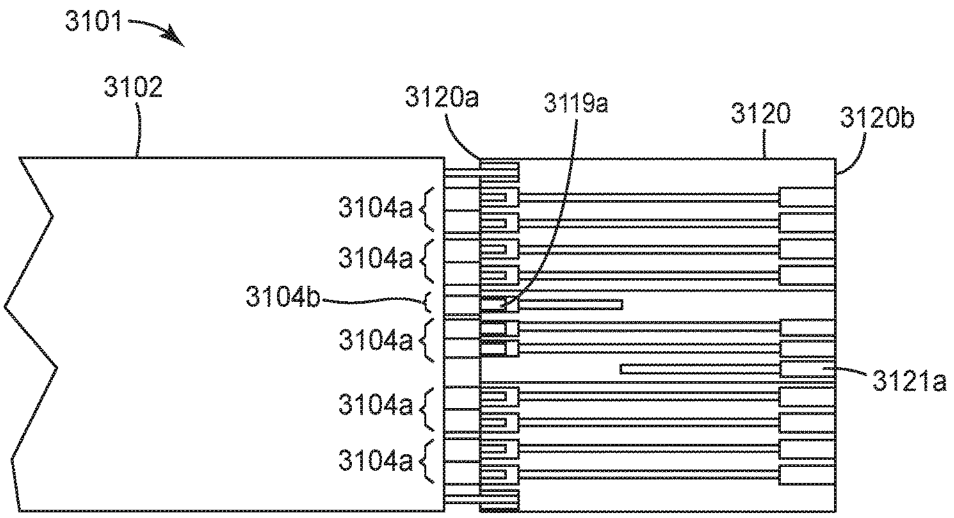
Figure 32:
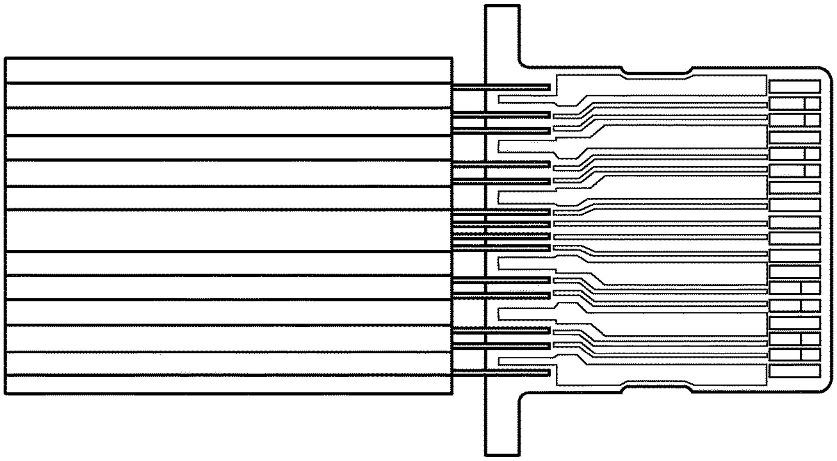

FIGS. 28*a-d* are schematic front cross-sectional views of shielded electrical cables having mixed conductor sets;

FIG. 29 is a schematic front cross-sectional view of another shielded electrical cable having mixed conductor sets, and FIG. 29*a* schematically depicts groups of low speed insulated conductor sets useable in a mixed conductor set shielded cable;

FIGS. 30*a*, 30*b*, and 31 are schematic top views of shielded cable assemblies in which a termination component of the assembly includes one or more conduction path that re-routes one or more low speed signal lines from one end of the termination component to the other; and FIG. 32 is a photograph of a mixed conductor set shielded cable assembly that was fabricated.

In the figures, like reference numerals designate like elements.

DETAILED DESCRIPTION OF ILLUSTRATIVE EMBODIMENTS

As outlined above, we describe herein, among other things, shielded ribbon cables, methods involving shielded ribbon cables, and combinations and systems employing shielded ribbon cables. Before discussing some aspects of the high density shielded cables, we provide a general description of exemplary shielded cables in a section entitled "Shielded Electrical Cable Discussion". Thereafter, we describe aspects of the high density shielded cables in a section entitled "High Density Shielded Cables". We also describe aspects of other unique shielded cables, systems, and methods, which may incorporate high density features if desired. Thus, we describe aspects of shielded cables that have an on-demand drain wire in a section entitled "Shielded Cables With On-Demand Drain Wire Feature". We describe aspects of shielded cables and cable assemblies having multiple drain wires in a section entitled "Shielded Cables With Multiple Drain Wires". We also describe aspects of shielded cables that incorporate mixed conductor sets in a section entitled "Shielded Cables With Mixed Conductor Sets".

The reader is cautioned that the various sections and section headings are provided for improved organization and convenience, and are not to be construed in a limiting way. For example, the sections and section headings are not to be construed to mean that techniques, methods, features, or components of one section cannot be used with techniques, methods, features, or components of a different section. On the contrary, we intend for any information from any given section or sections to also be applicable to information in any other section or sections, unless otherwise clearly indicated to the contrary. Thus, for example, aspects of high density shielded cables can be found not only in the section entitled "High Density Shielded Cables", but in the other sections as well. Similarly, aspects of shielded cables with on-demand drain wires can be found not only in the section entitled "Shielded Cables With On-Demand Drain Wire Feature", but in the other sections as well, and so forth.

Section 1: Shielded Electrical Cable Discussion

As the number and speed of interconnected devices increases, electrical cables that carry signals between such devices need to be smaller and capable of carrying higher speed signals without unacceptable interference or crosstalk. Shielding is used in some electrical cables to reduce interactions between signals carried by neighboring conductors. Many of the cables described herein have a generally flat configuration, and include conductor sets that extend along a length of the cable, as well as electrical shielding films disposed on opposite sides of the cable. Pinched portions of the shielding films between adjacent conductor sets help to electrically isolate the conductor sets from each other. Many of the cables also include drain wires that electrically connect to the shields, and extend along the length of the cable. The cable configurations described herein can help to simplify connections to the conductor sets and drain wires, reduce the size of the cable connection sites, and/or provide opportunities for mass termination of the cable.

Figure 1:
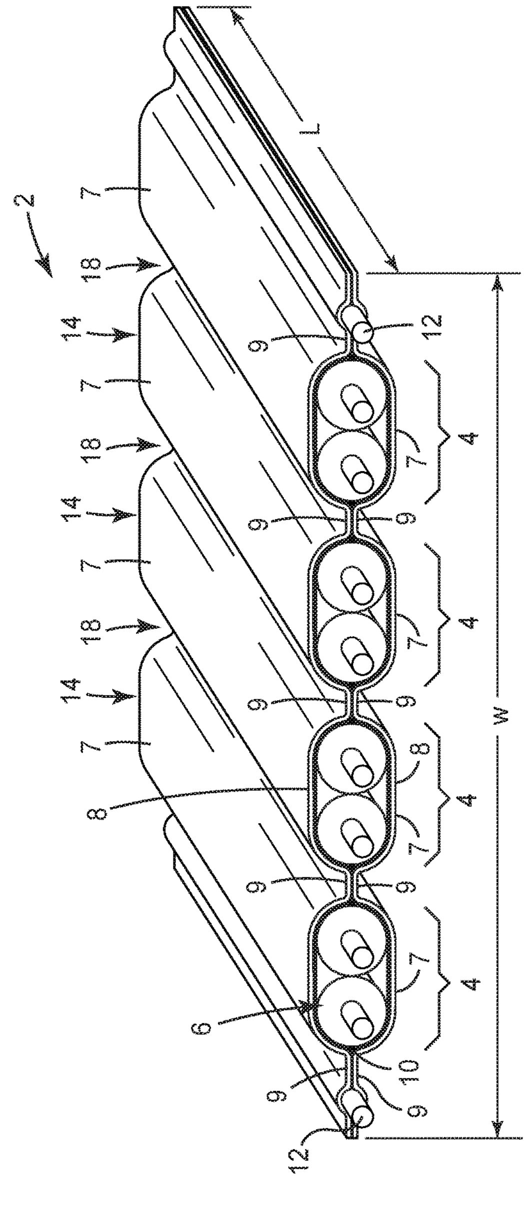
FIG. 1 is a perspective view of an exemplary shielded electrical cable.

FIG. 1 illustrates an exemplary shielded electrical cable 2 that includes a plurality of conductor sets 4 spaced apart from each other along all or a portion of a width, w, of the cable 2 and extend along a length, L, of the cable 2. The cable 2 may be arranged generally in a planar configuration as illustrated in FIG. 1 or may be folded at one or more places along its length into a folded configuration. In some implementations, some parts of cable 2 may be arranged in a planar configuration and other parts of the cable may be folded. In some configurations, at least one of the conductor sets 4 of the cable 2 includes two insulated conductors 6 extending along a length, L, of cable 2. The two insulated conductors 6 of the conductor sets 4 may be arranged substantially parallel along all or a portion of the length, L, of the cable 2. Insulated conductors 6 may include insulated signal wires, insulated power wires, or insulated ground wires. Two shielding films 8 are disposed on opposite sides of the cable 2.

The first and second shielding films 8 are arranged so that, in transverse cross section, cable 2 includes cover regions 14 and pinched regions 18. In the cover regions 14 of the cable 2, cover portions 7 of the first and second shielding films 8 in transverse cross section substantially surround each conductor set 4. For example, cover portions of the shielding films may collectively encompass at least 75%, or at least 80, 85, or 90% of the perimeter of any given conductor set. Pinched portions 9 of the first and second shielding films form the pinched regions 18 of cable 2 on each side of each conductor set 4. In the pinched regions 18 of the cable 2, one or both of the shielding films 8 are deflected, bringing the pinched portions 9 of the shielding films 8 into closer proximity. In some configurations, as illustrated in FIG. 1, both of the shielding films 8 are deflected in the pinched regions 18 to bring the pinched portions 9 into closer proximity. In some configurations, one of the shielding films may remain relatively flat in the pinched regions 18 when the cable is in a planar or unfolded configuration, and the other shielding film on the opposite side of the cable may be deflected to bring the pinched portions of the shielding film into closer proximity.

The cable 2 may also include an adhesive layer 10 disposed between shielding films 8 at least between the pinched portions 9. The adhesive layer 10 bonds the pinched portions 9 of the shielding films 8 to each other in the pinched regions 18 of the cable 2. The adhesive layer 10 may or may not be present in the cover region 14 of the cable 2.

In some cases, conductor sets 4 have a substantially curvilinearly-shaped envelope or perimeter in transverse cross-section, and shielding films 8 are disposed around conductor sets 4 such as to substantially conform to and maintain the cross-sectional shape along at least part of, and preferably along substantially all of, the length L of the cable 6. Maintaining the cross-sectional shape maintains the electrical characteristics of conductor sets 4 as intended in the design of conductor sets 4. This is an advantage over some conventional shielded electrical cables where disposing a conductive shield around a conductor set changes the cross-sectional shape of the conductor set.

Although in the embodiment illustrated in FIG. 1, each conductor set 4 has exactly two insulated conductors 6, in other embodiments, some or all of the conductor sets may include only one insulated conductor, or may include more than two insulated conductors 6. For example, an alternative shielded electrical cable similar in design to that of FIG. 1 may include one conductor set that has eight insulated conductors 6, or eight conductor sets each having only one insulated conductor 6. This flexibility in arrangements of conductor sets and insulated conductors allows the disclosed shielded electrical cables to be configured in ways that are suitable for a wide variety of intended applications. For example, the conductor sets and insulated conductors may be configured to form: a multiple twinaxial cable, i.e., multiple conductor sets each having two insulated conductors; a multiple coaxial cable, i.e., multiple conductor sets each having only one insulated conductor; or combinations thereof. In some embodiments, a conductor set may further include a conductive shield (not shown) disposed around the one or more insulated conductors, and an insulative jacket (not shown) disposed around the conductive shield.

In the embodiment illustrated in FIG. 1, shielded electrical cable 2 further includes optional ground conductors 12. Ground conductors 12 may include ground wires or drain wires. Ground conductors 12 can be spaced apart from and extend in substantially the same direction as insulated conductors 6. Shielding films 8 can be disposed around ground conductors 12. The adhesive layer 10 may bond shielding films 8 to each other in the pinched portions 9 on both sides of ground conductors 12. Ground conductors 12 may electrically contact at least one of the shielding films 8.

Figure 2A:
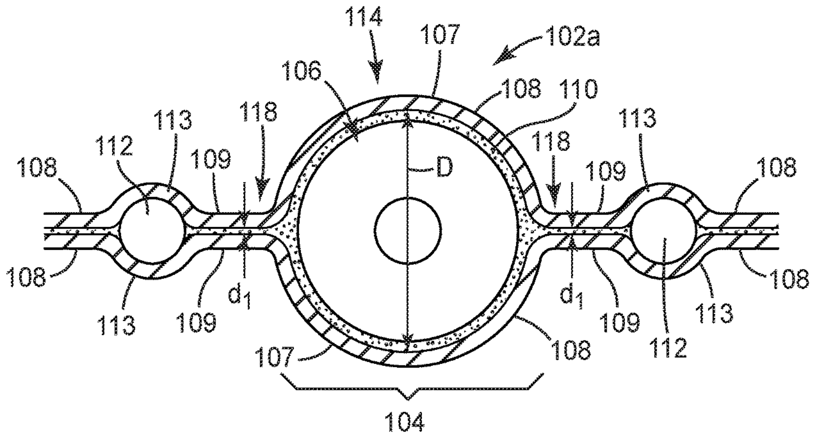
FIGS. 2*a*-2*g* are front cross-sectional views of further exemplary shielded electrical cables.

The cross-sectional views of FIGS. 2*a*-2*g* may represent various shielded electrical cables, or portions of cables. In FIG. 2*a*, shielded electrical cable 102*a* includes a single conductor set 104. Conductor set 104 extends along the length of the cable and has only a single insulated conductor 106. If desired, the cable 102*a* may be made to include multiple conductor sets 104 spaced apart from each other across a width of the cable 102*a* and extending along a length of the cable. Two shielding films 108 are disposed on opposite sides of the cable. The cable 102*a* includes a cover region 114 and pinched regions 118. In the cover region 114 of the cable 102*a*, the shielding films 108 include cover portions 107 that cover the conductor set 104. In transverse cross section, the cover portions 107, in combination, substantially surround the conductor set 104. In the pinched regions 118 of the cable 102*a*, the shielding films 108 include pinched portions 109 on each side of the conductor set 104.

An optional adhesive layer 110 may be disposed between shielding films 108. Shielded electrical cable 102*a* further includes optional ground conductors 112. Ground conductors 112 are spaced apart from and extend in substantially the same direction as insulated conductor 106. Conductor set 104 and ground conductors 112 can be arranged so that they lie generally in a plane as illustrated in FIG. 2*a*.

Second cover portions 113 of shielding films 108 are disposed around, and cover, the ground conductors 112. The adhesive layer 110 may bond the shielding films 108 to each other on both sides of ground conductors 112. Ground conductors 112 may electrically contact at least one of shielding films 108. In FIG. 2*a*, insulated conductor 106 and shielding films 108 are effectively arranged in a coaxial cable configuration. The coaxial cable configuration of FIG. 2*a* can be used in a single ended circuit arrangement.

As illustrated in the transverse cross sectional view of FIG. 2*a*, there is a maximum separation, D, between the cover portions 107 of the shielding films 108, and there is a minimum separation, $d_1$, between the pinched portions 109 of the shielding films 108.

FIG. 2*a* shows the adhesive layer 110 disposed between the pinched portions 109 of the shielding films 108 in the pinched regions 118 of the cable 102 and disposed between the cover portions 107 of the shielding films 108 and the insulated conductor 106 in the cover region 114 of the cable 102*a*. In this arrangement, the adhesive layer 110 bonds the pinched portions 109 of the shielding films 108 together in the pinched regions 118 of the cable, and bonds the cover portions 107 of the shielding films 108 to the insulated conductor 106 in the cover region 114 of the cable 102*a*.

Figure 2B:
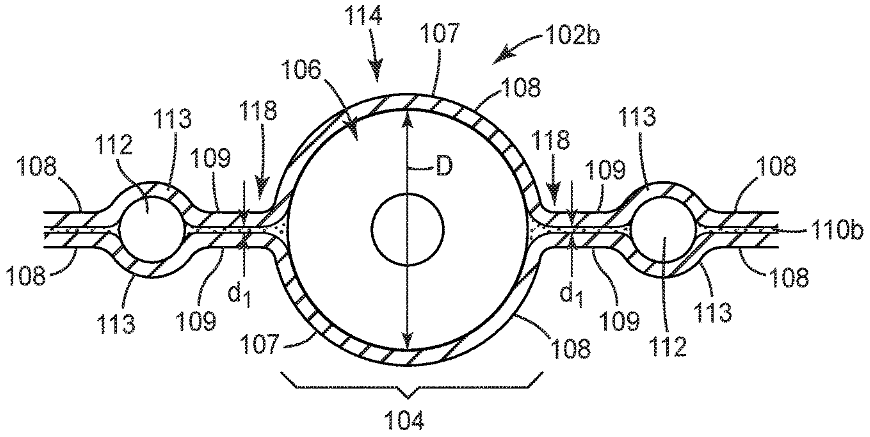

Shielded cable 102*b* of FIG. 2*b* is similar to cable 102*a* of FIG. 2*a*, with similar elements identified by similar reference numerals, except that in FIG. 2*b*, the optional adhesive layer 110*b* is not present between the cover portions 107 of the shielding films 108 and the insulated conductor 106 in the cover region 114 of the cable 102. In this arrangement, the adhesive layer 110*b* bonds the pinched portions 109 of the shielding films 108 together in the pinched regions 118 of the cable, but the adhesive layer 110 does not bond cover portions 107 of the shielding films 108 to the insulated conductor 106 in the cover regions 114 of the cable 102.

Figure 2C:
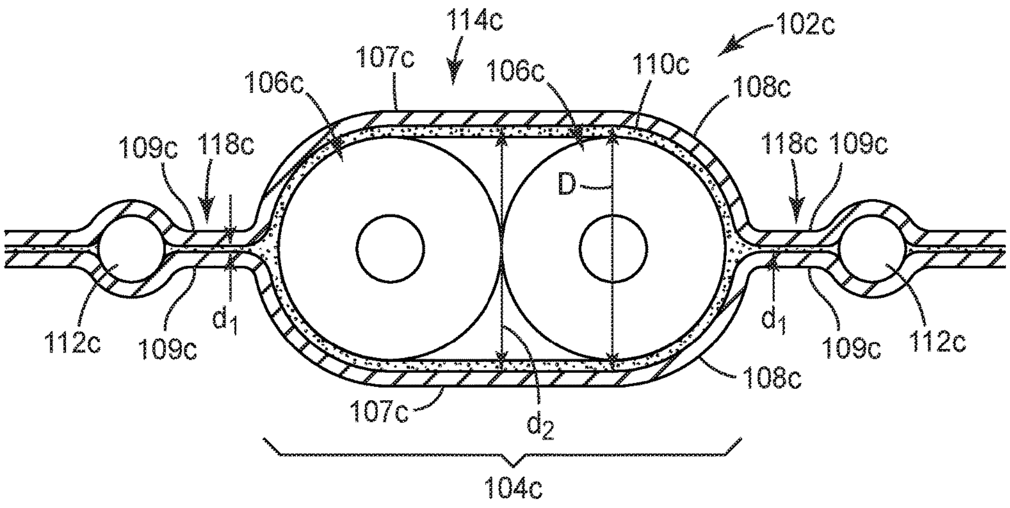

Referring to FIG. 2*c*, shielded electrical cable 102*c* is similar to shielded electrical cable 102*a* of FIG. 2*a*, except that cable 102*c* has a single conductor set 104*c* which has two insulated conductors 106*c*. If desired, the cable 102*c* may be made to include multiple conductor sets 104*c* spaced part across a width of the cable 102*c* and extending along a length of the cable. Insulated conductors 106*c* are arranged generally in a single plane and effectively in a twinaxial configuration. The twin axial cable configuration of FIG. 2*c* can be used in a differential pair circuit arrangement or in a single ended circuit arrangement.

Two shielding films 108*c* are disposed on opposite sides of conductor set 104*c*. The cable 102*c* includes a cover region 114*c* and pinched regions 118*c*. In the cover region 114*c* of the cable 102*c*, the shielding films 108*c* include cover portions 107*c* that cover the conductor set 104*c*. In transverse cross section, the cover portions 107*c*, in combination, substantially surround the conductor set 104*c*. In the pinched regions 118*c* of the cable 102*c*, the shielding films 108*c* include pinched portions 109*c* on each side of the conductor set 104*c*.

An optional adhesive layer 110*c* may be disposed between shielding films 108*c*. Shielded electrical cable 102*c* further includes optional ground conductors 112*c* similar to ground conductors 112 discussed previously. Ground conductors 112*c* are spaced apart from, and extend in substantially the same direction as, insulated conductors 106*c*. Conductor set 104*c* and ground conductors 112*c* can be arranged so that they lie generally in a plane as illustrated in FIG. 2*c*.

As illustrated in the cross section of FIG. 2*c*, there is a maximum separation, D, between the cover portions 107*c* of the shielding films 108*c*; there is a minimum separation, $d_1$, between the pinched portions 109*c* of the shielding films 108*c*; and there is a minimum separation, $d_2$, between the shielding films 108*c* between the insulated conductors 106*c*.

FIG. 2*c* shows the adhesive layer 110*c* disposed between the pinched portions 109*c* of the shielding films 108*c* in the pinched regions 118*c* of the cable 102*c* and disposed between the cover portions 107*c* of the shielding films 108*c* and the insulated conductors 106*c* in the cover region 114*c* of the cable 102*c*. In this arrangement, the adhesive layer 110*c* bonds the pinched portions 109*c* of the shielding films 108*c* together in the pinched regions 118*c* of the cable 102*c*, and also bonds the cover portions 107*c* of the shielding films 108*c* to the insulated conductors 106*c* in the cover region 114*c* of the cable 102*c*.

Figure 2D:
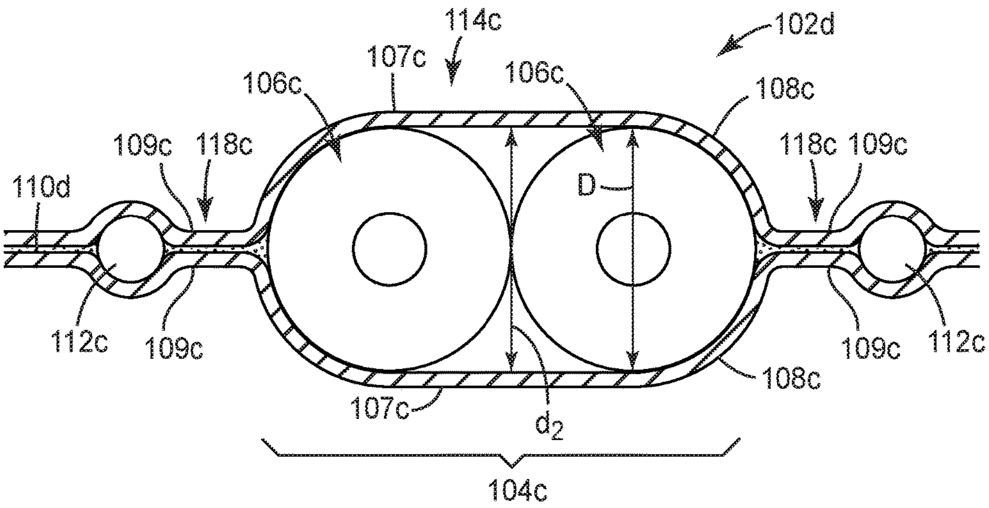

Shielded cable 102*d* of FIG. 2*d* is similar to cable 102*c* of FIG. 2*c*, with similar elements identified by similar reference numerals, except that in cable 102*d* the optional adhesive layer 110*d* is not present between the cover portions 107*c* of the shielding films 108*c* and the insulated conductors 106*c* in the cover region 114*c* of the cable. In this arrangement, the adhesive layer 110*d* bonds the pinched portions 109*c* of the shielding films 108*c* together in the pinched regions 118*c* of the cable, but does not bond the cover portions 107*c* of the shielding films 108*c* to the insulated conductors 106*c* in the cover region 114*c* of the cable 102*d*.

Figure 2E:
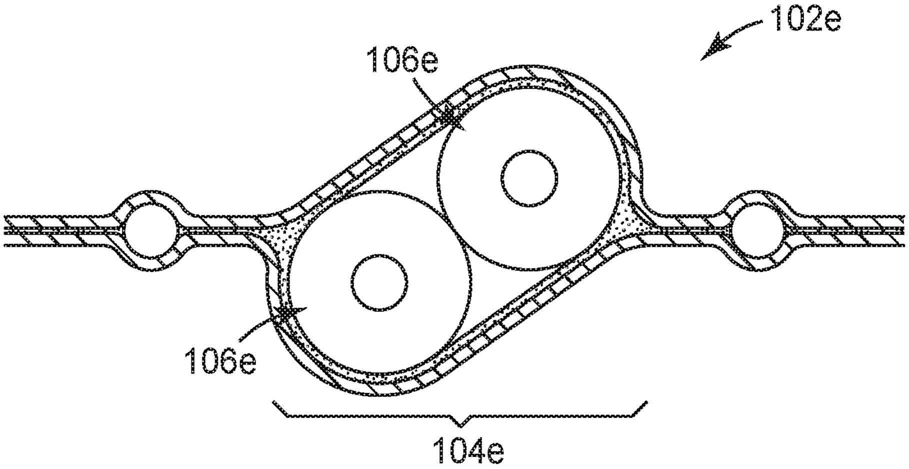

Referring now to FIG. 2*e*, we see there a transverse cross-sectional view of a shielded electrical cable 102*e* similar in many respects to the shielded electrical cable 102*a* of FIG. 2*a*. However, where cable 102*a* includes a single conductor set 104 having only a single insulated conductor 106, cable 102*e* includes a single conductor set 104*e* that has two insulated conductors 106*e* extending along a length of the cable 102*e*. Cable 102*e* may be made to have multiple conductor sets 104*e* spaced apart from each other across a width of the cable 102*e* and extending along a length of the cable 102*e*. Insulated conductors 106*e* are arranged effectively in a twisted pair cable arrangement, whereby insulated conductors 106*e* twist around each other and extend along a length of the cable 102*e*.

Figure 2F:
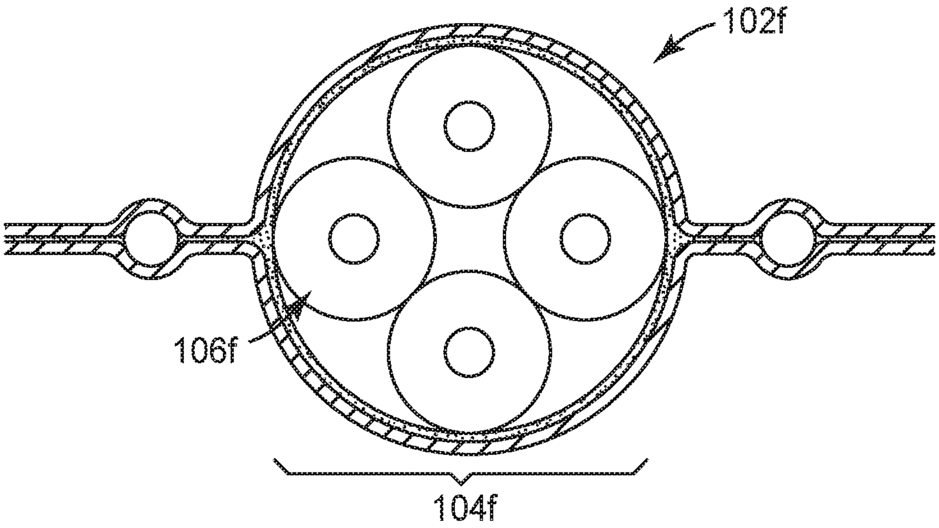

FIG. 2*f* depicts another shielded electrical cable 102*f* that is also similar in many respects to the shielded electrical cable 102*a* of FIG. 2*a*. However, where cable 102*a* includes a single conductor set 104 having only a single insulated conductor 106, cable 102*f* includes a single conductor set 104*f* that has four insulated conductors 106*f* extending along a length of the cable 102*f*. The cable 102*f* may be made to have multiple conductor sets 104*f* spaced apart from each other across a width of the cable 102*f* and extending along a length of the cable 102*f*.

Insulated conductors 106*f* are arranged effectively in a quad cable arrangement, whereby insulated conductors 106*f* may or may not twist around each other as insulated conductors 106*f* extend along a length of the cable 102*f*.

Figure 2G:
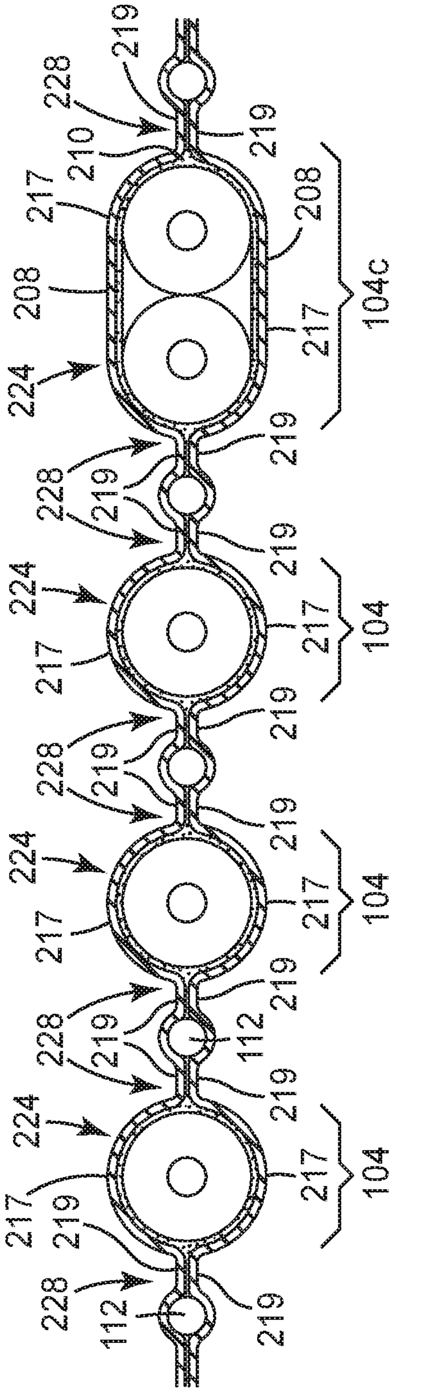

Referring back to FIGS. 2*a*-2*f*, further embodiments of shielded electrical cables may include a plurality of spaced apart conductor sets 104, 104*c*, 104*e*, or 104*f*, or combinations thereof, arranged generally in a single plane. Optionally, the shielded electrical cables may include a plurality of ground conductors 112 spaced apart from, and extending generally in the same direction as, the insulated conductors of the conductor sets. In some configurations, the conductor sets and ground conductors can be arranged generally in a single plane. FIG. 2*g* illustrates an exemplary embodiment of such a shielded electrical cable.

Referring to FIG. 2*g*, shielded electrical cable 102*g* includes a plurality of spaced apart conductor sets 104, 104*c* arranged generally in plane. Shielded electrical cable 102*g* further includes optional ground conductors 112 disposed between conductor sets 104, 104*c* and at both sides or edges of shielded electrical cable 102*g*.

First and second shielding films 208 are disposed on opposite sides of the cable 102*g* and are arranged so that, in transverse cross section, the cable 102*g* includes cover regions 224 and pinched regions 228. In the cover regions 224 of the cable, cover portions 217 of the first and second shielding films 208 in transverse cross section substantially surround each conductor set 104, 104*c*. Pinched portions 219 of the first and second shielding films 208 form the pinched regions 218 on two sides of each conductor set 104, 104*c*.

The shielding films 208 are disposed around ground conductors 112. An optional adhesive layer 210 is disposed between shielding films 208 and bonds the pinched portions 219 of the shielding films 208 to each other in the pinched regions 228 on both sides of each conductor set 104, 104*c*. Shielded electrical cable 102*g* includes a combination of coaxial cable arrangements (conductor sets 104) and a twinaxial cable arrangement (conductor set 104*c*) and may therefore be referred to as a hybrid cable arrangement.

One, two, or more of the shielded electrical cables may be terminated to a termination component such as a printed circuit board, paddle card, or the like. Because the insulated conductors and ground conductors can be arranged generally in a single plane, the disclosed shielded electrical cables are well suited for mass-stripping, i.e., the simultaneous stripping of the shielding films and insulation from the insulated conductors, and mass-termination, i.e., the simultaneous terminating of the stripped ends of the insulated conductors and ground conductors, which allows a more automated cable assembly process. This is an advantage of at least some of the disclosed shielded electrical cables. The stripped ends of insulated conductors and ground conductors may, for example, be terminated to contact conductive paths or other elements on a printed circuit board, for example. In other cases, the stripped ends of insulated conductors and ground conductors may be terminated to any suitable individual contact elements of any suitable termination device, such as, e.g., electrical contacts of an electrical connector.

FIGS. 3*a*-3*d* illustrate an exemplary termination process of shielded electrical cable 302 to a printed circuit board or other termination component 314. This termination process can be a mass-termination process and includes the steps of stripping (illustrated in FIGS. 3*a*-3*b*), aligning (illustrated in FIG. 3*c*), and terminating (illustrated in FIG. 3*d*). When forming shielded electrical cable 302, which may in general take the form of any of the cables shown and/or described herein, the arrangement of conductor sets 304, insulated conductors 306, and ground conductors 312 of shielded electrical cable 302 may be matched to the arrangement of contact elements 316 on printed circuit board 314, which would eliminate any significant manipulation of the end portions of shielded electrical cable 302 during alignment or termination.

Figure 3A:
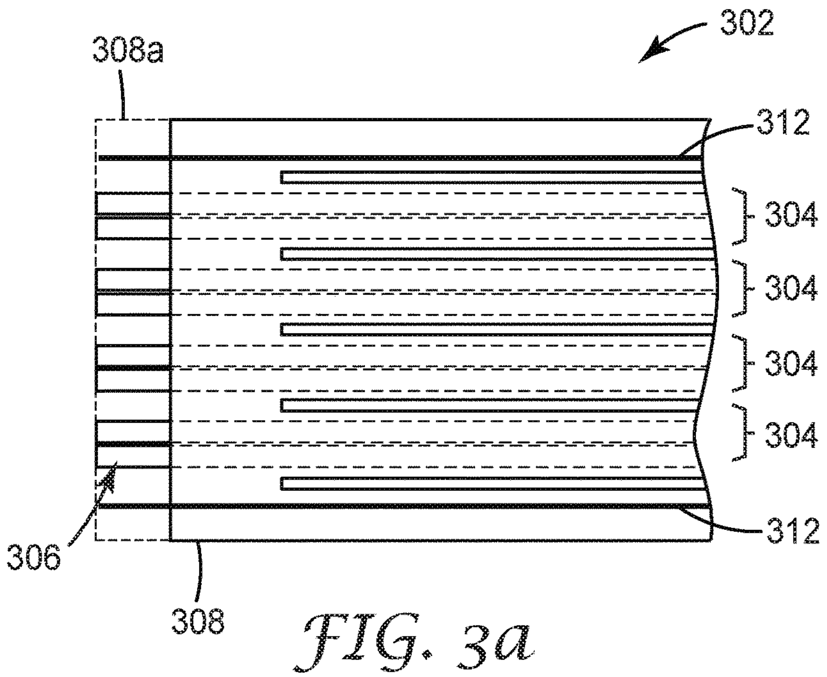
FIGS. 3*a*-3*d* are top views that illustrate different procedures of an exemplary termination process of a shielded electrical cable to a termination component.
Figure 3B:
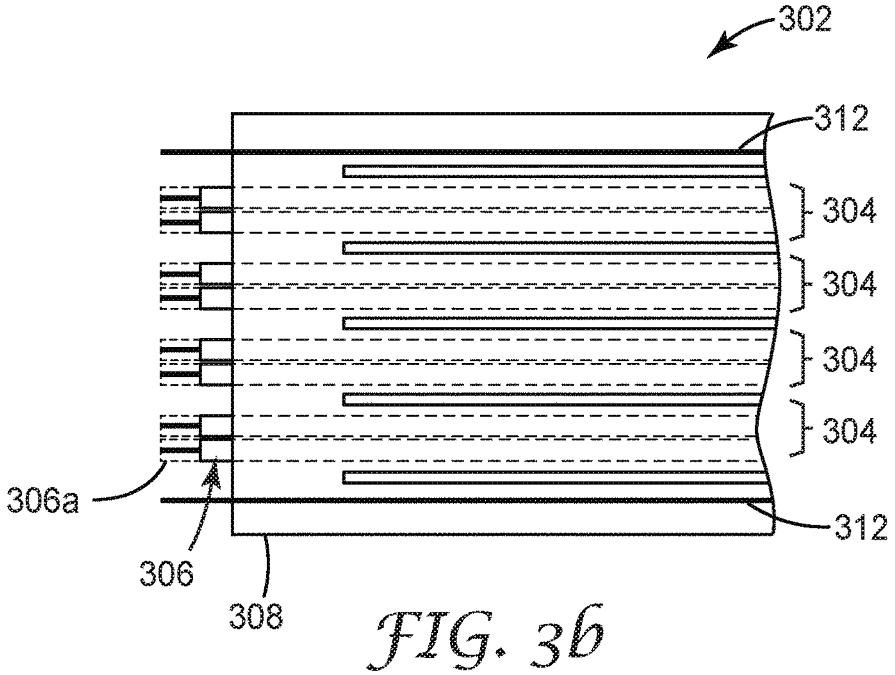
Figure 3C:
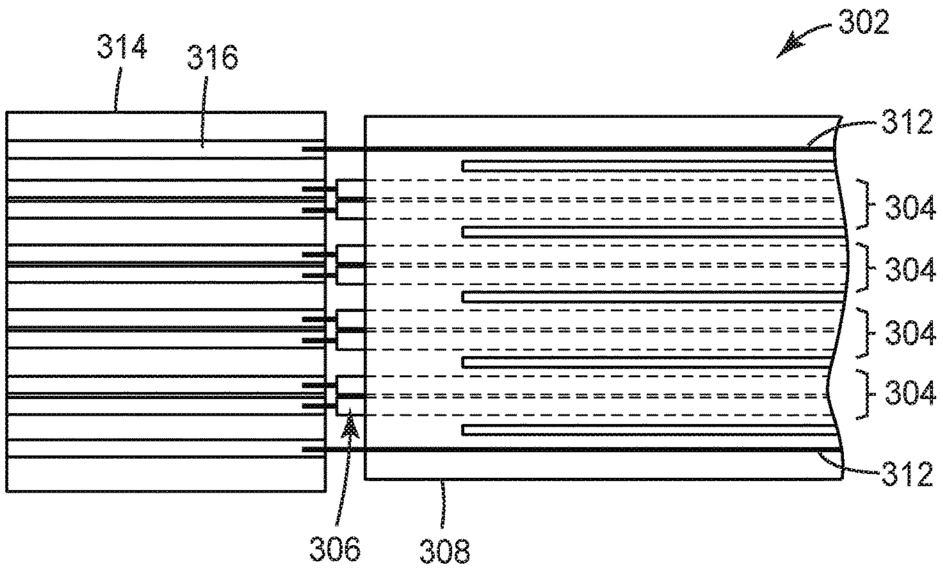
Figure 3D:
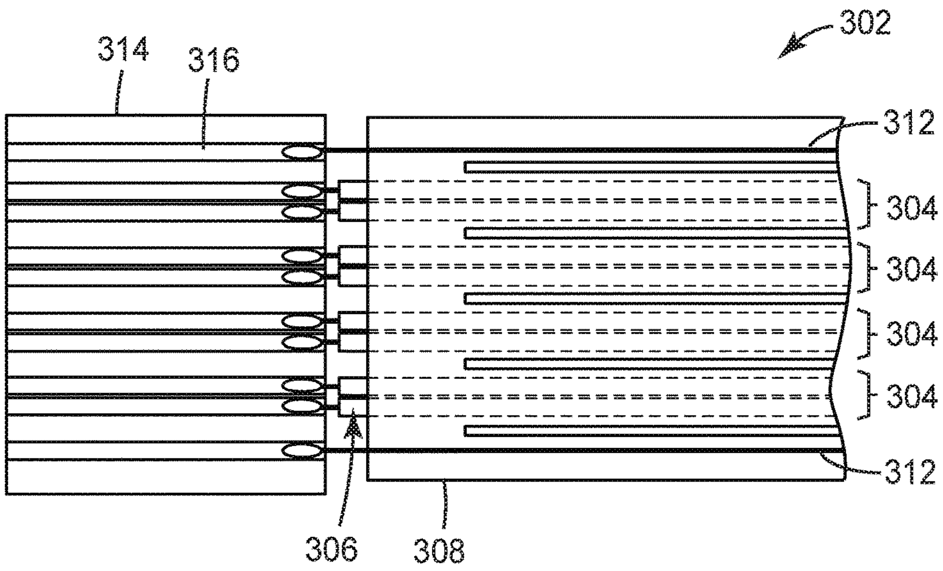

In the step illustrated in FIG. 3*a*, an end portion 308*a* of shielding films 308 is removed. Any suitable method may be used, such as, e.g., mechanical stripping or laser stripping. This step exposes an end portion of insulated conductors 306 and ground conductors 312. In one aspect, mass-stripping of end portion 308*a* of shielding films 308 is possible because they form an integrally connected layer that is separate from the insulation of insulated conductors 306. Removing shielding films 308 from insulated conductors 306 allows protection against electrical shorting at these locations and also provides independent movement of the exposed end portions of insulated conductors 306 and ground conductors 312. In the step illustrated in FIG. 3*b*, an end portion 306*a* of the insulation of insulated conductors 306 is removed. Any suitable method may be used, such as, e.g., mechanical stripping or laser stripping. This step exposes an end portion of the conductor of insulated conductors 306. In the step illustrated in FIG. 3*c*, shielded electrical cable 302 is aligned with printed circuit board 314 such that the end portions of the conductors of insulated conductors 306 and the end portions of ground conductors 312 of shielded electrical cable 302 are aligned with contact elements 316 on printed circuit board 314. In the step illustrated in FIG. 3*d*, the end portions of the conductors of insulated conductors 306 and the end portions of ground conductors 312 of shielded electrical cable 302 are terminated to contact elements 316 on printed circuit board 314. Examples of suitable termination methods that may be used include soldering, welding, crimping, mechanical clamping, and adhesively bonding, to name a few.

In some cases, the disclosed shielded cables can be made to include one or more longitudinal slits or other splits disposed between conductor sets. The splits may be used to separate individual conductor sets at least along a portion of the length of shielded cable, thereby increasing at least the lateral flexibility of the cable. This may allow, for example, the shielded cable to be placed more easily into a curvilinear outer jacket. In other embodiments, splits may be placed so as to separate individual or multiple conductor sets and ground conductors. To maintain the spacing of conductor sets and ground conductors, splits may be discontinuous along the length of shielded electrical cable. To maintain the spacing of conductor sets and ground conductors in at least one end portion of a shielded electrical cable so as to maintain mass-termination capability, the splits may not extend into one or both end portions of the cable. The splits may be formed in the shielded electrical cable using any suitable method, such as, e.g., laser cutting or punching. Instead of or in combination with longitudinal splits, other suitable shapes of openings may be formed in the disclosed shielded electrical cables, such as, e.g., holes, e.g., to increase at least the lateral flexibility of the cable.

The shielding films used in the disclosed shielded cables can have a variety of configurations and be made in a variety of ways. In some cases, one or more shielding films may include a conductive layer and a non-conductive polymeric layer. The conductive layer may include any suitable conductive material, including but not limited to copper, silver, aluminum, gold, and alloys thereof. The non-conductive polymeric layer may include any suitable polymeric material, including but not limited to polyester, polyimide, polyamide-imide, polytetrafluoroethylene, polypropylene, polyethylene, polyphenylene sulfide, polyethylene naphthalate, polycarbonate, silicone rubber, ethylene propylene diene rubber, polyurethane, acrylates, silicones, natural rubber, epoxies, and synthetic rubber adhesive. The non-conductive polymeric layer may include one or more additives and/or fillers to provide properties suitable for the intended application. In some cases, at least one of the shielding films may include a laminating adhesive layer disposed between the conductive layer and the non-conductive polymeric layer. For shielding films that have a conductive layer disposed on a non-conductive layer, or that otherwise have one major exterior surface that is electrically conductive and an opposite major exterior surface that is substantially non-conductive, the shielding film may be incorporated into the shielded cable in several different orientations as desired. In some cases, for example, the conductive surface may face the conductor sets of insulated wires and ground wires, and in some cases the non-conductive surface may face those components. In cases where two shielding films are used on opposite sides of the cable, the films may be oriented such that their conductive surfaces face each other and each face the conductor sets and ground wires, or they may be oriented such that their non-conductive surfaces face each other and each face the conductor sets and ground wires, or they may be oriented such that the conductive surface of one shielding film faces the conductor sets and ground wires, while the non-conductive surface of the other shielding film faces conductor sets and ground wires from the other side of the cable.

In some cases, at least one of the shielding films may be or include a stand-alone conductive film, such as a compliant or flexible metal foil. The construction of the shielding films may be selected based on a number of design parameters suitable for the intended application, such as, e.g., flexibility, electrical performance, and configuration of the shielded electrical cable (such as, e.g., presence and location of ground conductors). In some cases, the shielding films may have an integrally formed construction. In some cases, the shielding films may have a thickness in the range of 0.01 mm to 0.05 mm. The shielding films desirably provide isolation, shielding, and precise spacing between the conductor sets, and allow for a more automated and lower cost cable manufacturing process. In addition, the shielding films prevent a phenomenon known as "signal suck-out" or resonance, whereby high signal attenuation occurs at a particular frequency range. This phenomenon typically occurs in conventional shielded electrical cables where a conductive shield is wrapped around a conductor set.

As discussed elsewhere herein, adhesive material may be used in the cable construction to bond one or two shielding films to one, some, or all of the conductor sets at cover regions of the cable, and/or adhesive material may be used to bond two shielding films together at pinched regions of the cable. A layer of adhesive material may be disposed on at least one shielding film, and in cases where two shielding films are used on opposite sides of the cable, a layer of adhesive material may be disposed on both shielding films. In the latter cases, the adhesive used on one shielding film is preferably the same as, but may if desired be different from, the adhesive used on the other shielding film. A given adhesive layer may include an electrically insulative adhesive, and may provide an insulative bond between two shielding films. Furthermore, a given adhesive layer may provide an insulative bond between at least one of shielding films and insulated conductors of one, some, or all of the conductor sets, and between at least one of shielding films and one, some, or all of the ground conductors (if any). Alternatively, a given adhesive layer may include an electrically conductive adhesive, and may provide a conductive bond between two shielding films. Furthermore, a given adhesive layer may provide a conductive bond between at least one of shielding films and one, some, or all of the ground conductors (if any). Suitable conductive adhesives include conductive particles to provide the flow of electrical current. The conductive particles can be any of the types of particles currently used, such as spheres, flakes, rods, cubes, amorphous, or other particle shapes. They may be solid or substantially solid particles such as carbon black, carbon fibers, nickel spheres, nickel coated copper spheres, metal-coated oxides, metal-coated polymer fibers, or other similar conductive particles. These conductive particles can be made from electrically insulating materials that are plated or coated with a conductive material such as silver, aluminum, nickel, or indium tin-oxide. The metal-coated insulating material can be substantially hollow particles such as hollow glass spheres, or may comprise solid materials such as glass beads or metal oxides. The conductive particles may be on the order of several tens of microns to nanometer sized materials such as carbon nanotubes. Suitable conductive adhesives may also include a conductive polymeric matrix.

When used in a given cable construction, an adhesive layer is preferably substantially conformable in shape relative to other elements of the cable, and conformable with regard to bending motions of the cable. In some cases, a given adhesive layer may be substantially continuous, e.g., extending along substantially the entire length and width of a given major surface of a given shielding film. In some cases, the adhesive layer may include be substantially discontinuous. For example, the adhesive layer may be present only in some portions along the length or width of a given shielding film. A discontinuous adhesive layer may for example include a plurality of longitudinal adhesive stripes that are disposed, e.g., between the pinched portions of the shielding films on both sides of each conductor set and between the shielding films beside the ground conductors (if any). A given adhesive material may be or include at least one of a pressure sensitive adhesive, a hot melt adhesive, a thermoset adhesive, and a curable adhesive. An adhesive layer may be configured to provide a bond between shielding films that is substantially stronger than a bond between one or more insulated conductor and the shielding films. This may be achieved, e.g., by appropriate selection of the adhesive formulation. An advantage of this adhesive configuration is to allow the shielding films to be readily strippable from the insulation of insulated conductors. In other cases, an adhesive layer may be configured to provide a bond between shielding films and a bond between one or more insulated conductor and the shielding films that are substantially equally strong. An advantage of this adhesive configuration is that the insulated conductors are anchored between the shielding films. When a shielded electrical cable having this construction is bent, this allows for little relative movement and therefore reduces the likelihood of buckling of the shielding films. Suitable bond strengths may be chosen based on the intended application. In some cases, a conformable adhesive layer may be used that has a thickness of less than about 0.13 mm. In exemplary embodiments, the adhesive layer has a thickness of less than about 0.05 mm.

A given adhesive layer may conform to achieve desired mechanical and electrical performance characteristics of the shielded electrical cable. For example, the adhesive layer may conform to be thinner between the shielding films in areas between conductor sets, which increases at least the lateral flexibility of the shielded cable. This may allow the shielded cable to be placed more easily into a curvilinear outer jacket. In some cases, an adhesive layer may conform to be thicker in areas immediately adjacent the conductor sets and substantially conform to the conductor sets. This may increase the mechanical strength and enable forming a curvilinear shape of shielding films in these areas, which may increase the durability of the shielded cable, for example, during flexing of the cable. In addition, this may help to maintain the position and spacing of the insulated conductors relative to the shielding films along the length of the shielded cable, which may result in more uniform impedance and superior signal integrity of the shielded cable.

A given adhesive layer may conform to effectively be partially or completely removed between the shielding films in areas between conductor sets, e.g., in pinched regions of the cable. As a result, the shielding films may electrically contact each other in these areas, which may increase the electrical performance of the cable. In some cases, an adhesive layer may conform to effectively be partially or completely removed between at least one of the shielding films and the ground conductors. As a result, the ground conductors may electrically contact at least one of shielding films in these areas, which may increase the electrical performance of the cable. Even in cases where a thin layer of adhesive remains between at least one of shielding films and a given ground conductor, asperities on the ground conductor may break through the thin adhesive layer to establish electrical contact as intended.

Figure 4A:
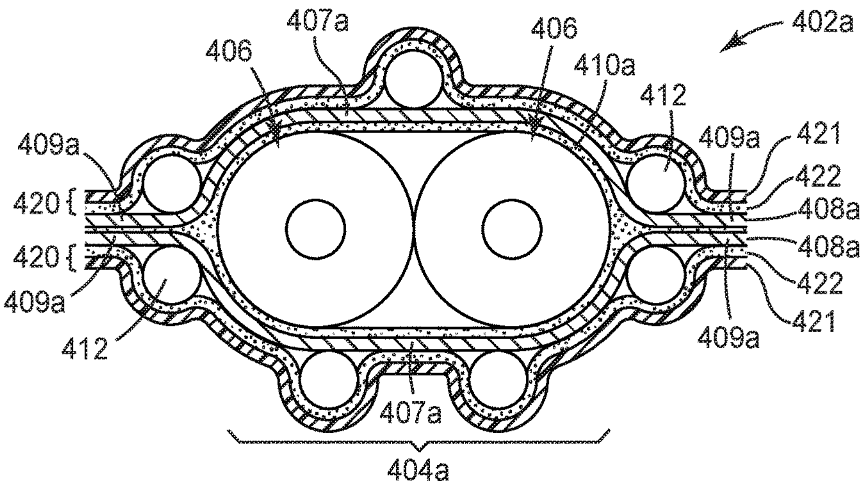
FIGS. 4*a*-4*c* are front cross-sectional views of still further exemplary shielded electrical cables.
Figure 4B:
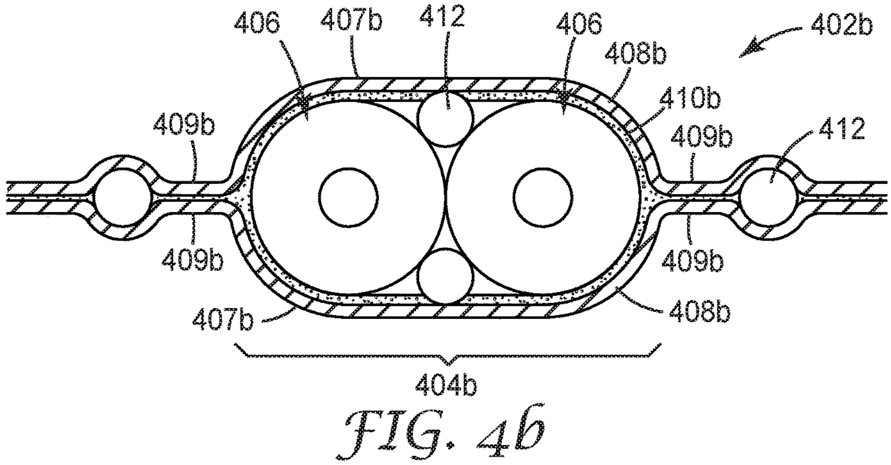
Figure 4C:
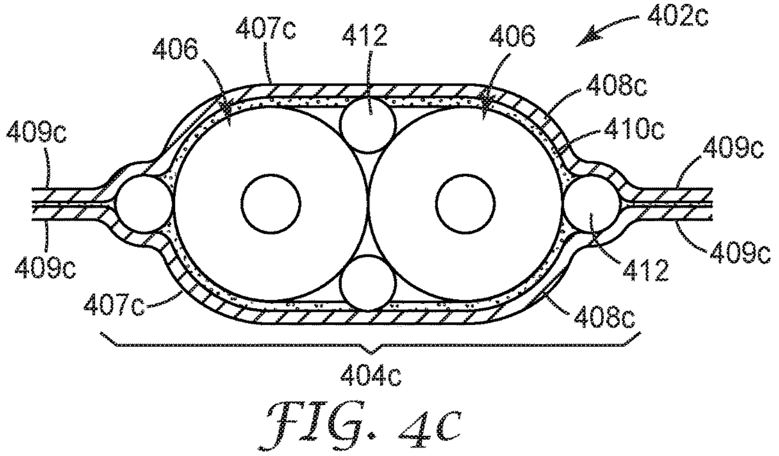

FIGS. 4*a*-4*c* are cross sectional views of three exemplary shielded electrical cables, which illustrate examples of the placement of ground conductors in the shielded electrical cables. An aspect of a shielded electrical cable is proper grounding of the shield, and such grounding can be accomplished in a number of ways. In some cases, a given ground conductor can electrically contact at least one of the shielding films such that grounding the given ground conductor also grounds the shielding film or films. Such a ground conductor may also be referred to as a "drain wire". Electrical contact between the shielding film and the ground conductor may be characterized by a relatively low DC resistance, e.g., a DC resistance of less than 10 ohms, or less than 2 ohms, or of substantially 0 ohms. In some cases, a given ground conductor may not electrically contact the shielding films, but may be an individual element in the cable construction that is independently terminated to any suitable individual contact element of any suitable termination component, such as, e.g., a conductive path or other contact element on a printed circuit board, paddle board, or other device. Such a ground conductor may also be referred to as a "ground wire". FIG. 4*a* illustrates an exemplary shielded electrical cable in which ground conductors are positioned external to the shielding films. FIGS. 4*b* and 4*c* illustrate embodiments in which the ground conductors are positioned between the shielding films, and may be included in the conductor set. One or more ground conductors may be placed in any suitable position external to the shielding films, between the shielding films, or a combination of both.

Referring to FIG. 4*a*, a shielded electrical cable 402*a* includes a single conductor set 404*a* that extends along a length of the cable 402*a*. Conductor set 404*a* has two insulated conductors 406, i.e., one pair of insulated conductors. Cable 402*a* may be made to have multiple conductor sets 404*a* spaced apart from each other across a width of the cable and extending along a length of the cable. Two shielding films 408*a* disposed on opposite sides of the cable include cover portions 407*a*. In transverse cross section, the cover portions 407*a*, in combination, substantially surround conductor set 404*a*. An optional adhesive layer 410*a* is disposed between pinched portions 409*a* of the shielding films 408*a*, and bonds shielding films 408*a* to each other on both sides of conductor set 404*a*. Insulated conductors 406 are arranged generally in a single plane and effectively in a twinaxial cable configuration that can be used in a single ended circuit arrangement or a differential pair circuit arrangement. The shielded electrical cable 402*a* further includes a plurality of ground conductors 412 positioned external to shielding films 408*a*. Ground conductors 412 are placed over, under, and on both sides of conductor set 404*a*. Optionally, the cable 402*a* includes protective films 420 surrounding the shielding films 408*a* and ground conductors 412. Protective films 420 include a protective layer 421 and an adhesive layer 422 bonding protective layer 421 to shielding films 408*a* and ground conductors 412. Alternatively, shielding films 408*a* and ground conductors 412 may be surrounded by an outer conductive shield, such as, e.g., a conductive braid, and an outer insulative jacket (not shown).

Referring to FIG. 4*b*, a shielded electrical cable 402*b* includes a single conductor set 404*b* that extends along a length of cable 402*b*. Conductor set 404*b* has two insulated conductors 406, i.e., one pair of insulated conductors. Cable 402*b* may be made to have multiple conductor sets 404*b* spaced apart from each other across a width of the cable and extending along the length of the cable. Two shielding films 408*b* are disposed on opposite sides of the cable 402*b* and include cover portions 407*b*. In transverse cross section, the cover portions 407*b*, in combination, substantially surround conductor set 404*b*. An optional adhesive layer 410*b* is disposed between pinched portions 409*b* of the shielding films 408*b* and bonds the shielding films to each other on both sides of the conductor set. Insulated conductors 406 are arranged generally in a single plane and effectively in a twinaxial or differential pair cable arrangement. Shielded electrical cable 402*b* further includes a plurality of ground conductors 412 positioned between shielding films 408*b*. Two of the ground conductors 412 are included in conductor set 404*b*, and two of the ground conductors 412 are spaced apart from conductor set 404*b*.

Referring to FIG. 4*c*, a shielded electrical cable 402*c* includes a single conductor set 404*c* that extends along a length of cable 402*c*. Conductor set 404*c* has two insulated conductors 406, i.e., one pair of insulated conductors. Cable 402*c* may be made to have multiple conductor sets 404*c* spaced apart from each other across a width of the cable and extending along the length of the cable. Two shielding films 408*c* are disposed on opposite sides of the cable 402*c* and include cover portions 407*c*. In transverse cross section, the cover portions 407*c*, in combination, substantially surround the conductor set 404*c*. An optional adhesive layer 410*c* is disposed between pinched portions 409*c* of the shielding films 408*c* and bonds shielding films 408*c* to each other on both sides of conductor set 404*c*. Insulated conductors 406 are arranged generally in a single plane and effectively in a twinaxial or differential pair cable arrangement. Shielded electrical cable 402*c* further includes a plurality of ground conductors 412 positioned between shielding films 408*c*. All of the ground conductors 412 are included in the conductor set 404*c*. Two of the ground conductors 412 and insulated conductors 406 are arranged generally in a single plane.

The disclosed shielded cables can, if desired, be connected to a circuit board or other termination component using one or more electrically conductive cable clips. For example, a shielded electrical cable may include a plurality of spaced apart conductor sets arranged generally in a single plane, and each conductor set may include two insulated conductors that extend along a length of the cable. Two shielding films may be disposed on opposite sides of the cable and, in transverse cross section, substantially surround each of the conductor sets. A cable clip may be clamped or otherwise attached to an end portion of the shielded electrical cable such that at least one of shielding films electrically contacts the cable clip. The cable clip may be configured for termination to a ground reference, such as, e.g., a conductive trace or other contact element on a printed circuit board, to establish a ground connection between shielded electrical cable and the ground reference. The cable clip may be terminated to the ground reference using any suitable method, including soldering, welding, crimping, mechanical clamping, and adhesively bonding, to name a few. When terminated, the cable clip may facilitate termination of end portions of the conductors of the insulated conductors of the shielded electrical cable to contact elements of a termination point, such as, e.g., contact elements on printed circuit board. The shielded electrical cable may include one or more ground conductors as described herein that may electrically contact the cable clip in addition to or instead of at least one of the shielding films.

Figure 5A:
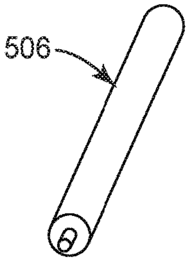
FIGS. 5*a*-5*c* are perspective views illustrating an exemplary method of making a shielded electrical cable.
Figure 5B:
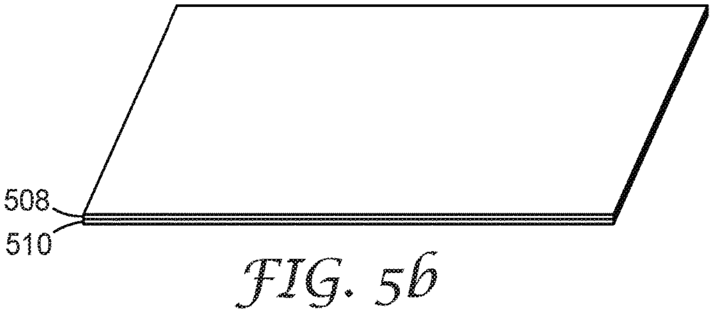
Figure 5C:
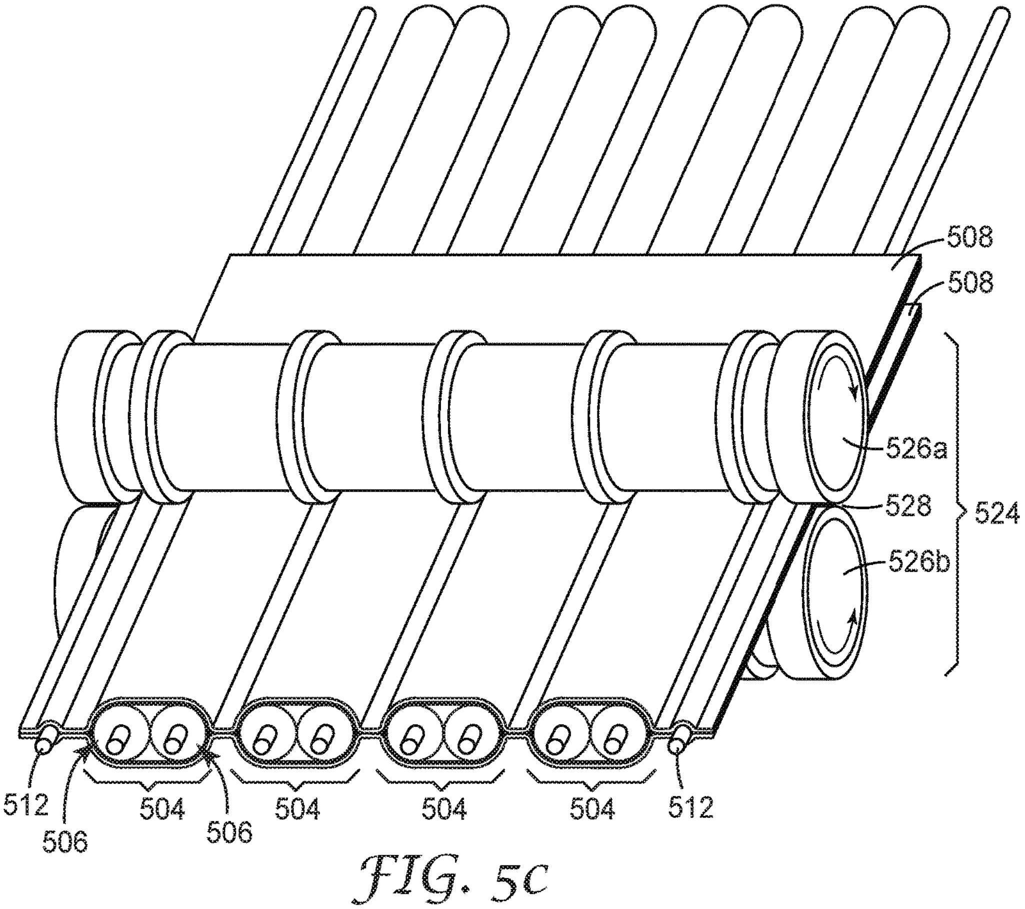

FIGS. 5*a*-5*c* illustrate an exemplary method of making a shielded electrical cable. Specifically, these figures illustrate an exemplary method of making a shielded electrical cable that may be substantially the same as that shown in FIG. 1.

In the step illustrated in FIG. 5*a*, insulated conductors 506 are formed using any suitable method, such as, e.g., extrusion, or are otherwise provided. Insulated conductors 506 may be formed of any suitable length. Insulated conductors 506 may then be provided as such or cut to a desired length. Ground conductors 512 (see FIG. 5*c*) may be formed and provided in a similar fashion.

In the step illustrated in FIG. 5*b*, shielding films 508 are formed. A single layer or multilayer web may be formed using any suitable method, such as, e.g., continuous wide web processing. Shielding films 508 may be formed of any suitable length. Shielding films 508 may then be provided as such or cut to a desired length and/or width. Shielding films 508 may be pre-formed to have transverse partial folds to increase flexibility in the longitudinal direction. One or both of the shielding films may include a conformable adhesive layer 510, which may be formed on the shielding films 508 using any suitable method, such as, e.g., laminating or sputtering.

In the step illustrated in FIG. 5*c*, a plurality of insulated conductors 506, ground conductors 512, and shielding films 508 are provided. A forming tool 524 is provided. Forming tool 524 includes a pair of forming rolls 526*a*, 526*b* having a shape corresponding to a desired cross-sectional shape of the finished shielded electrical cable, the forming tool also including a bite 528. Insulated conductors 506, ground conductors 512, and shielding films 508 are arranged according to the configuration of the desired shielded cable, such as any of the cables shown and/or described herein, and positioned in proximity to forming rolls 526*a*, 526*b*, after which they are concurrently fed into bite 528 of forming rolls 526*a*, 526*b* and disposed between forming rolls 526*a*, 526*b*. The forming tool 524 forms shielding films 508 around conductor sets 504 and ground conductor 512 and bonds shielding films 508 to each other on both sides of each conductor set 504 and ground conductors 512. Heat may be applied to facilitate bonding. Although in this embodiment, forming shielding films 508 around conductor sets 504 and ground conductor 512 and bonding shielding films 508 to each other on both sides of each conductor set 504 and ground conductors 512 occur in a single operation, in other embodiments, these steps may occur in separate operations.

In subsequent fabrication operations, longitudinal splits may if desired be formed between the conductor sets. Such splits may be formed in the shielded cable using any suitable method, such as, e.g., laser cutting or punching. In another optional fabrication operation, the shielded electrical cable may be folded lengthwise along the pinched regions multiple times into a bundle, and an outer conductive shield may be provided around the folded bundle using any suitable method. An outer jacket may also be provided around the outer conductive shield using any suitable method, such as, e.g., extrusion. In other embodiments, the outer conductive shield may be omitted and the outer jacket may be provided by itself around the folded shielded cable.

Figure 6A:
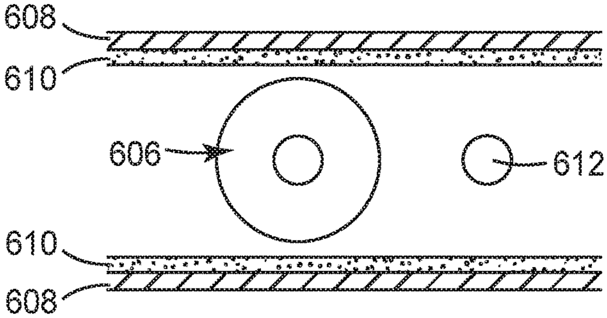
FIGS. 6*a*-6*c* are front cross-sectional views illustrating a detail of an exemplary method of making a shielded electrical cable.
Figure 6B:
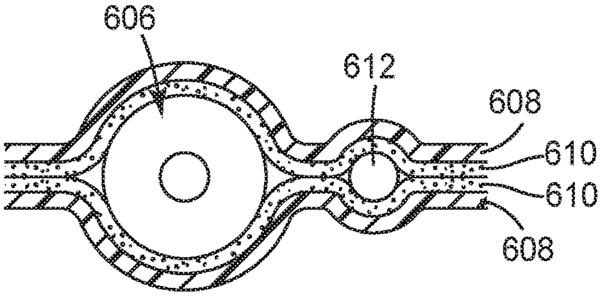
Figure 6C:
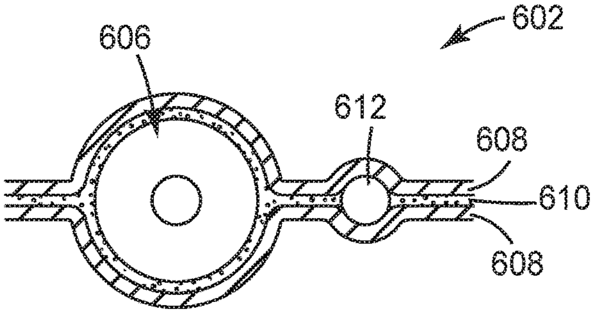

FIGS. 6*a*-6*c* illustrate a detail of an exemplary method of making a shielded electrical cable. In particular, these figures illustrate how one or more adhesive layers may be conformably shaped during the forming and bonding of the shielding films.

In the step illustrated in FIG. 6*a*, an insulated conductor 606, a ground conductor 612 spaced apart from the insulated conductor 606, and two shielding films 608 are provided. Shielding films 608 each include a conformable adhesive layer 610. In the steps illustrated in FIGS. 6*b*-6*c*, shielding films 608 are formed around insulated conductor 606 and ground conductor 612 and bonded to each other. Initially, as illustrated in FIG. 6*b*, the adhesive layers 610 still have their original thickness. As the forming and bonding of shielding films 608 proceeds, the adhesive layers 610 conform to achieve desired mechanical and electrical performance characteristics of finished shielded electrical cable 602 (FIG. 6*c*).

As illustrated in FIG. 11*c*, adhesive layers 610 conform to be thinner between shielding films 608 on both sides of insulated conductor 606 and ground conductor 612; a portion of adhesive layers 610 displaces away from these areas. Further, adhesive layers 610 conform to be thicker in areas immediately adjacent insulated conductor 606 and ground conductor 612, and substantially conform to insulated conductor 606 and ground conductor 612; a portion of adhesive layers 610 displaces into these areas. Further, adhesive layers 610 conform to effectively be removed between shielding films 608 and ground conductor 612; the adhesive layers 610 displace away from these areas such that ground conductor 612 electrically contacts shielding films 608.

Figure 7A:
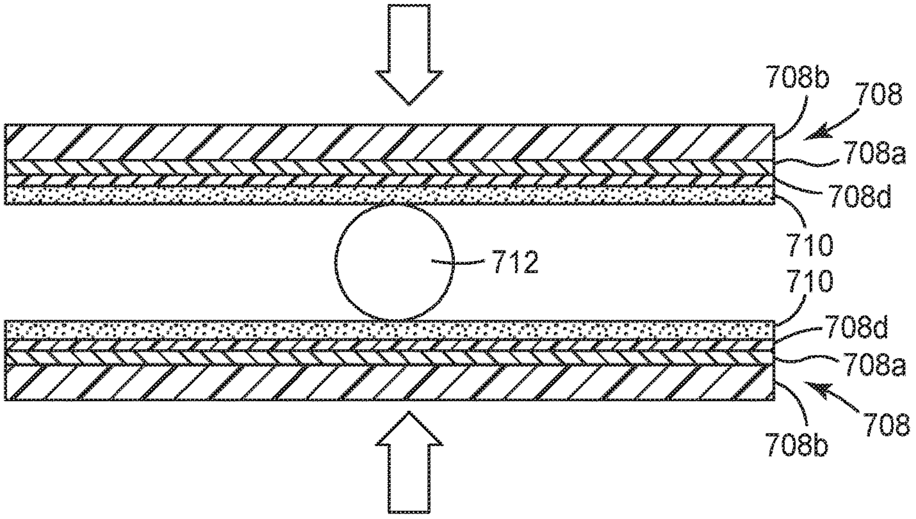
FIGS. 7*a* and 7*b* are front cross-sectional detail views illustrating another aspect of making an exemplary shielded electrical cable.
Figure 7B:
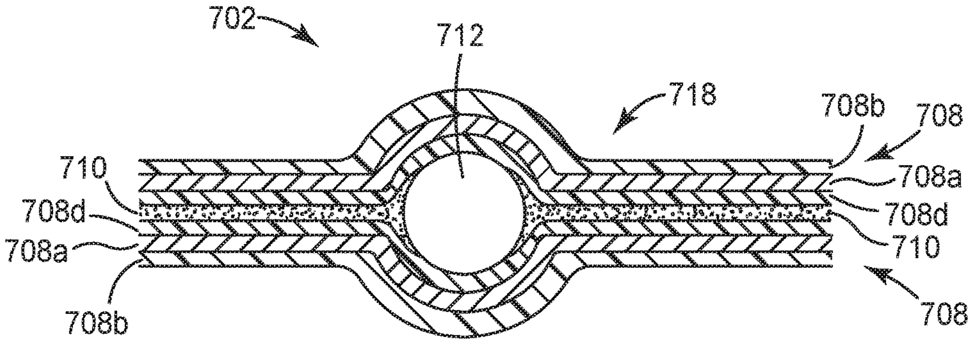

FIGS. 7*a* and 7*b* illustrate details pertaining to a pinched region during the manufacture of an exemplary shielded electrical cable. Shielded electrical cable 702 (see FIG. 7*b*) is made using two shielding films 708 and includes a pinched region 718 (see FIG. 7*b*) wherein shielding films 708 may be substantially parallel. Shielding films 708 include a non-conductive polymeric layer 708*b*, a conductive layer 708*a* disposed on non-conductive polymeric layer 708*b*, and a stop layer 708*d* disposed on the conductive layer 708*a*. A conformable adhesive layer 710 is disposed on stop layer 708*d*. Pinched region 718 includes a longitudinal ground conductor 712 disposed between shielding films 708. After the shielding films are forced together around the ground conductor, the ground conductor 712 makes indirect electrical contact with the conductive layers 708*a* of shielding films 708. This indirect electrical contact is enabled by a controlled separation of conductive layer 708*a* and ground conductor 712 provided by stop layer 708*d*. In some cases, the stop layer 708*d* may be or include a non-conductive polymeric layer. As shown in the figures, an external pressure (see FIG. 17*a*) is used to press conductive layers 708*a* together and force the adhesive layers 710 to conform around the ground conductor 712 (FIG. 17*b*). Because the stop layer 708*d* does not conform at least under the same processing conditions, it prevents direct electrical contact between the ground conductor 712 and conductive layer 708*a* of the shielding films 708, but achieves indirect electrical contact. The thickness and dielectric properties of stop layer 708*d* may be selected to achieve a low target DC resistance, i.e., electrical contact of an indirect type. In some embodiments, the characteristic DC resistance between the ground conductor and the shielding film may be less than 10 ohms, or less than 5 ohms, for example, but greater than 0 ohms, to achieve the desired indirect electrical contact. In some cases, it is desirable to make direct electrical contact between a given ground conductor and one or two shielding films, whereupon the DC resistance between such ground conductor and such shielding film(s) may be substantially 0 ohms.

In exemplary embodiments, the cover regions of the shielded electrical cable include concentric regions and transition regions positioned on one or both sides of a given conductor set. Portions of a given shielding film in the concentric regions are referred to as concentric portions of the shielding film, and portions of the shielding film in the transition regions are referred to as transition portions of the shielding film. The transition regions can be configured to provide high manufacturability and strain and stress relief of the shielded electrical cable. Maintaining the transition regions at a substantially constant configuration (including aspects such as, e.g., size, shape, content, and radius of curvature) along the length of the shielded electrical cable may help the shielded electrical cable to have substantially uniform electrical properties, such as, e.g., high frequency isolation, impedance, skew, insertion loss, reflection, mode conversion, eye opening, and jitter.

Additionally, in certain embodiments, such as, e.g., embodiments wherein the conductor set includes two insulated conductors that extend along a length of the cable that are arranged generally in a single and effectively as a twinaxial cable that can be connected in a differential pair circuit arrangement, maintaining the transition portion at a substantially constant configuration along the length of the shielded electrical cable can beneficially provide substantially the same electromagnetic field deviation from an ideal concentric case for both conductors in the conductor set. Thus, careful control of the configuration of this transition portion along the length of the shielded electrical cable can contribute to the advantageous electrical performance and characteristics of the cable. FIGS. 8*a* through 10 illustrate various exemplary embodiments of a shielded electrical cable that include transition regions of the shielding films disposed on one or both sides of the conductor set.

Figure 8A:
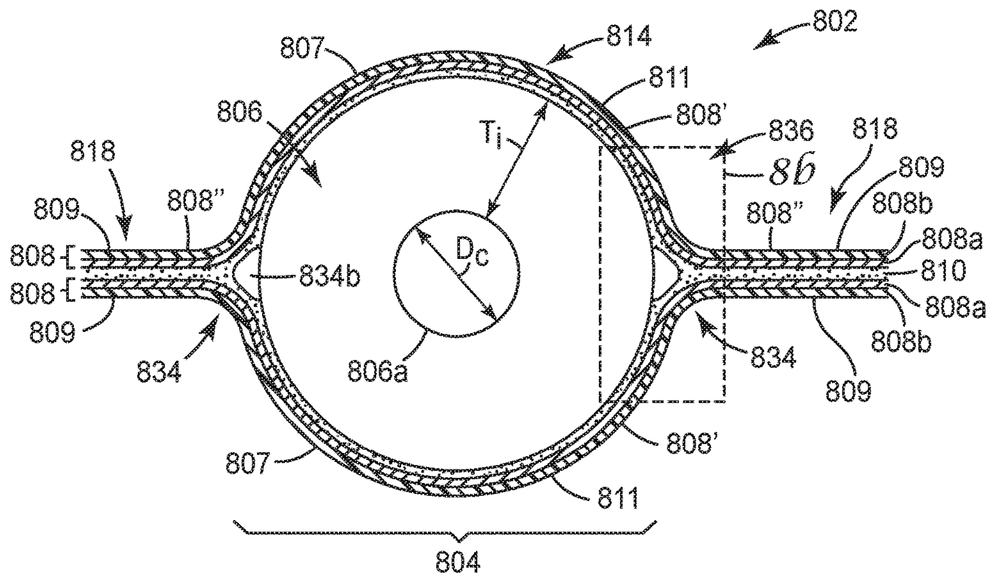
FIG. 8*a* is a front cross-sectional view of another exemplary embodiment of a shielded electrical cable.
Figure 8B:
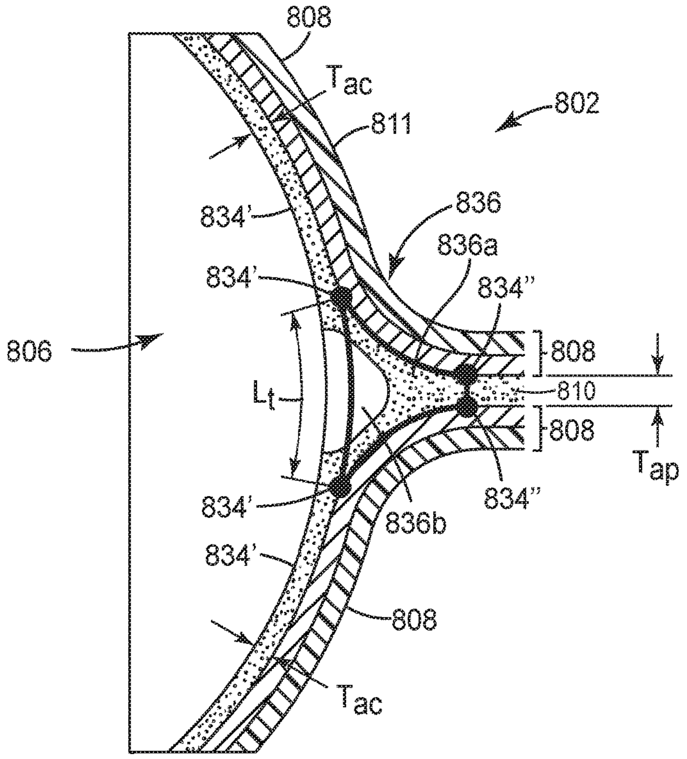
FIG. 8*b* is a corresponding detail view thereof.

The shielded electrical cable 802, which is shown in cross section in FIGS. 8*a* and 8*b*, includes a single conductor set 804 that extends along a length of the cable. The cable 802 may be made to have multiple conductor sets 804 spaced apart from each other along a width of the cable and extending along a length of the cable. Although only one insulated conductor 806 is shown in FIG. 8*a*, multiple insulated conductors may be included in the conductor set 804 if desired.

The insulated conductor of a conductor set that is positioned nearest to a pinched region of the cable is considered to be an end conductor of the conductor set. The conductor set 804, as shown, has a single insulated conductor 806, and it is also an end conductor since it is positioned nearest to the pinched region 818 of the shielded electrical cable 802.

First and second shielding films 808 are disposed on opposite sides of the cable and include cover portions 807. In transverse cross section, the cover portions 807 substantially surround conductor set 804. An optional adhesive layer 810 is disposed between the pinched portions 809 of the shielding films 808, and bonds shielding films 808 to each other in the pinched regions 818 of the cable 802 on both sides of conductor set 804. The optional adhesive layer 810 may extend partially or fully across the cover portion 807 of the shielding films 808, e.g., from the pinched portion 809 of the shielding film 808 on one side of the conductor set 804 to the pinched portion 809 of the shielding film 808 on the other side of the conductor set 804.

Insulated conductor 806 is effectively arranged as a coaxial cable which may be used in a single ended circuit arrangement. Shielding films 808 may include a conductive layer 808*a* and a non-conductive polymeric layer 808*b*. In some embodiments, as illustrated by FIGS. 8*a* and 8*b*, the conductive layer 808*a* of both shielding films faces the insulated conductors. Alternatively, the orientation of the conductive layers of one or both of shielding films 808 may be reversed, as discussed elsewhere herein.

Shielding films 808 include a concentric portion that is substantially concentric with the end conductor 806 of the conductor set 804. The shielded electrical cable 802 includes transition regions 836. Portions of the shielding film 808 in the transition region 836 of the cable 802 are transition portions 834 of the shielding films 808. In some embodiments, shielded electrical cable 802 includes a transition region 836 positioned on both sides of the conductor set 804, and in some embodiments a transition region 836 may be positioned on only one side of conductor set 804.

Transition regions 836 are defined by shielding films 808 and conductor set 804. The transition portions 834 of the shielding films 808 in the transition regions 836 provide a gradual transition between concentric portions 811 and pinched portions 809 of the shielding films 808. As opposed to a sharp transition, such as, e.g., a right-angle transition or a transition point (as opposed to a transition portion), a gradual or smooth transition, such as, e.g., a substantially sigmoidal transition, provides strain and stress relief for shielding films 808 in transition regions 836 and prevents damage to shielding films 808 when shielded electrical cable 802 is in use, e.g., when laterally or axially bending shielded electrical cable 802. This damage may include, e.g., fractures in conductive layer 808*a* and/or debonding between conductive layer 808*a* and non-conductive polymeric layer 808*b*. In addition, a gradual transition prevents damage to shielding films 808 in manufacturing of shielded electrical cable 802, which may include, e.g., cracking or shearing of conductive layer 808*a* and/or non-conductive polymeric layer 808*b*. Use of the disclosed transition regions on one or both sides of one, some, or all of the conductor sets in a shielded electrical ribbon cable represents a departure from conventional cable configurations, such as, e.g., a typical coaxial cable, wherein a shield is generally continuously disposed around a single insulated conductor, or a typical conventional twinaxial cable in which a shield is continuously disposed around a pair of insulated conductors. Although these conventional shielding configurations may provide model electromagnetic profiles, such profiles may not be necessary to achieve acceptable electrical properties in a given application.

According to one aspect of at least some of the disclosed shielded electrical cables, acceptable electrical properties can be achieved by reducing the electrical impact of the transition region, e.g., by reducing the size of the transition region and/or carefully controlling the configuration of the transition region along the length of the shielded electrical cable. Reducing the size of the transition region reduces the capacitance deviation and reduces the required space between multiple conductor sets, thereby reducing the conductor set pitch and/or increasing the electrical isolation between conductor sets. Careful control of the configuration of the transition region along the length of the shielded electrical cable contributes to obtaining predictable electrical behavior and consistency, which provides for high speed transmission lines so that electrical data can be more reliably transmitted. Careful control of the configuration of the transition region along the length of the shielded electrical cable is a factor as the size of the transition portion approaches a lower size limit.

An electrical characteristic that is often considered is the characteristic impedance of the transmission line. Any impedance changes along the length of a transmission line may cause power to be reflected back to the source instead of being transmitted to the target. Ideally, the transmission line will have no impedance variation along its length, but, depending on the intended application, variations up to 5-10% may be acceptable. Another electrical characteristic that is often considered in twinaxial cables (differentially driven) is skew or unequal transmission speeds of two transmission lines of a pair along at least a portion of their length. Skew produces conversion of the differential signal to a common mode signal that can be reflected back to the source, reduces the transmitted signal strength, creates electromagnetic radiation, and can dramatically increase the bit error rate, in particular jitter. Ideally, a pair of transmission lines will have no skew, but, depending on the intended application, a differential S-parameter SCD21 or SCD12 value (representing the differential-to common mode conversion from one end of the transmission line to the other) of less than −25 to −30 dB up to a frequency of interest, such as, e.g., 6 GHz, may be acceptable. Alternatively, skew can be measured in the time domain and compared to a required specification. Depending on the intended application, values of less than about 20 picoseconds/meter (ps/m) and preferably less than about 10 ps/m may be acceptable.

Referring again to FIGS. 8*a* and 8*b*, in part to help achieve acceptable electrical properties, transition regions 836 of shielded electrical cable 802 may each include a cross-sectional transition area 836*a*. The transition area 836*a* is preferably smaller than a cross-sectional area 806*a* of conductor 806. As best shown in FIG. 8*b*, cross-sectional transition area 836*a* of transition region 836 is defined by transition points 834' and 834".

The transition points 834' occur where the shielding films deviate from being substantially concentric with the end insulated conductor 806 of the conductor set 804. The transition points 834' are the points of inflection of the shielding films 808 at which the curvature of the shielding films 808 changes sign. For example, with reference to FIG. 8*b*, the curvature of the upper shielding film 808 transitions from concave downward to concave upward at the inflection point which is the upper transition point 834' in the figure. The curvature of the lower shielding film 808 transitions from concave upward to concave downward at the inflection point which is the lower transition point 834' in the figure. The other transition points 834" occur where a separation between the pinched portions 809 of the shielding films 808 exceeds the minimum separation $d_1$ of the pinched portions 809 by a predetermined factor, e.g., 1.2 or 1.5.

In addition, each transition area 836*a* may include a void area 836*b*. Void areas 836*b* on either side of the conductor set 804 may be substantially the same. Further, adhesive layer 810 may have a thickness $T_{ac}$ at the concentric portion 811 of the shielding film 808, and a thickness at the transition portion 834 of the shielding film 808 that is greater than thickness $T_{ac}$. Similarly, adhesive layer 810 may have a thickness $T_{ap}$ between the pinched portions 809 of the shielding films 808, and a thickness at the transition portion 834 of the shielding film 808 that is greater than thickness $T_{ap}$. Adhesive layer 810 may represent at least 25% of cross-sectional transition area 836*a*. The presence of adhesive layer 810 in transition area 836*a*, in particular at a thickness that is greater than thickness $T_{ac}$ or thickness $T_{ap}$, contributes to the strength of the cable 802 in the transition region 836.

Careful control of the manufacturing process and the material characteristics of the various elements of shielded electrical cable 802 may reduce variations in void area 836*b* and the thickness of conformable adhesive layer 810 in transition region 836, which may in turn reduce variations in the capacitance of cross-sectional transition area 836*a*.

Shielded electrical cable 802 may include transition region 836 positioned on one or both sides of conductor set 804 that includes a cross-sectional transition area 836*a* that is substantially equal to or smaller than a cross-sectional area 806*a* of conductor 806. Shielded electrical cable 802 may include a transition region 836 positioned on one or both sides of conductor set 804 that includes a cross-sectional transition area 836*a* that is substantially the same along the length of conductor 806. For example, cross-sectional transition area 836*a* may vary less than 50% over a length of 1 meter. Shielded electrical cable 802 may include transition regions 836 positioned on both sides of conductor set 804 that each include a cross-sectional transition area, wherein the sum of cross-sectional areas 834*a* is substantially the same along the length of conductor 806. For example, the sum of cross-sectional areas 834*a* may vary less than 50% over a length of 1 m. Shielded electrical cable 802 may include transition regions 836 positioned on both sides of conductor set 804 that each include a cross-sectional transition area 836*a*, wherein the cross-sectional transition areas 836*a* are substantially the same. Shielded electrical cable 802 may include transition regions 836 positioned on both sides of conductor set 804, wherein the transition regions 836 are substantially identical. Insulated conductor 806 has an insulation thickness $T_i$, and transition region 836 may have a lateral length $L_t$ that is less than insulation thickness $T_i$. The central conductor of insulated conductor 806 has a diameter $D_c$, and transition region 836 may have a lateral length $L_t$ that is less than the diameter $D_c$. The various configurations described above may provide a characteristic impedance that remains within a desired range, such as, e.g., within 5-10% of a target impedance value, such as, e.g., 50 ohms, over a given length, such as, e.g., 1 meter.

Factors that can influence the configuration of transition region 836 along the length of shielded electrical cable 802 include the manufacturing process, the thickness of conductive layers 808*a* and non-conductive polymeric layers 808*b*, adhesive layer 810, and the bond strength between insulated conductor 806 and shielding films 808, to name a few.

In one aspect, conductor set 804, shielding films 808, and transition region 836 may be cooperatively configured in an impedance controlling relationship. An impedance controlling relationship means that conductor set 804, shielding films 808, and transition region 836 are cooperatively configured to control the characteristic impedance of the shielded electrical cable.

Figure 9:
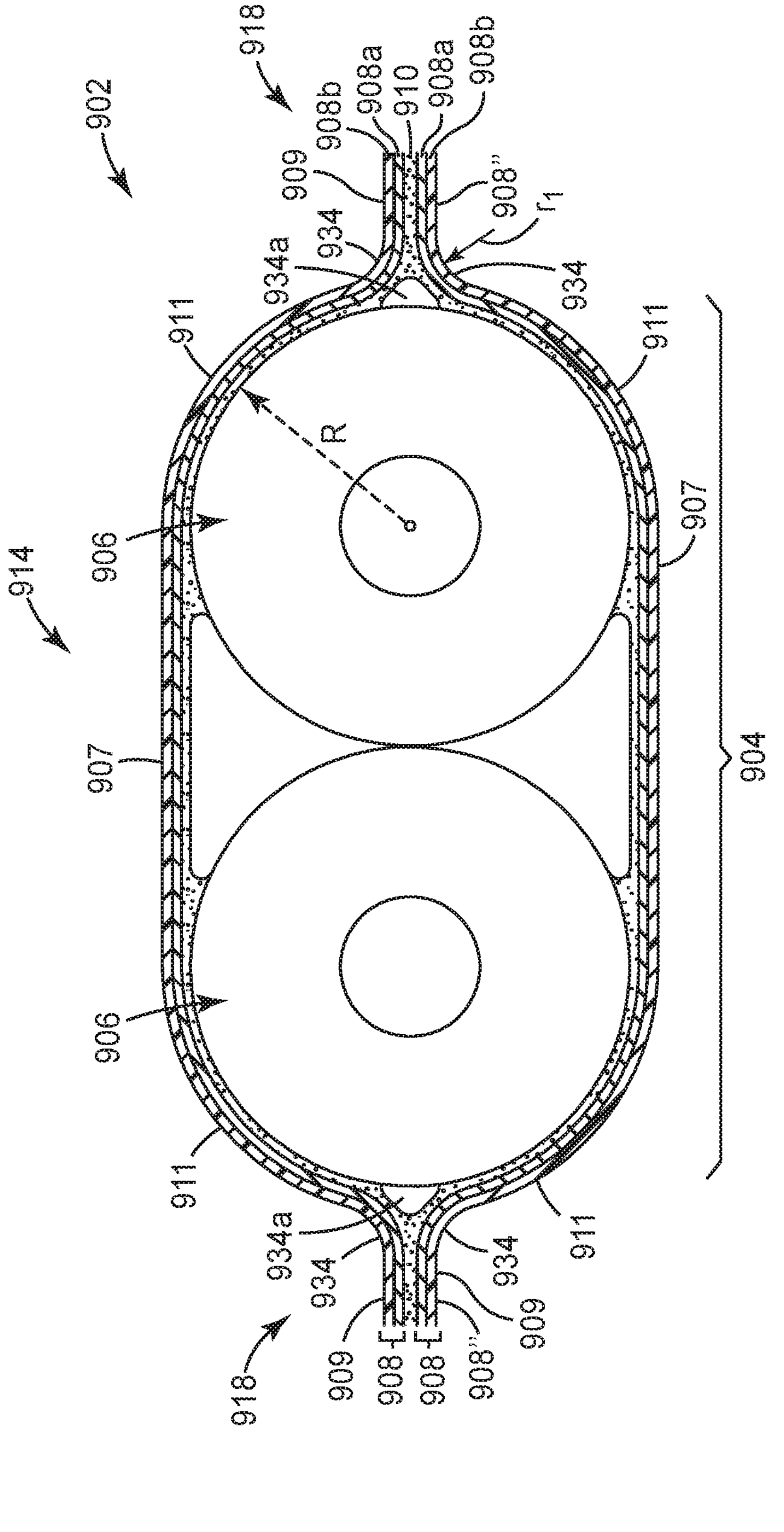
FIG. 9 is a front cross-sectional view of a portion of another exemplary shielded electrical cable.

FIG. 9 illustrates, in transverse cross section, an exemplary shielded electrical cable 902 that includes two insulated conductors in a connector set 904, the individually insulated conductors 906 each extending along a length of the cable 902. Two shielding films 908 are disposed on opposite sides of the cable 902 and in combination substantially surround conductor set 904. An optional adhesive layer 910 is disposed between pinched portions 909 of the shielding films 908 and bonds shielding films 908 to each other on both sides of conductor set 904 in the pinched regions 918 of the cable. Insulated conductors 906 can be arranged generally in a single plane and effectively in a twinaxial cable configuration. The twinaxial cable configuration can be used in a differential pair circuit arrangement or in a single ended circuit arrangement. Shielding films 908 may include a conductive layer 908*a* and a non-conductive polymeric layer 908*b*, or may include the conductive layer 908*a* without the non-conductive polymeric layer 908*b*. In the figure, the conductive layer 908*a* of each shielding film is shown facing insulated conductors 906, but in alternative embodiments, one or both of the shielding films may have a reversed orientation.

The cover portion 907 of at least one of the shielding films 908 includes concentric portions 911 that are substantially concentric with corresponding end conductors 906 of the conductor set 904. In the transition regions of the cable 902, transition portion 934 of the shielding films 908 are between the concentric portions 911 and the pinched portions 909 of the shielding films 908. Transition portions 934 are positioned on both sides of conductor set 904, and each such portion includes a cross-sectional transition area 934*a*. The sum of cross-sectional transition areas 934*a* is preferably substantially the same along the length of conductors 906. For example, the sum of cross-sectional areas 934*a* may vary less than 50% over a length of 1 m.

In addition, the two cross-sectional transition areas 934*a* may be substantially the same and/or substantially identical. This configuration of transition regions contributes to a characteristic impedance for each conductor 906 (single-ended) and a differential impedance that both remain within a desired range, such as, e.g., within 5-10% of a target impedance value over a given length, such as, e.g., 1 m. In addition, this configuration of the transition regions may minimize skew of the two conductors 906 along at least a portion of their length.

When the cable is in an unfolded, planar configuration, each of the shielding films may be characterizable in transverse cross section by a radius of curvature that changes across across a width of the cable 902. The maximum radius of curvature of the shielding film 908 may occur, for example, at the pinched portion 909 of the cable 902, or near the center point of the cover portion 907 of the multi-conductor cable set 904 illustrated in FIG. 9. At these positions, the film may be substantially flat and the radius of curvature may be substantially infinite. The minimum radius of curvature of the shielding film 908 may occur, for example, at the transition portion 934 of the shielding film 908. In some embodiments, the radius of curvature of the shielding film across the width of the cable is at least about 50 micrometers, i.e., the radius of curvature does not have a magnitude smaller than 50 micrometers at any point along the width of the cable, between the edges of the cable. In some embodiments, for shielding films that include a transition portion, the radius of curvature of the transition portion of the shielding film is similarly at least about 50 micrometers.

In an unfolded, planar configuration, shielding films that include a concentric portion and a transition portion are characterizable by a radius of curvature of the concentric portion, $R_1$, and/or a radius of curvature of the transition portion $r_1$. These parameters are illustrated in FIG. 9 for the cable 902. In exemplary embodiments, $R_1/r_1$ is in a range of 2 to 15.

Figure 10:
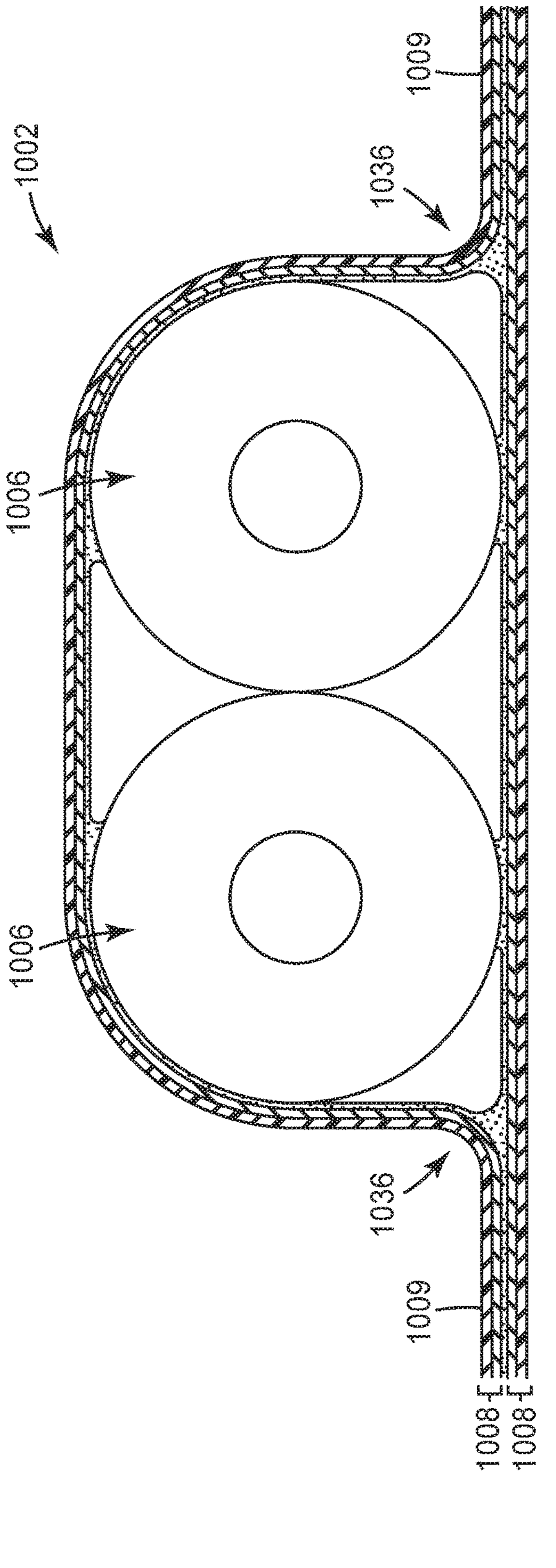
FIG. 10 is a front cross-sectional view of a portion of another exemplary shielded electrical cable.

FIG. 10 illustrates another exemplary shielded electrical cable 1002 which includes a conductor set having two insulated conductors 1006. In this embodiment, the shielding films 1008 have an asymmetric configuration, which changes the position of the transition portions relative to a more symmetric embodiment such as that of FIG. 9. In FIG. 10, shielded electrical cable 1002 has pinched portions 1009 of shielding films 1008 that lie in a plane that is slightly offset from the plane of symmetry of the insulated conductors 1006. Despite the slight offset, the cable of FIG. 10 and its various elements can still be considered to extend generally along a given plane and to be substantially planar. The transition regions 1036 have a somewhat offset position and configuration relative to other depicted embodiments. However, by ensuring that the two transition regions 1036 are positioned substantially symmetrically with respect to corresponding insulated conductors 1006 (e.g. with respect to a vertical plane between the conductors 1006), and that the configuration of transition regions 1036 is carefully controlled along the length of shielded electrical cable 1002, the shielded electrical cable 1002 can be configured to still provide acceptable electrical properties.

Figure 11A:
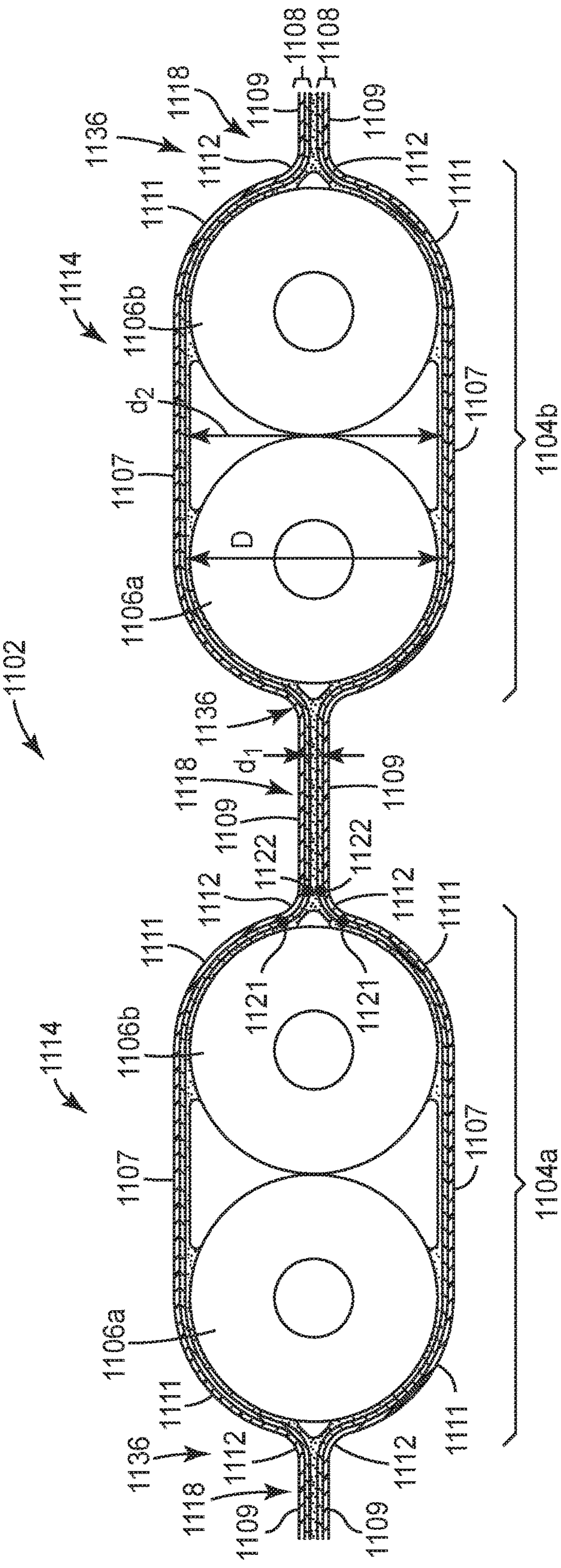
FIGS. 11*a* and 11*b* are front cross-sectional views of two other portions of exemplary shielded electrical cables.
Figure 11B:
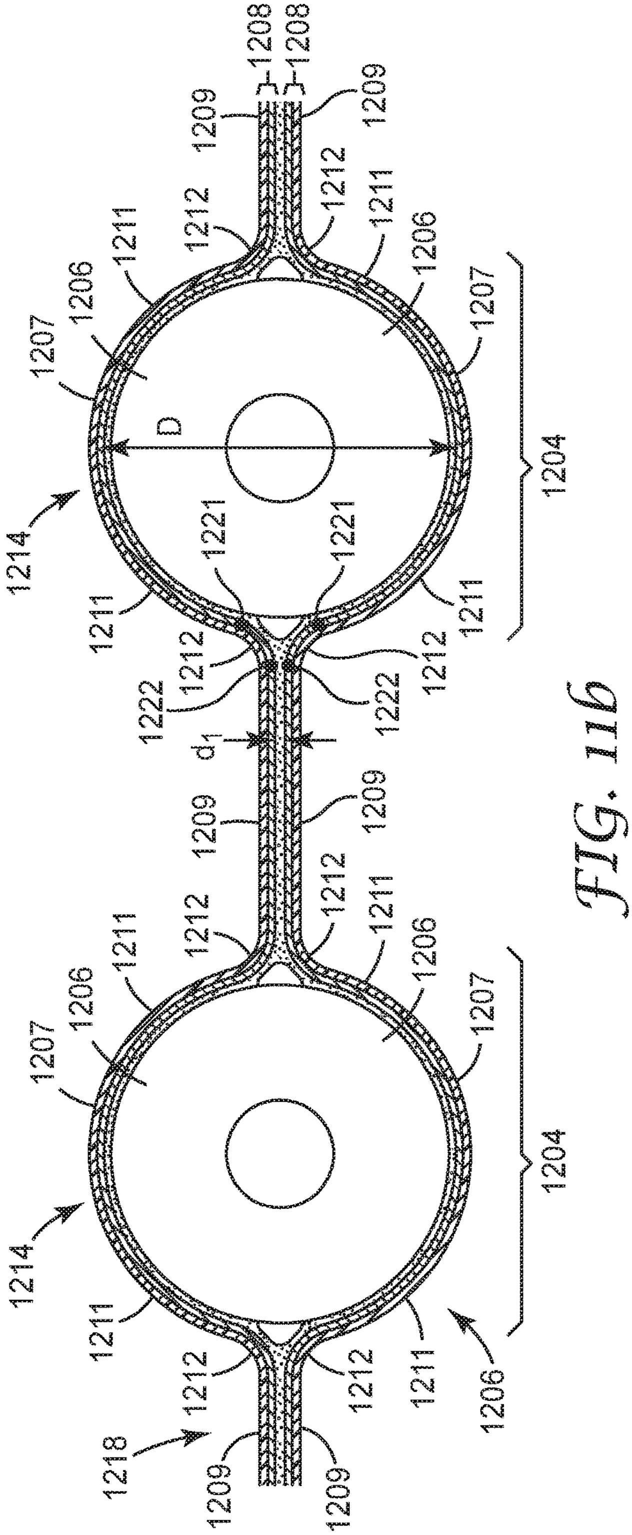

FIGS. 11*a* and 11*b* illustrate additional exemplary shielded electrical cables. These figures are used to further explain how a pinched portion of the cable is configured to electrically isolate a conductor set of the shielded electrical cable. The conductor set may be electrically isolated from an adjacent conductor set (e.g., to minimize crosstalk between adjacent conductor sets) or from the external environment of the shielded electrical cable (e.g., to minimize electromagnetic radiation escape from the shielded electrical cable and minimize electromagnetic interference from external sources). In both cases, the pinched portion may include various mechanical structures to realize the electrical isolation. Examples include close proximity of the shielding films, high dielectric constant material between the shielding films, ground conductors that make direct or indirect electrical contact with at least one of the shielding films, extended distance between adjacent conductor sets, physical breaks between adjacent conductor sets, intermittent contact of the shielding films to each other directly either longitudinally, transversely, or both, and conductive adhesive, to name a few.

FIG. 11*a* shows, in cross section, a shielded electrical cable 1102 that includes two conductor sets 1104*a*, 104*b* spaced apart across a width of the cable 102 and extending longitudinally along a length of the cable. Each conductor set 1104*a*, 1104*b* has two insulated conductors 1106*a*, 1106*b*. Two shielding films 1108 are disposed on opposite sides of the cable 1102. In transverse cross section, cover portions 1107 of the shielding films 1108 substantially surround conductor sets 1104*a*, 1104*b* in cover regions 1114 of the cable 1102. In pinched regions 1118 of the cable, on both sides of the conductor sets 1104*a*, 1104*b*, the shielding films 1108 include pinched portions 1109. In shielded electrical cable 1102, the pinched portions 1109 of shielding films 1108 and insulated conductors 1106 are arranged generally in a single plane when the cable 1102 is in a planar and/or unfolded arrangement. Pinched portions 1109 positioned in between conductor sets 1104*a*, 1104*b* are configured to electrically isolate conductor sets 1104*a*, 1104*b* from each other. When arranged in a generally planar, unfolded arrangement, as illustrated in FIG. 11*a*, the high frequency electrical isolation of the first insulated conductor 1106*a* in the conductor set 1104*a* relative to the second insulated conductor 1106*b* in the conductor set 1104*a* is substantially less than the high frequency electrical isolation of the first conductor set 1104*a* relative to the second conductor set 1104*b*.

As illustrated in the cross section of FIG. 11*a*, the cable 1102 can be characterized by a maximum separation, D, between the cover portions 1107 of the shielding films 1108, a minimum separation, $d_2$, between the cover portions 1107 of the shielding films 1108, and a minimum separation, $d_1$, between the pinched portions 1109 of the shielding films 1108. In some embodiments, $d_1/D$ is less than 0.25, or less than 0.1. In some embodiments, $d_2/D$ is greater than 0.33.

An optional adhesive layer may be included as shown between the pinched portions 1109 of the shielding films 1108. The adhesive layer may be continuous or discontinuous. In some embodiments, the adhesive layer may extend fully or partially in the cover region 1114 of the cable 1102, e.g., between the cover portion 1107 of the shielding films 1108 and the insulated conductors 1106*a*, 1106*b*. The adhesive layer may be disposed on the cover portion 1107 of the shielding film 1108 and may extend fully or partially from the pinched portion 1109 of the shielding film 1108 on one side of a conductor set 1104*a*, 1104*b* to the pinched portion 1109 of the shielding film 1108 on the other side of the conductor set 1104*a*, 1104*b*.

The shielding films 1108 can be characterized by a radius of curvature, R, across a width of the cable 1102 and/or by a radius of curvature, $r_1$, of the transition portion 1112 of the shielding film and/or by a radius of curvature, $r_2$, of the concentric portion 1111 of the shielding film.

In the transition region 1136, the transition portion 1112 of the shielding film 1108 can be arranged to provide a gradual transition between the concentric portion 1111 of the shielding film 1108 and the pinched portion 1109 of the shielding film 1108. The transition portion 1112 of the shielding film 1108 extends from a first transition point 1121, which is the inflection point of the shielding film 1108 and marks the end of the concentric portion 1111, to a second transition point 1122 where the separation between the shielding films exceeds the minimum separation, $d_1$, of the pinched portions 1109 by a predetermined factor.

In some embodiments, the cable 1102 includes at least one shielding film that has a radius of curvature, R, across the width of the cable that is at least about 50 micrometers and/or the minimum radius of curvature, $r_1$, of the transition portion 1112 of the shielding film 1102 is at least about 50 micrometers. In some embodiments, the ratio of the minimum radius of curvature of the concentric portion to the minimum radius of curvature of the transition portion, $r_2/r_1$ is in a range of 2 to 15.

FIG. 11*b* is a cross sectional view of a shielded electrical cable 1202 that includes two conductor sets 1204 spaced apart from each other across a width of the cable and extending longitudinally along a length of the cable. Each conductor set 1204 has only one insulated conductor 1206, and two shielding films 1208 are disposed on opposite sides of the cable 1202. In transverse cross section, the cover portions 1207 of the shielding films 1208 in combination substantially surround the insulated conductor 1206 of conductor sets 1204 in a cover region 1214 of the cable. In pinched regions 1218 of the cable, on both sides of the conductor sets 1204, the shielding films 1208 include pinched portions 1209. In shielded electrical cable 1202, pinched portions 1209 of shielding films 1208 and insulated conductors 1206 can be arranged generally in a single plane when the cable 1202 is in a planar and/or unfolded arrangement. The cover portions 1207 of the shielding films 1208 and/or the pinched regions 1218 of the cable 1202 are configured to electrically isolate the conductor sets 1204 from each other.

As shown in the figure, the cable 1202 can be characterized by a maximum separation, D, between the cover portions 1207 of the shielding films 1208, and a minimum separation, $d_1$, between the pinched portions 1209 of the shielding films 1208. In exemplary embodiments, $d_1/D$ is less than 0.25, or less than 0.1.

An optional adhesive layer may be disposed as shown between the pinched portions 1209 of the shielding films 1208. The adhesive layer may be continuous or discontinuous. In some embodiments, the adhesive layer may extend fully or partially in the cover region 1214 of the cable, e.g., between the cover portions 1207 of the shielding films 1208 and the insulated conductors 1206. The adhesive layer may be disposed on the cover portions 1207 of the shielding films 1208 and may extend fully or partially from the pinched portions 1209 of the shielding films 1208 on one side of a conductor set 1204 to the pinched portions 1209 of the shielding films 1208 on the other side of the conductor set 1204.

The shielding films 1208 can be characterized by a radius of curvature, R, across a width of the cable 1202 and/or by a minimum radius of curvature, $r_1$, in the transition portion 1212 of the shielding film 1208 and/or by a minimum radius of curvature, $r_2$, of the concentric portion 1211 of the shielding film 1208. In the transition regions 1236 of the cable 1202, transition portions 1212 of the shielding films 1202 can be configured to provide a gradual transition between the concentric portions 1211 of the shielding films 1208 and the pinched portions 1209 of the shielding films 1208. The transition portion 1212 of the shielding film 1208 extends from a first transition point 1221, which is the inflection point of the shielding film 1208 and marks the end of the concentric portion 1211, to a second transition point 1222 where the separation between the shielding films exceeds the minimum separation, $d_1$, of the pinched portions 1209 by a predetermined factor.

In some embodiments, the radius of curvature, R, of the shielding film across the width of the cable is at least about 50 micrometers and/or the minimum radius of curvature in the transition portion of the shielding film is at least 50 micrometers.

In some cases, the pinched regions of any of the described shielded cables can be configured to be laterally bent at an angle $\alpha$ of at least 30°, for example. This lateral flexibility of the pinched regions can enable the shielded cable to be folded in any suitable configuration, such as, e.g., a configuration that can be used in a round cable. In some cases, the lateral flexibility of the pinched regions is enabled by shielding films that include two or more relatively thin individual layers. To warrant the integrity of these individual layers in particular under bending conditions, it is preferred that the bonds between them remain intact. The pinched regions may for example have a minimum thickness of less than about 0.13 mm, and the bond strength between individual layers may be at least 17.86 g/mm (1 lbs/inch) after thermal exposures during processing or use.

It may be beneficial to the electrical performance of any of the disclosed shielded electrical cables for the pinched regions of the cable to have approximately the same size and shape on both sides of a given conductor set. Any dimensional changes or imbalances may produce imbalances in capacitance and inductance along the length of the pinched region. This in turn may cause impedance differences along the length of the pinched region and impedance imbalances between adjacent conductor sets. At least for these reasons, control of the spacing between the shielding films may be desired. In some cases, the pinched portions of the shielding films in the pinched regions of the cable (on each side of a conductor set) may be separated from each other by no more than about 0.05 mm.

Figure 12:
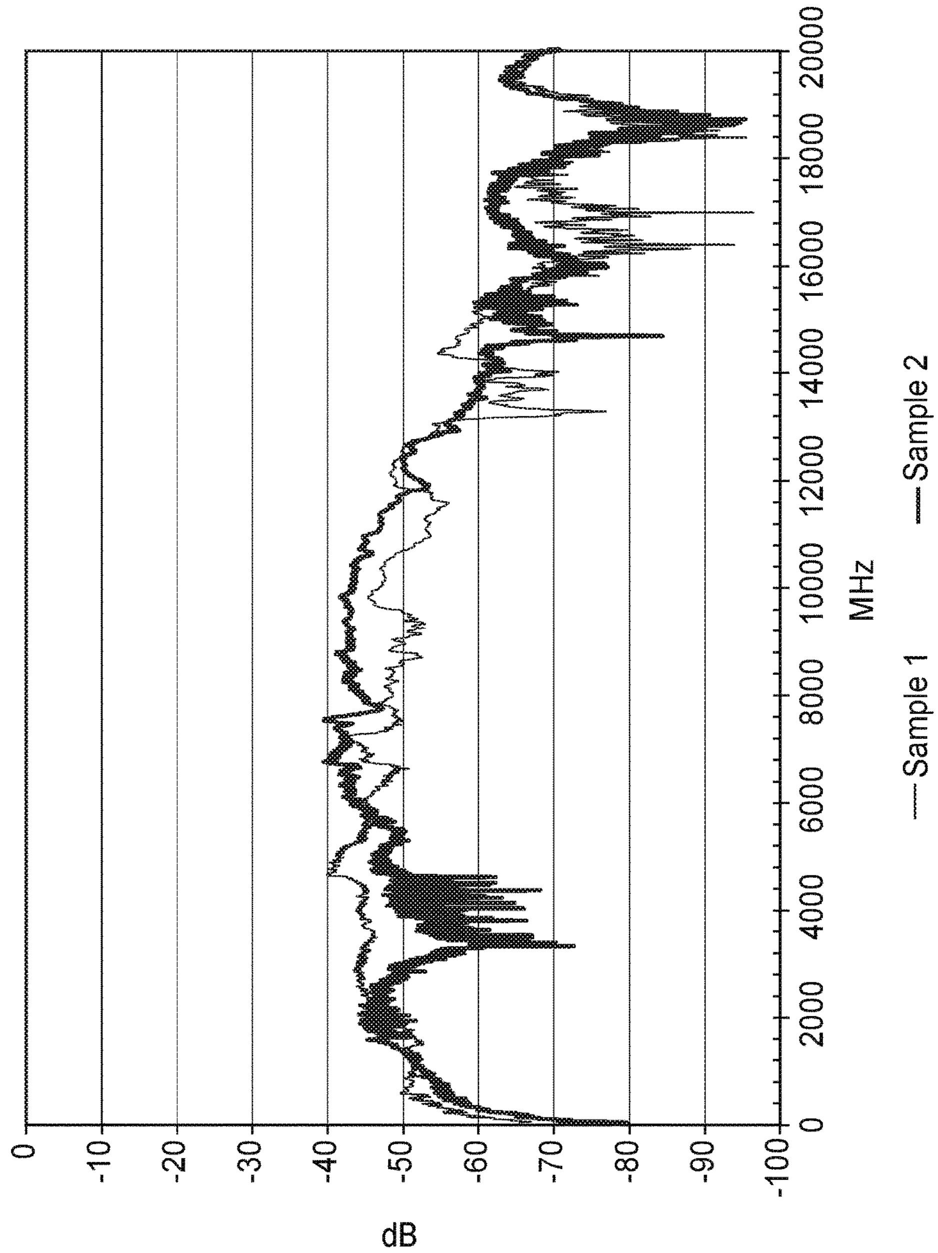
FIG. 12 is a graph comparing the electrical isolation performance of an exemplary shielded electrical cable to that of a conventional electrical cable.

FIG. 12 illustrates the far end crosstalk (FEXT) isolation between two adjacent conductor sets of a conventional electrical cable wherein the conductor sets are completely isolated, i.e., have no common ground (Sample 1), and between two adjacent conductor sets of the shielded electrical cable 1102 illustrated in FIG. 11*a* wherein the shielding films 1108 are spaced apart by about 0.025 mm (Sample 2), both having a cable length of about 3 meters. The test method for creating this data is well known in the art. The data was generated using an Agilent 8720ES 50 MHz-20 GHz S-Parameter Network Analyzer. It can be seen by comparing the far end crosstalk plots that the conventional electrical cable and the shielded electrical cable 1102 provide a similar far end crosstalk performance. Specifically, it is generally accepted that a far end crosstalk of less than about −35 dB is suitable for most applications. It can be easily seen from FIG. 12 that for the configuration tested, both the conventional electrical cable and shielded electrical cable 1102 provide satisfactory electrical isolation performance. The satisfactory electrical isolation performance in combination with the increased strength of the pinched portion due to the ability to space apart the shielding films is an advantage of at least some of the disclosed shielded electrical cables over conventional electrical cables.

Figure 13:
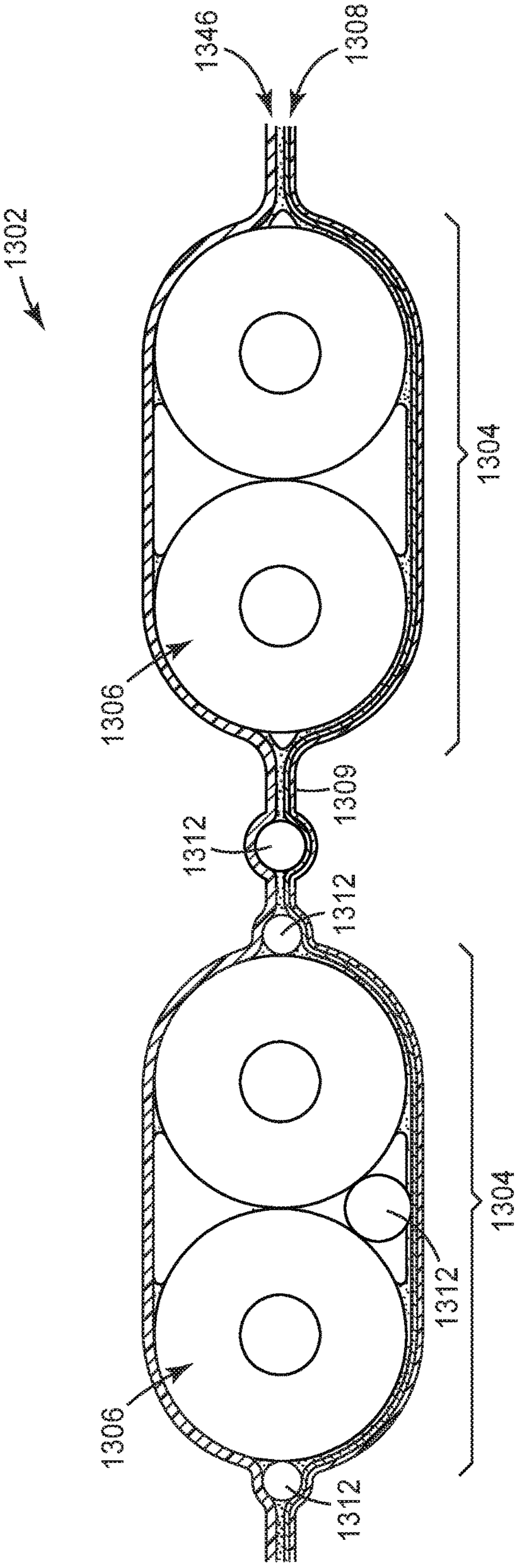
FIG. 13 is a front cross-sectional view of another exemplary shielded electrical cable.

In exemplary embodiments described above, the shielded electrical cable includes two shielding films disposed on opposite sides of the cable such that, in transverse cross section, cover portions of the shielding films in combination substantially surround a given conductor set, and surround each of the spaced apart conductor sets individually. In some embodiments, however, the shielded electrical cable may contain only one shielding film, which is disposed on only one side of the cable. Advantages of including only a single shielding film in the shielded cable, compared to shielded cables having two shielding films, include a decrease in material cost and an increase in mechanical flexibility, manufacturability, and ease of stripping and termination. A single shielding film may provide an acceptable level of electromagnetic interference (EMI) isolation for a given application, and may reduce the proximity effect thereby decreasing signal attenuation. FIG. 13 illustrates one example of such a shielded electrical cable that includes only one shielding film.

FIG. 13 illustrates a shielded electrical cable 1302 having only one shielding film 1308. Insulated conductors 1306 are arranged into two conductor sets 1304, each having only one pair of insulated conductors, although conductor sets having other numbers of insulated conductors as discussed herein are also contemplated. Shielded electrical cable 1302 is shown to include ground conductors 1312 in various exemplary locations, but any or all of them may be omitted if desired, or additional ground conductors can be included. The ground conductors 1312 extend in substantially the same direction as insulated conductors 1306 of conductor sets 1304 and are positioned between shielding film 1308 and a carrier film 1346 which does not function as a shielding film. One ground conductor 1312 is included in a pinched portion 1309 of shielding film 1308, and three ground conductors 1312 are included in one of the conductor sets 1304. One of these three ground conductors 1312 is positioned between insulated conductors 1306 and shielding film 1308, and two of the three ground conductors 1312 are arranged to be generally co-planar with the insulated conductors 1306 of the conductor set.

In addition to signal wires, drain wires, and ground wires, any of the disclosed cables can also include one or more individual wires, which are typically insulated, for any purpose defined by a user. These additional wires, which may for example be adequate for power transmission or low speed communications (e.g. less than 1 or 0.5 Gbps, or less than 1 or 0.5 GHz, or in some cases less than 1 MHz) but not for high speed communications (e.g. greater than 1 Gpbs or 1 GHz), can be referred to collectively as a sideband. Sideband wires may be used to transmit power signals, reference signals or any other signal of interest. The wires in a sideband are typically not in direct or indirect electrical contact with each other, but in at least some cases they may not be shielded from each other. A sideband can include any number of wires such as 2 or more, or 3 or more, or 5 or more.

Further information relating to exemplary shielded electrical cables and other information can be found in U.S. Patent Application Ser. No. 61/378,877, "Connector Arrangements for Shielded Electrical Cable", filed on even date herewith and incorporated herein by reference.

Section 2: High Density Shielded Cables

We now provide further details regarding shielded ribbon cables that can employ high packing density of mutually shielded conductor sets. The design features of the disclosed cables allow them to be manufactured in a format that allows very high density of signal lines in a single ribbon cable. This can enable a high density mating interface and ultra thin connector, and/or can enable crosstalk isolation with standard connector interfaces. In addition, high density cable can reduce the manufacturing cost per signal pair, reduce the bending stiffness of the assembly of pairs (for example, in general, one ribbon of high density bends more easily than two stacked ribbons of lower density), and reduce the total thickness since one ribbon is generally thinner than two stacked ribbons.

One potential application for at least some of the disclosed shielded cables is in high speed (I/O) data transfer between components or devices of a computer system or other electronic system. A protocol known as SAS (Serial Attached SCSI), which is maintained by the International Committee for Information Technology Standards (INCITS), is a computer bus protocol involving the movement of data to and from computer storage devices such as hard drives and tape drives. SAS uses the standard SCSI command set and involves a point-to-point serial protocol. A convention known as mini-SAS has been developed for certain types of connectors within the SAS specification.

Conventional twinaxial (twinax) cable assemblies for internal applications, such as mini-SAS cable assemblies, utilize individual twinax pairs, each pair having its own accompanying drain wire, and in some cases two drain wires. When terminating such a cable, not only must each insulated conductor of each twinax pair be managed, but each drain wire (or both drain wires) for each twinax pair must also be managed. These conventional twinax pairs are typically arranged in a loose bundle that is placed within a loose outer braid that contains the pairs so that they can be routed together. In contrast, the shielded ribbon cables described herein can if desired be used in configurations where, for example, a first four-pair ribbon cable is mated to one major surface of the paddle card (see e.g. FIG. 3*d* above) and a second four-pair ribbon cable, which may be similar or substantially identical in configuration or layout to the first four-pair ribbon cable, is mated to the other major surface at the same end of the paddle card to make a 4x or 4i mini-SAS assembly, having 4 transmit shielded pairs and 4 receive shielded pairs. This configuration is advantageous relative to the construction utilizing the twinax pairs of a conventional cable, in part because fewer than one drain wire per twinax pair can be used, and thus fewer drain wires need to be managed for termination. However, the configuration utilizing the stack of two four-pair ribbon cables retains the limitation that two separate ribbons are needed to provide a 4x/4i assembly, with the concomitant requirement to manage two ribbons, and with the disadvantageous increased stiffness and thickness of two ribbons relative to only one ribbon.

We have found that the disclosed shielded ribbon cables can be made densely enough, i.e., with a small enough wire-to-wire spacing, a small enough conductor set-to-conductor set spacing, and with a small enough number of drain wires and drain wire spacing, and with adequate loss characteristics and crosstalk or shielding characteristics, to allow for a single ribbon cable, or multiple ribbon cables arranged side-by-side rather than in a stacked configuration, to extend along a single plane to mate with a connector. This ribbon cable or cables may contain at least three twinax pairs total, and if multiple cables are used, at least one ribbon may contain at least two twinax pairs. In an exemplary embodiment, a single ribbon cable may be used, and if desired, the signal pairs may be routed to two planes or major surfaces of a connector or other termination component, even though the ribbon cable extends along only one plane. The routing can be achieved in a number of ways, e.g., tips or ends of individual conductors can be bent out of the plane of the ribbon cable to contact one or the other major surface of the termination component, or the termination component may utilize conductive through-holes or vias that connect one conductive pathway portion on one major surface to another conductive pathway portion on the other major surface, for example. Of particular significance to high density cables, the ribbon cable also preferably contains fewer drain wires than conductor sets; in cases where some or all of the conductor sets are twinax pairs, i.e., some or all of the conductor sets each contains only one pair of insulated conductors, the number of drain wires is preferably less than the number of twinax pairs. Reducing the number of drain wires allows the width of the cable to be reduced since drain wires in a given cable are typically spaced apart from each other along the width dimension of the cable. Reducing the number of drain wires also simplifies manufacturing by reducing the number of connections needed between the cable and the termination component, thus also reducing the number of fabrication steps and reducing the time needed for fabrication.

Furthermore, by using fewer drain wires, the drain wire(s) that remain can be positioned farther apart from the nearest signal wire than is normal so as to make the termination process significantly easier with only a slight increase in cable width. For example, a given drain wire may be characterized by a spacing $\sigma 1$ from a center of the drain wire to a center of a nearest insulated wire of a nearest conductor set, and the nearest conductor set may be characterized by a center-to-center spacing of insulated conductors of $\sigma 2$, and $\sigma 1/\sigma 2$ may be greater than 0.7. In contrast, conventional twinax cable has a drain wire spacing of 0.5 times the insulated conductor separation, plus the drain wire diameter.

In exemplary high density embodiments of the disclosed shielded electrical ribbon cables, the center-to-center spacing or pitch between two adjacent twinax pairs (which distance is referred to below in connection with FIG. 16 as $\Sigma$) is at least less than four times, and preferably less than 3 times, the center-to-center spacing between the signal wires within one pair (which distance is referred to below in connection with FIG. 16 as $\sigma$). This relationship, which can be expressed as $\Sigma/\sigma<4$ or $\Sigma/\sigma<3$, can be satisfied both for unjacketed cables designed for internal applications, and jacketed cables designed for external applications. As explained elsewhere herein, we have demonstrated shielded electrical ribbon cables with multiple twinax pairs, and having acceptable loss and shielding (crosstalk) characteristics, in which Σ/σ is in a range from 2.5 to 3.

An alternative way of characterizing the density of a given shielded ribbon cable (regardless of whether any of the conductor sets of the cable have a pair of conductors in a twinax configuration) is by reference to the nearest insulated conductors of two adjacent conductor sets. Thus, when the shielded cable is laid flat, a first insulated conductor of a first conductor set is nearest a second (adjacent) conductor set, and a second insulated conductor of the second conductor set is nearest the first conductor set. The center-to-center separation of the first and second insulated conductors is S. The first insulated conductor has an outer dimension D1, e.g., the diameter of its insulation, and the second insulated conductor has an outer dimension D2, e.g. the diameter if its insulation. In many cases the conductor sets use the same size insulated conductors, in which case D1=D2. In some cases, however, D1 and D2 may be different. A parameter Dmin can be defined as the lesser of D1 and D2. Of course, if D1=D2, then Dmin=D1=D2. Using the design characteristics for shielded electrical ribbon cables discussed herein, we are able to fabricate such cables for which S/Dmin is in a range from 1.7 to 2.

The close packing or high density can be achieved in part by virtue of one or more of the following features of the disclosed cables: the need for a minimum number of drain wires, or, stated differently, the ability to provide adequate shielding for some or all of the connector sets in the cable using fewer than one drain wire per connector set (and in some cases fewer than one drain wire for every two, three, or four or more connector sets, for example, or only one or two drain wires for the entire cable); the high frequency signal isolating structures, e.g., shielding films of suitable geometry, between adjacent conductor sets; the relatively small number and thickness of layers used in the cable construction; and the forming process which ensures proper placement and configuration of the insulated conductors, drain wires, and shielding films, and does so in a way that provides uniformity along the length of the cable. The high density characteristic can advantageously be provided in a cable capable of being mass stripped and mass terminated to a paddle card or other linear array. The mass stripping and termination is facilitated by separating one, some, or all drain wires in the cable from their respective closest signal line, i.e. the closest insulated conductor of the closest conductor set, by a distance greater than one-half the spacing between adjacent insulated conductors in the conductor set, and preferably greater than 0.7 times such spacing.

By electrically connecting the drain wires to the shielding films, and properly forming the shielding films to substantially surround each conductor set, the shield structure alone can provide adequate high frequency crosstalk isolation between adjacent conductor sets, and we can construct shielded ribbon cables with only a minimum number of drain wires. In exemplary embodiments, a given cable may have only two drain wires (one of which may be located at or near each edge of the cable), but only one drain wire is also possible, and more than two drain wires is of course also possible. By using fewer drain wires in the cable construction, fewer termination pads are required on the paddle card or other termination component, and that component can thus be made smaller and/or can support higher signal densities. The cable likewise can be made smaller (narrower) and can have a higher signal density, since fewer drain wires are present to consume less ribbon width. The reduced number of drain wires is a significant factor in allowing the disclosed shielded cables to support higher densities than conventional discrete twinax cables, ribbon cables composed of discrete twinax pairs, and ordinary ribbon cables.

Near-end crosstalk and/or far-end crosstalk can be important measures of signal integrity or shielding in any electrical cable, including the disclosed cables and cable assemblies. Grouping signal lines (e.g. twinax pairs or other conductor sets) closer together in a cable and in a termination area tends to increase undesirable crosstalk, but the cable designs and termination designs disclosed herein can be used to counteract this tendency. The subject of crosstalk in the cable and crosstalk within the connector can be addressed separately, but several of these methods for crosstalk reduction can be used together for enhanced crosstalk reduction. To increase high frequency shielding and reduce crosstalk in the disclosed cables, it is desirable to form as complete a shield surrounding the conductor sets (e.g. twinax pairs) as possible using the two shielding films on opposite sides of the cable. It is thus desirable to form the shielding films such that their cover portions, in combination, substantially surround any given conductor set, e.g., at least 75%, or at least 80, 85, or 90%, of the perimeter of the conductor set. It is also often desirable to minimize (including eliminate) any gaps between the shielding films in the pinched zones of the cable, and/or to use a low impedance or direct electrical contact between the two shielding films such as by direct contact or touching, or electrical contact through one or more drain wires, or using a conductive adhesive between the shielding films. If separate "transmit" and "receive" twinax pairs or conductors are defined or specified for a given cable or system, high frequency shielding may also be enhanced in the cable and/or at the termination component by grouping all such "transmit" conductors physically next to each another, and grouping all such "receive" conductors next to each other but segregated from the transmit pairs, to the extent possible, in the same ribbon cable. The transmit group of conductors may also be separated from the receive group of conductors by one or more drain wires or other isolation structures as described elsewhere herein. In some cases, two separate ribbon cables, one for transmit conductors and one for receive conductors, may be used, but the two (or more) cables are preferably arranged in a side-by-side configuration rather than stacked, so that advantages of a single flexible plane of ribbon cable can be maintained.

The described shielded cables may exhibit a high frequency isolation between adjacent insulated conductors in a given conductor set characterized by a crosstalk C1 at a specified frequency in a range from 3-15 GHz and for a 1 meter cable length, and may exhibit a high frequency isolation between the given conductor set and an adjacent conductor set (separated from the first conductor set by a pinched portion of the cable) characterized by a crosstalk C2 at the specified frequency, and C2 is at least 10 dB lower than C1. Alternatively or in addition, the described shielded cables may satisfy a shielding specification similar to or the same as that used in mini-SAS applications: a signal of a given signal strength is coupled to one of the transmit conductor sets (or one of the receive conductor sets) at one end of the cable, and the cumulative signal strength in all of the receive conductor sets (or in all of the transmit conductor sets), as measured at the same end of the cable, is calculated. The near-end crosstalk, computed as the ratio of the cumulative signal strength to the original signal strength, and expressed in decibels, is preferably less than −26 dB.

If the cable ends are not properly shielded, the crosstalk at the cable end can become significant for a given application. A potential solution with the disclosed cables is to maintain the structure of the shielding films as close as possible to the termination point of the insulated conductors, so as to contain any stray electromagnetic fields within the conductor set. Beyond the cable, design details of the paddle card or other termination component can also be tailored to maintain adequate crosstalk isolation for the system. Strategies include electrically isolating transmit and receive signals from each other to the extent possible, e.g. terminating and routing wires and conductors associated with these two signal types as physically far apart from each other as possible. One option is to terminate such wires and conductors on separate sides (opposed major surfaces) of the paddle card, which can be used to automatically route the signals on different planes or opposite sides of the paddle card. Another option is to terminate such wires and conductors laterally as far apart as possible to laterally separate transmit wires from receive wires. Combinations of these strategies can also be used for further isolation. (Reference in this regard is made to previously cited U.S. Patent Application Ser. No. 61/378,877, "Connector Arrangements for Shielded Electrical Cable", filed on even date herewith and incorporated herein by reference.) These strategies can be used with the disclosed high density ribbon cables in combination with paddle cards of conventional size or reduced size, as well as with a single plane of ribbon cable, both of which may provide significant system advantages.

The reader is reminded that the above discussion relating to paddle card terminations, and discussion elsewhere herein directed to paddle cards, should also be understood as encompassing any other type of termination. For example, stamped metal connectors may include linear arrays of one or two rows of contacts to connect to a ribbon cable. Such rows may be analogous to those of a paddle card, which may also include two linear arrays of contacts. The same staggered, alternating, and segregated termination strategies for the disclosed cables and termination components can be employed.

Loss or attenuation is another important consideration for many electrical cable applications. One typical loss specification for high speed I/O applications is that the cable have a loss of less than −6 dB at, for example, a frequency of 5 GHz. (In this regard, the reader will understand that, for example, a loss of −5 dB is less than a loss of −6 dB.) Such a specification places a limit on attempting to miniaturize a cable simply by using thinner wires for the insulated conductors of the conductor sets and/or for the drain wires. In general, with other factors being equal, as the wires used in a cable are made thinner, cable loss increases. Although plating of wire, e.g., silver plating, tin plating, or gold plating, can have an impact on cable loss, in many cases, wire sizes smaller than about 32 gauge (32 AWG) or slightly smaller, whether of solid core or stranded wire design, may represent a practical lower size limit for signal wires in some high speed I/O applications. However, smaller wire sizes may be feasible in other high speed applications, and advances in technology can also be expected to render smaller wire sizes acceptable.

Figure 14:
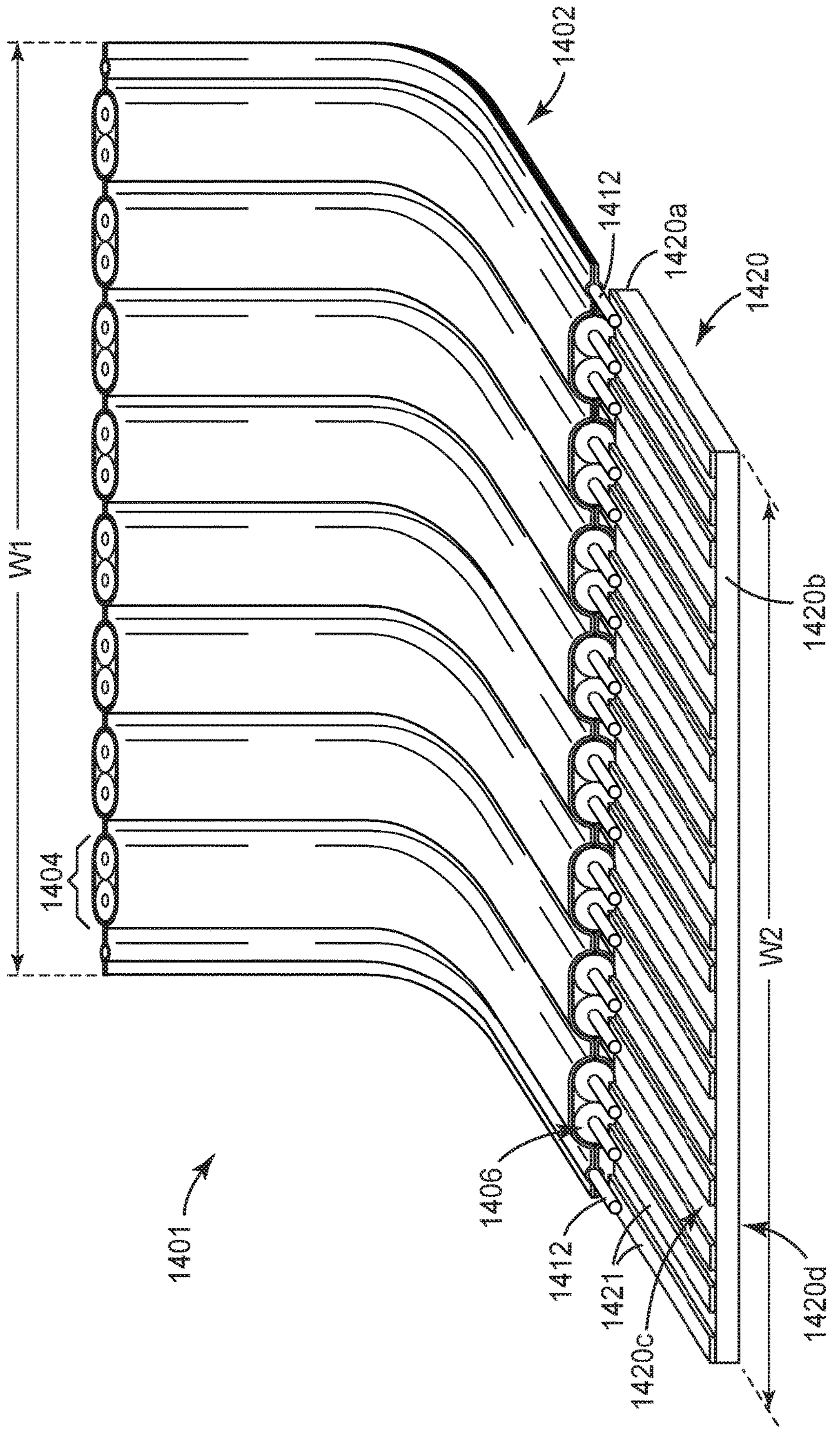
FIG. 14 is a perspective view of a shielded electrical cable assembly that may utilize high packing density of the conductor sets.

Turning now to FIG. 14, we see there a cable system 1401 which includes a shielded electrical ribbon cable 1402 in combination with a termination component 1420 such as a paddle card or the like. The cable 1402, which may have any of the design features and characteristics shown and described elsewhere herein, is shown to have eight conductor sets 1404 and two drain wires 1412, each of which is disposed at or near a respective edge of the cable. Each conductor set is substantially a twinax pair, i.e., each includes only two insulated conductors 1406, each conductor set preferably being tailored to transmit and/or receive high speed data signals. Of course, other numbers of conductor sets, other numbers of insulated conductors within a given conductor set, and other numbers of drain wires (if any) can in general be used for the cable 1402. Eight twinax pairs are however of some significance due to the existing prevalence of paddle cards designed for use with four "lanes" or "channels", each lane or channel having exactly one transmit pair and exactly one receive pair. The generally flat or planar design of the cable, and its design characteristics, allow it to be readily bent or otherwise manipulated as shown while maintaining good high frequency shielding of the conductor sets and acceptable losses. The number of drain wires (2) is substantially less than the number of conductor sets (8), allowing the cable 1402 to have a substantially reduced width w1. Such a reduced width may be realized even in cases where the drain wires 1412 are spaced relative to the nearest signal wire (nearest insulated conductor 1406) by at least 0.7 times the spacing of signal wires in the nearest conductor set, since only two drain wires (in this embodiment) are involved.

The termination component 1420 has a first end 1420*a* and an opposed second end 1420*b*, and a first major surface 1420*c* and an opposed second major surface 1420*d*. Conductive paths 1421 are provided, e.g. by printing or other conventional deposition process(es) and/or etching process (es), on at least the first major surface 1420*c* of the component 1420. In this regard, the conductive paths are disposed on a suitable electrically insulating substrate, which is typically stiff or rigid but may in some cases be flexible. Each conductive path typically extends from the first end 1420*a* to the second end 1420*b* of the component. In the depicted embodiment, the individual wires and conductors of the cable 1402 are electrically connected to respective ones of the conductive paths 1421.

For simplicity, each path is shown to be straight, extending from one end of the component 1420 or substrate to the other on the same major surface of the component. In some cases, one or more of the conductive paths may extend through a hole or "via" in the substrate so that, for example, one portion and one end of the path resides on one major surface, and another portion and the other end of the path resides on the opposed major surface of the substrate. Also, in some cases, some of the wires and conductors of the cable can attach to conductive paths (e.g. contact pads) on one major surface of the substrate, while others of the wires and conductors can attach to conductive paths (e.g. contact pads) on the opposite major surface of the substrate but at the same end of the component. This may be accomplished by e.g. slightly bending the ends of the wires and conductors upward towards one major surface, or downward towards the other major surface. In some cases, all of the conductive paths corresponding to the signal wires and/or drain wires of the shielded cable may be disposed on one major surface of the substrate. In some cases, at least one of the conductive paths may be disposed on one major surface of the substrate, and at least another of the conductive paths may be disposed on an opposed major surface of the substrate. In some cases, at least one of the conductive paths may have a first portion on a first major surface of the substrate at the first end, and a second portion on an opposed second major surface of the substrate at the second end. In some cases, alternating conductor sets of the shielded cable may attach to conductive paths on opposite major surfaces of the substrate.

The termination component 1420 or substrate thereof has a width w2. In exemplary embodiments, the width w1 of the cable is not significantly larger than the width w2 of the component so that, for example, the cable need not be folded over or bunched together at its end in order to make the necessary connections between the wires of the cable and the conductive paths of the component. In some cases w1 may be slightly greater than w2, but still small enough so that the ends of the conductor sets may be bent in the plane of the cable in a funnel-type fashion in order to connect to the associated conductor paths, while still preserving the generally planar configuration of the cable at and near the connection point. In some cases, w1 may be equal to or less than w2. Conventional four channel paddle cards currently have a width of 15.6 millimeters, hence, it is desirable in at least some applications for the shielded cable to have a width of about 16 mm or less, or about 15 mm or less.

Figure 15:
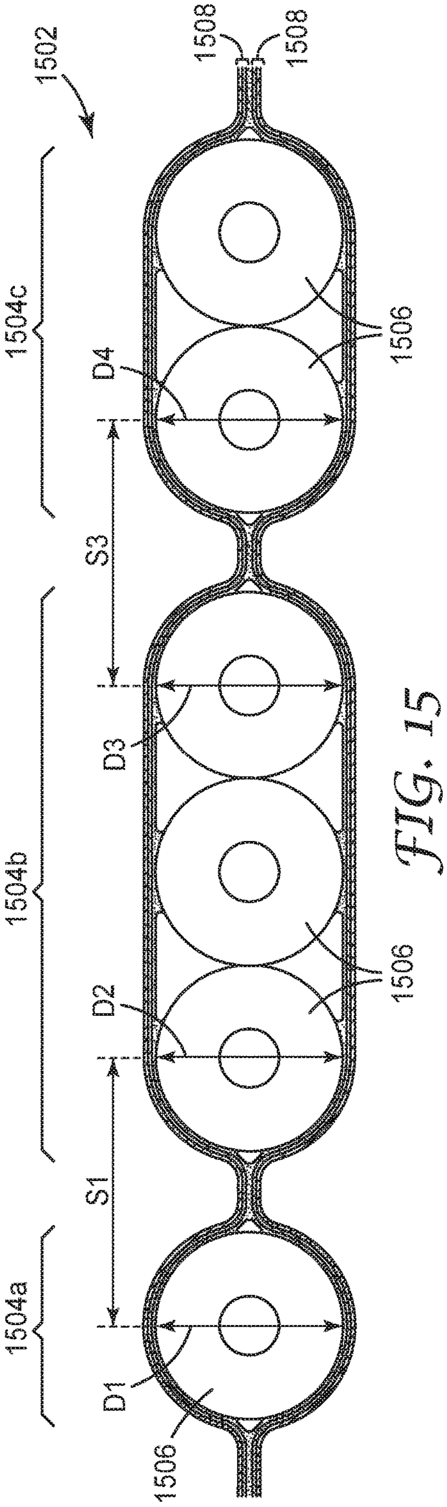
FIGS. 15 and 16 are front cross-sectional views of exemplary shielded electrical cables, which figures also depict parameters useful in characterizing the density of the conductor sets.
Figure 16:
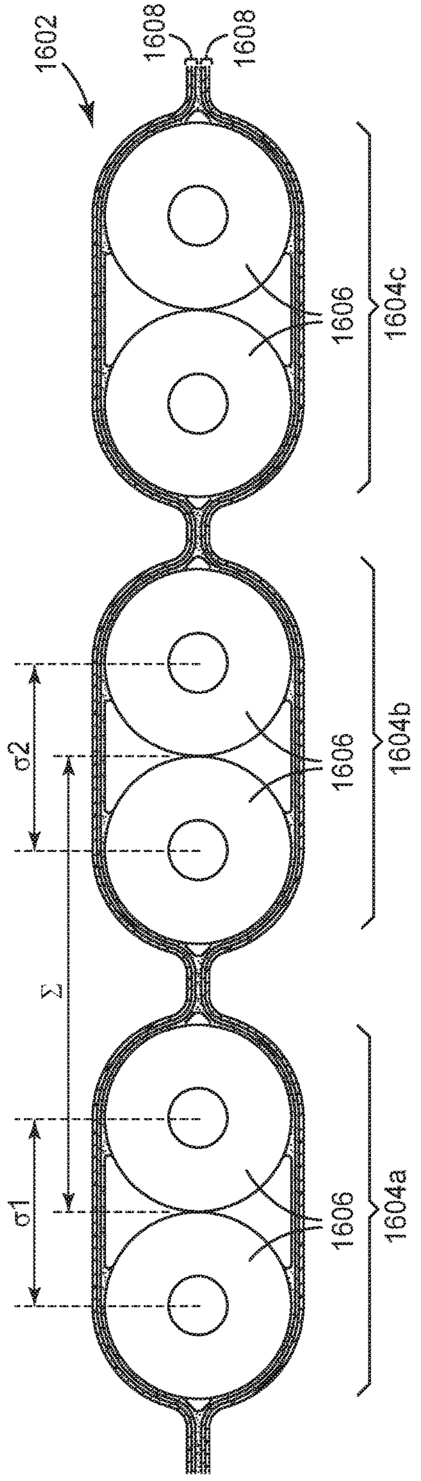

FIGS. 15 and 16 are front cross-sectional views of exemplary shielded electrical cables, which figures also depict parameters useful in characterizing the density of the conductor sets. Shielded cable 1502 includes at least three conductor sets 1504*a*, 1504*b*, and 1504*c*, which are shielded from each other by virtue of first and second shielding films 1508 on opposite sides of the cable, with their respective cover portions, pinched portions, and transition portions suitably formed. Shielded cable 1602 likewise includes at least three conductor sets 1604*a*, 1604*b*, and 1604*c*, which are shielded from each other by virtue of first and second shielding films 1608. The conductor sets of cable 1502 contain different numbers of insulated conductors 1506, with conductor set 1504*a* having one, conductor set 1504*b* having three, and conductor set 1504*c* having two (for a twinax design). Conductor sets 1604*a*, 1604*b*, 1604*c* are all of twinax design, having exactly two of the insulated conductors 1606. Although not shown in FIGS. 15 and 16, each cable 1502, 1602 preferably also includes at least one and optionally two (or more) drain wires, preferably sandwiched between the shielding films at or near the edge(s) of the cable such as shown in FIG. 1 or FIG. 14.

In FIG. 15 we see some dimensions identified that relate to the nearest insulated conductors of two adjacent conductor sets. Conductor set 1504*a* is adjacent conductor set 1504*b*. The insulated conductor 1506 of set 1504*a* is nearest the set 1504*b*, and the left-most (from the perspective of the drawing) insulated conductor 1506 of set 1504*b* is nearest the set 1504*a*. The insulated conductor of set 1504*a* has an outer dimension D1, and the left-most insulated conductor of set 1504*b* has an outer dimension D2. The center-to-center separation of these insulated conductors is S1. If we define a parameter Dmin as the lesser of D1 and D2, then we may specify for a densely packed shielded cable that S1/Dmin is in a range from 1.7 to 2.

We also see in FIG. 15 that conductor set 1504*b* is adjacent conductor set 1504*c*. The right-most insulated conductor 1506 of set 1504*b* is nearest the set 1504*c*, and the left-most insulated conductor 1506 of set 1504*c* is nearest the set 1504*b*. The right-most insulated conductor 1506 of set 1504*b* has an outer dimension D3, and the left-most insulated conductor 1506 of set 1504*c* has an outer dimension D4. The center-to-center separation of these insulated conductors is S3. If we define a parameter Dmin as the lesser of D3 and D4, then we may specify for a densely packed shielded cable that S3/Dmin is in a range from 1.7 to 2.

In FIG. 16 we see some dimensions identified that relate to cables having at least one set of adjacent twinax pairs. Conductor sets 1604*a*, 1604*b* represent one such set of adjacent twinax pairs. The center-to-center spacing or pitch between these two conductor sets is expressed as Σ. The center-to-center spacing between signal wires within the twinax conductor set 1604*a* is expressed as σ1. The center-to-center spacing between signal wires within the twinax conductor set 1604*b* is expressed as σ2. For a densely packed shielded cable, we may specify that one or both of Σ/σ1 and Σ/σ2 is less than 4, or less than 3, or in a range from 2.5 to 3.

Figure 17A:
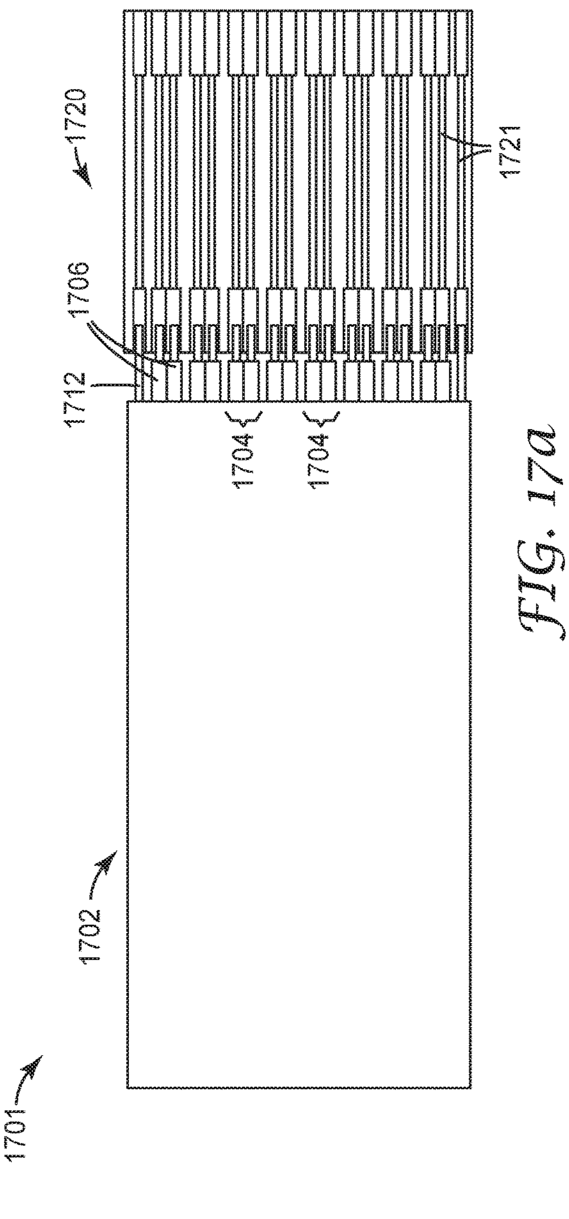
FIG. 17*a* is a top view of an exemplary shielded electrical cable assembly in which a shielded cable is attached to a termination component.
Figure 17B:
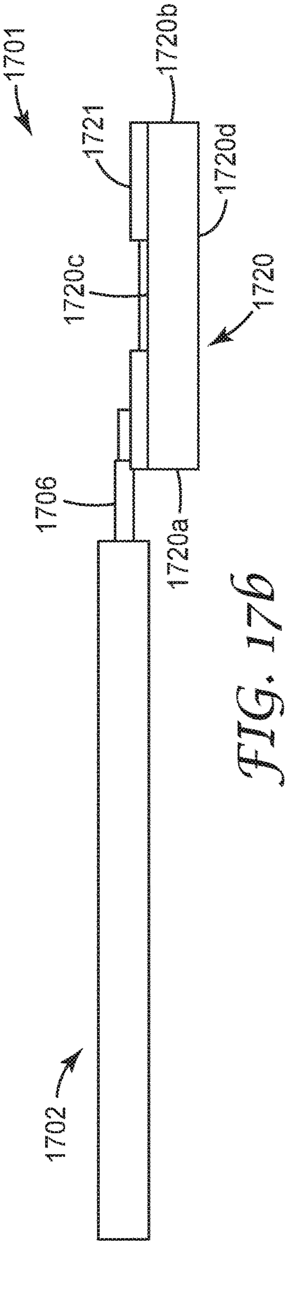
FIG. 17*b* is a side view thereof.

In FIGS. 17*a* and 17*b*, we see a top view and side view respectively of a cable system 1701 which includes a shielded electrical ribbon cable 1702 in combination with a termination component 1720 such as a paddle card or the like. The cable 1702, which may have any of the design features and characteristics shown and described elsewhere herein, is shown to have eight conductor sets 1704 and two drain wires 1712, each of which is disposed at or near a respective edge of the cable. Each conductor set is substantially a twinax pair, i.e., each includes only two insulated conductors 1706, each conductor set preferably being tailored to transmit and/or receive high speed data signals. Just as in FIG. 14, the number of drain wires (2) is substantially less than the number of conductor sets (8), allowing the cable 1702 to have a substantially reduced width relative to a cable having one or two drain wires per conductor set, for example. Such a reduced width may be realized even in cases where the drain wires 1712 are spaced relative to the nearest signal wire (nearest insulated conductor 1706) by at least 0.7 times the spacing of signal wires in the nearest conductor set, since only two drain wires (in this embodiment) are involved.

The termination component 1720 has a first end 1720*a* and an opposed second end 1720*b*, and includes a suitable substrate having a first major surface 1720*c* and an opposed second major surface 1720*d*. Conductive paths 1721 are provided on at least the first major surface 1720*c* of the substrate. Each conductive path typically extends from the first end 1720*a* to the second end 1720*b* of the component. The conductive paths are shown to include contact pads at both ends of the component, in the figure the individual wires and conductors of the cable 1702 are shown as being electrically connected to respective ones of the conductive paths 1721 at the corresponding contact pad. Note that the variations discussed elsewhere herein regarding placement, configuration, and arrangement of the conductive paths on the substrate, and placement, configuration, and arrangement of the various wires and conductors of the cable and their attached to one or both of the major surfaces of the termination component, are also intended to apply to the system 1701.

Example

A shielded electrical ribbon cable having the general layout of cable 1402 (see FIG. 14) was fabricated. The cable utilized sixteen insulated 32 gauge (AWG) wires arranged into eight twinax pairs for signal wires, and two non-insulated 32 (AWG) wires arranged along the edges of the cable for drain wires. Each of the sixteen signal wires used had a solid copper core with silver plating. The two drain wires each had a stranded construction (7 strands each) and were tin-plated. The insulation of the insulated wires had a nominal outer diameter of 0.025 inches. The sixteen insulated and two non-insulated wires were fed into a device similar to that shown in FIG. 5*c*, sandwiched between two shielding films. The shielding films were substantially identical, and had the following construction: a base layer of polyester (0.00048 inches thick), on which a continuous layer of aluminum (0.00028 inches thick) was disposed, on which a continuous layer of electrically non-conductive adhesive (0.001 inches thick) was disposed. The shielding films were oriented such that the metal coatings of the films faced each other and faced the conductor sets. The process temperature was about 270 degrees F. The resulting cable made by this process was photographed and is shown in top view in FIG. 18*a*, and an oblique view of the end of the cable is shown in FIG. 18*b*. In the figures, 1804 refers to the twinax conductor sets, and 1812 refers to the drain wires.

The resulting cable was non-ideal due to lack of concentricity of the solid core in the insulated conductor used for the signal wires. Nevertheless, certain parameters and characteristics of the cable could be measured, taking into account (correcting for) the non-concentricity issue. For example, the dimensions D, d1, d2 (see FIG. 2*c*) were about 0.028 inches, 0.0015 inches, and 0.028 inches, respectively. No portion of either one of the shielding films had a radius of curvature at any point along the width of the cable of less than 50 microns, in transverse cross section. The center-to-center spacing from a given drain wire to the nearest insulated wire of the nearest twinax conductor set was about 0.83 mm, and the center-to-center spacing of the insulated wires within each conductor set (see e.g. parameters σ1 and σ2 in FIG. 16) was about 0.025 inches (0.64 mm). The center-to-center spacing of adjacent twinax conductor sets (see e.g. the parameter Σ in FIG. 16) was about 0.0715 inches (1.8 mm). The spacing parameter S (see S1 and S3 in FIG. 15) was about 0.0465 inches. The width of the cable, measured from edge to edge, was about 16 to 17 millimeters, and the spacing between the drain wires was 15 millimeters. The cable was readily capable of mass termination, including the drain wires.

From these values we see that: the spacing from the drain wire to the nearest signal wire was about 1.3 times the wire-to-wire spacing within each twinax pair, thus, greater than 0.7 times the wire-to-wire spacing; the cable density parameter Σ/σ was about 2.86, i.e., in the range from 2.5 to 3; the other cable density parameter S/Dmin was about 1.7, i.e., in the range from 1.7 to 2; the ratio $d_1/D$ (minimum separation of the pinched portions of the shielding films divided by the maximum separation between the cover portions of the shielding films) was about 0.05, i.e., less than 0.25 and also less than 0.1; the ratio $d_2/D$ (minimum separation between the cover portions of the shielding films in a region between insulated conductors divided by the maximum separation between the cover portions of the shielding films) was about 1, i.e., greater than 0.33.

Note also that the width of the cable (i.e., about 16 mm edge-to-edge, and 15.0 mm from drain wire to drain wire) was less than the width of a conventional mini-SAS internal cable outer molding termination (typically 17.1 mm), and about the same as the typical width of a mini-SAS paddle card (15.6 mm). A smaller width than the paddle card allows simple one-to-one routing from the cable to the paddle card with no lateral adjustment of the wire ends needed. Even if the cable were slightly wider than the termination board or housing, the outer wire could be routed or bent laterally to meet the pads on the outside edges of the board. Physically this cable can provide a double density versus other ribbon cables, can be half as thick in an assembly (since one less ribbon is needed), and can allow for a thinner connector than other common cables. The cable ends can be terminated and manipulated in any suitable fashion to connect with a termination component as discussed elsewhere herein.

Section 3: Shielded Cables with on-Demand Drain Wire Feature

We now provide further details regarding shielded ribbon cables that can employ an on-demand drain wire feature.

In many of the disclosed shielded electrical cables, a drain wire that makes direct or indirect electrical contact with one or both of the shielding films makes such electrical contact over substantially the entire length of the cable. The drain wire may then be tied to an external ground connection at a termination location to provide a ground reference to the shield so as to reduce (or "drain") any stray signals that can produce crosstalk and reduce electromagnetic interference (EMI). In this section of the detailed description, we more fully describe constructions and methods that provide electrical contact between a given drain wire and a given shielding film at one or more isolated areas of the cable, rather than along the entire cable length. We sometimes refer to the constructions and methods characterized by the electrical contact at the isolated area(s) as the on-demand technique.

This on-demand technique may utilize the shielded cables described elsewhere herein, wherein the cable is made to include at least one drain wire that has a high DC electrical resistance between the drain wire and at least one shielding film over all of, or at least over a substantial portion of, the length of the drain wire. Such a cable may be referred to, for purposes of describing the on-demand technique, as an untreated cable. The untreated cable can then be treated in at least one specific localized region in order to substantially reduce the DC resistance and provide electrical contact (whether direct or indirect) between the drain wire and the shielding film(s) in the localized region. The DC resistance in the localized region may for example be less than 10 ohms, or less than 2 ohms, or substantially zero ohms.

The untreated cable may include at least one drain wire, at least one shielding film, and at least one conductor set that includes at least one insulated conductor suitable for carrying high speed signals. FIG. 19 is a front cross-sectional view of an exemplary shielded electrical cable 1902 which may serve as an untreated cable, although virtually any other shielded cable shown or described herein can also be used. The cable 1902 includes three conductor sets 1904*a*, 1904*b*, 1904*c*, which each include one or more insulated conductors, the cable also having six drain wires 1912*a-f* which are shown in a variety of positions for demonstration purposes. The cable 1902 also includes two shielding films 1908 disposed on opposite sides of the cable and preferably having respective cover portions, pinched portions, and transition portions. Initially, a non-conductive adhesive material or other compliant non-conductive material separates each drain wire from one or both shielding films. The drain wire, the shielding film(s), and the non-conductive material therebetween are configured so that the shielding film can be made to make direct or indirect electrical contact with the drain wire on demand in a localized or treated region. Thereafter, a suitable treatment process is used to accomplish this selective electrical contact between any of the depicted drain wires 1912*a-f* and the shielding films 1908.

FIGS. 20*a*, 20*b*, and 21 are front cross-sectional views of shielded cables or portions thereof that demonstrate at least some such treatment processes. In FIG. 20*a*, a portion of a shielded electrical cable 2002 includes opposed shielding films 2008, each of which may include a conductive layer 2008*a* and a non-conductive layer 2008*b*. The shielding films are oriented so that the conductive layer of each shielding film faces a drain wire 2012 and the other shielding film. In an alternative embodiment, the non-conductive layer of one or both shielding films may be omitted. Significantly, the cable 2002 includes a non-conductive material (e.g. a dielectric material) 2010 between the shielding films 2008 and that separates the drain wire 2012 from each of the shielding films 2008. In some cases, the material 2010 may be or comprise a non-conductive compliant adhesive material. In some cases, the material 2010 may be or comprise a thermoplastic dielectric material such as polyolefin at a thickness of less than 0.02 mm, or some other suitable thickness. In some cases, the material 2010 may be in the form of a thin layer that covers one or both shielding films prior to cable manufacture. In some cases, the material 2010 may be in the form of a thin insulation layer that covers the drain wire prior to cable manufacture (and in the untreated cable), in which case such material may not extend into the pinched regions of the cable unlike the embodiment shown in FIGS. 20*a* and 20*b*.

To make a localized connection, compressive force and/or heat may be applied within a limited area or zone to force the shielding films 2008 into permanent electrical contact with the drain wire 2012 by effectively forcing the material 2010 out of the way. The electrical contact may be direct or indirect, and may be characterized by a DC resistance in the localized treated region of less than 10 ohms, or less than 2 ohms, or substantially zero ohms. (Untreated portions of the drain wire 2012 continue to be physically separated from the shielding film and would be characterized by a high DC resistance (e.g. >100 ohms), except of course for the fact that the untreated portions of the drain wire electrically connect to the shielding film through the treated portion(s) of the drain wire.) The treatment procedure can be repeated at different isolated areas of the cable in subsequent steps, and/or can be performed at multiple isolated areas of the cable in any given single step. The shielded cable also preferably contains at least one group of one ore more insulated signal wires for high speed data communication. In FIG. 21, for example, shielded cable 2102 has a plurality of twinax conductor sets 2104 with shielding provided by shielding films 2108. The cable 2102 includes drain wires 2112, two of which (2112*a*, 2112*b*) are shown as being treated in a single step, for example with pressure, heat, radiation, and/or any other suitable agent, using treating components 2130. The treating components preferably have a length (a dimension along an axis perpendicular to the plane of the drawing) which is small compared to the length of the cable 2102 such that the treated region is similarly small compared to the length of the cable. The treatment process for on-demand drain wire contact can be performed (a) during cable manufacture, (b) after the cable is cut to length for termination process, (c) during the termination process (even simultaneously when the cable is terminated), (d) after the cable has been made into an cable assembly (e.g. by attachment of termination components to both ends of the cable), or (e) any combination of (a) through (d).

The treatment to provide localized electrical contact between the drain wire and one or both shielding films may in some cases utilize compression. The treatment may be carried out at room temperature with high local force that severely deforms the materials and causes contact, or at elevated temperatures at which, for example, a thermoplastic material as discussed above may flow more readily. Treatment may also include delivering ultrasonic energy to the area in order to make the contact. Also, the treatment process may be aided by the use of conductive particles in a dielectric material separating the shielding film and drain wire, and/or with asperities provided on the drain wire and/or shielding film.

FIGS. 22*a* and 22*b* are top views of a shielded electrical cable assembly 2201, showing alternative configurations in which one may choose to provide on-demand contact between drain wires and shielding film(s). In both figures, a shielded electrical ribbon cable 2202 is connected at both ends thereof to termination components 2220, 2222. The termination components each comprise a substrate with individual conductive paths provided thereon for electrical connection to the respective wires and conductors of the cable 2202. The cable 2202 includes several conductor sets of insulated conductors, such as twinax conductor sets adapted for high speed data communication. The cable 2202 also includes two drain wires 2212*a*, 2212*b*. The drain wires have ends that connect to respective conductive paths of each termination component. The drain wires are also positioned near (e.g. covered by) at least one shielding film of the cable, and preferably are positioned between two such films as shown for example in the cross-sectional views of FIGS. 19 and 20*a*. Except for localized treated areas or zones that will be described below, the drain wires 2212*a*, 2212*b* do not make electrical contact with the shielding film(s) at any point along the length of the cable, and this may be accomplished by any suitable means e.g. by employing any of the electrical isolation techniques described elsewhere herein. A DC resistance between the drain wires and the shielding film(s) in the untreated areas may, for example, be greater than 100 ohms. However, the cable is preferably treated at selected zones or areas as described above to provide electrical contact between a given drain wire and a given shielding film(s). In FIG. 22*a*, the cable 2202 has been treated in localized area 2213*a* to provide electrical contact between drain wire 2212*a* and the shielding film(s), and it has also been treated in localized areas 2213*b*, 2213*c* to provide electrical contact between drain wire 2212*b* and the shielding film(s). In FIG. 22*b*, the cable 2202 is shown as being treated in the same localized areas 2213*a* and 2213*b*, but also in different localized areas 2213*d*, 2213*e*.

Note that in some cases multiple treated areas can be used for a single drain wire for redundancy or for other purposes. In other cases, only a single treated area may be used for a given drain wire. In some cases, a first treated area for a first drain wire may be disposed at a same lengthwise position as a second treated area for a second drain wire—see e.g. areas 2213*a*, 2213*b* of FIGS. 22*a*, 22*b*, and see also the procedure shown in FIG. 21. In some cases, a treated area for one drain wire may be disposed at a different lengthwise position than a treated area for another drain wire—see e.g. areas 2231*a* and 2213*c* of FIG. 22*a*, or areas 2213*d* and 2213*e* of FIG. 22*b*. In some cases, a treated area for one drain wire may be disposed at a lengthwise position of the cable at which another drain wire lacks any localized electrical contact with the shielding film(s)—see e.g. area 2213*c* of FIG. 22*a*, or area 2213*d* or area 2213*e* of FIG. 22*b*.

FIG. 23 is a top view of another shielded electrical cable assembly 2301, showing another configuration in which one may choose to provide on-demand contact between drain wires and shielding film(s). In assembly 2301, a shielded electrical ribbon cable 2302 is connected at both ends thereof to termination components 2320, 2322. The termination components each comprise a substrate with individual conductive paths provided thereon for electrical connection to the respective wires and conductors of the cable 2302. The cable 2302 includes several conductor sets of insulated conductors, such as twinax conductor sets adapted for high speed data communication. The cable 2302 also includes several drain wires 2312*a-d*. The drain wires have ends that connect to respective conductive paths of each termination component. The drain wires are also positioned near (e.g. covered by) at least one shielding film of the cable, and preferably are positioned between two such films as shown for example in the cross-sectional views of FIGS. 19 and 20*a*. Except for localized treated areas or zones that will be described below, at least the drain wires 2312*a*, 2312*d* do not make electrical contact with the shielding film(s) at any point along the length of the cable, and this may be accomplished by any suitable means e.g. by employing any of the electrical isolation techniques described elsewhere herein. A DC resistance between these drain wires and the shielding film(s) in the untreated areas may, for example, be greater than 100 ohms. However, the cable is preferably treated at selected zones or areas as described above to provide electrical contact between these drain wires and a given shielding film(s). In the figure, the cable 2302 is shown to be treated in localized area 2313*a* to provide electrical contact between drain wire 2312*a* and the shielding film(s), and is also shown to be treated in localized areas 2313*b*, 2313*c* to provide electrical contact between drain wire 2312*d* and the shielding film(s). One or both of the drain wires 2313*b*, 2312*c* may be of the type that are suitable for localized treatment, or one or both may be made in a more standard manner in which they make electrical contact with the shielding film(s) along substantially their entire length during cable manufacture.

Examples

Two examples are presented in this section. First, two substantially identical untreated shielded electrical ribbon cables were made with the same number and configuration of conductor sets and drain wires as the shielded cable shown in FIG. 21. Each cable was made using two opposed shielding films having the same construction: a base layer of polyester (0.00048 inches thick), on which a continuous layer of aluminum (0.00028 inches thick) was disposed, on which a continuous layer of electrically non-conductive adhesive (0.001 inch thick) was disposed. The eight insulated conductors used in each cable to make the four twinax conductor sets were 30 gauge (AWG), solid core, silver plated copper wire. The eight drain wires used for each cable were 32 gauge (AWG), tin-plated, 7-stranded wires. The settings used for the manufacturing process were adjusted so that a thin layer (less than 10 micrometers) of the adhesive material (a polyolefin) remained between each drain wire and each shielding film to prevent electrical contact therebetween in the untreated cables. The two untreated cables were each cut to a length of about 1 meter, and were mass stripped at one end.

A first one of these untreated cables was initially tested to determine if any of the drain wires were in electrical contact with either of the shielding films. This was done by connecting a micro-ohmmeter at the stripped end of the cable to all 28 possible combinations of two drain wires. These measurements yielded no measurable DC resistance for any of the combinations—i.e., all combinations produced DC resistances well over 100 ohms. Then, two adjacent drain wires, as depicted in FIG. 21, were treated in one step to provide localized areas of contact between those drain wires and the two shielding films. Another two adjacent drain wires, e.g., the two adjacent wires labeled 2112 at the left side of FIG. 21, were also treated in the same way in a second step. Each treatment was accomplished by compressing a portion of the cable with a tool that was about 0.25 inches long and 0.05 inches wide, the tool width covering two adjacent drain wires at one lengthwise position of the cable. Each treated portion was about 3 cm from one end of the cable. In this first example, the tool temperature was 220 degrees C., and a force of about 75-150 pounds was applied for 10 seconds for each treatment. The tool was then removed and the cable allowed to cool. The micro-ohmmeter was then connected at the end of the cable opposite the treated end, and all 28 possible combinations of two drain wires were again tested. The DC resistance of one pair (two of the treated drain wires) was measured as 1.1 ohms, and the DC resistance of all other combinations of two drain wires (measured at the end of the cable opposite the treated end) was not measureable, i.e., was well over 100 ohms.

The second one of the untreated cables was also initially tested to determine if any of the drain wires were in electrical contact with either of the shielding films. This was again done by connecting a micro-ohmmeter at the stripped end of the cable to all 28 possible combinations of two drain wires, and the measurements again yielded no measurable DC resistance for any of the combinations—i.e., all combinations produced DC resistances well over 100 ohms. Then, two adjacent drain wires, as depicted in FIG. 21, were treated in a first step to provide localized areas of contact between those drain wires and the two shielding films. This treatment was done with the same tool as in example 1, and the treated portion was about 3 cm from a first end of the cable. In a second treatment step, the same two drain wires were treated under the same conditions as the first step, but at a position 3 cm from a second end of the cable opposite the first end. In a third step, another two adjacent drain wires, e.g., the two adjacent wires labeled 2112 at the left side of FIG. 21, were treated in the same way as the first step, again 3 cm from the first end of the cable. In a fourth treatment step, the same two drain wires treated in step 3 were treated under the same conditions, but at a treatment location 3 cm from the second end of the cable. In this second example, the tool temperature was 210 degrees C., and a force of about 75-150 pounds was applied for 10 seconds for each treatment step. The tool was then removed and the cable allowed to cool. The micro-ohmmeter was then connected at one end of the cable, and all 28 possible combinations of two drain wires were attain tested. An average DC resistance of 0.6 ohms was measured for five of the combinations (all five of these combinations involving the four drain wires having treated areas), and a DC resistance of 21.5 ohms was measured as for the remaining combination involving the four drain wires having treated areas. The DC resistance of all other combinations of two drain wires was not measureable, i.e., was well over 100 ohms.

FIG. 24*a* is a photograph of one of the shielded electrical cables that was fabricated and treated for these examples. Four localized treated areas can be seen. FIG. 24*b* is an enlarged detail of a portion of FIG. 24*a*, showing two of the localized treated areas. FIG. 24*c* is a schematic representation of a front elevational view of the front cross-sectional layout of the cable of FIG. 24*a*.

Section 4: Shielded Cables with Multiple Drain Wires

We now provide further details regarding shielded ribbon cables that can employ multiple drain wires, and unique combinations of such cables with one or more termination components at one or two ends of the cable.

Conventional coaxial or twinax cable uses multiple independent groups of wires, each with their own drain wires to make ground connection between the cable and the termination point. An advantageous aspect of the shielded cables described herein is that they can include drain wires in multiple locations throughout the structure, as was shown e.g. in FIG. 19. Any given drain wire can be directly (DC) connected to the shield structure, AC connected to the shield (low impedance AC connection), or can be poorly or not connected at all to the shield (high AC impedance). Because the drain wires are elongated conductors, they can extend beyond the shielded cable and make connection to the ground termination of a mating connector. An advantage of the disclosed cables is that in general fewer drain wires can be used in some applications since the electrical shields provided by the shielding films are common for the entire cable structure.

We have found that one can use the disclosed shielded cables to advantageously provide a variety of different drain wire configurations that can interconnect electrically through the conductive shield of the shielded ribbon cable. Stated simply, any of the disclosed shielded cables may include at least a first and second drain wire. The first and second drain wires may extend along the length of the cable, and may be electrically connected to each other at least as a result of both of them being in electrical contact with a first shielding film. This cable may be combined with one or more first termination components at a first end of the cable and one or more second termination components at a second end of the cable. In some cases, the first drain wire may electrically connect to the one or more first termination components but may not electrically connect to the one or more second termination components. In some cases, the second drain wire may electrically connect to the one or more second termination components but may not electrically connect to the one or more first termination components.

The first and second drain wires may be members of a plurality of drain wires extending along the length of the cable, and a number n1 of the drain wires may connect to the one or more first termination components, and a number n2 of the drain wires may connect to the one or more second termination components. The number n1 may not be equal to n2. Furthermore, the one or more first termination components may collectively have a number m1 of first termination components, and the one or more second termination components may collectively have a number m2 of second termination components. In some cases, n2>n1, and m2>m1. In some cases, m1=1. In some cases, m1=m2. In some cases, m1<m2. In some cases, m1>1 and m2>1.

Arrangements such as these provides the ability to connect one drain wire to an external connection and have one or more other drain wires be connected only to the common shield, thereby effectively tying all of them to the external ground. Thus, advantageously, not all drain wires in the cable need to connected to the external ground structure, which can be used to simplify the connection by requiring fewer mating connections at the connector. Another potential advantage is that redundant contacts can be made if more than one of the drain wire is connected to the external ground and to the shield. In such cases, one may fail to make contact to the shield or the external ground with one drain wire, but still successfully make electrical contact between the external ground and the shield through the other drain wire. Further, if the cable assembly has a fan-out configuration, wherein one end of the cable is connected to one external connector (m1=1) and common ground, and the other end is tied to multiple connectors (m2>1), then fewer connections (n1) can be made on the common end than are used (n2) for the multiple connector ends. The simplified grounding offered by such configurations may provide benefits in terms of reduced complexity and reduced number of contact pads required at the terminations.

In many of these arrangements, the unique interconnected nature of the drain wires through the shielding film(s), provided of course all of the drain wires at issue are in electrical contact with the shielding film(s), is used to simplify the termination structure and can provide a tighter (narrower) connection pitch. One straightforward embodiment is where a shielded cable that includes high speed conductor sets and multiple drain wires is terminated at both ends to one connector at each end, and fewer than all of the drain wires are terminated at each end, but each drain wire terminated at one end is also terminated at the other end. The drain wires that are not terminated are still maintained at low potential since they are also directly or indirectly tied to ground. In a related embodiment, one of the drain wires may be connected at one end but not connected (either intentionally or in error) at the other end. Again in this situation, the ground structure is maintained as long as one drain wire is connected at each end. In another related embodiment, the drain wire(s) attached at one end are not the same as the drain wire(s) that are attached at the other end. A simple version of this is depicted in FIG. 25. In that figure, a cable assembly 2501 includes a shielded electrical cable 2502 connected at one end to a termination component 2520 and connected at the other end to a termination component 2522. The cable 2502 may be virtually any shielded cable shown or described herein, so long as it includes a first drain wire 2512*a* and a second drain wire 2512*b* that are both electrically connected to at least one shielding film. As shown, the drain wire 2512*b* connects to component 2520 but not to component 2522, and drain wire 2512*a* connects to component 2522 but not to component 2520. Since the ground potential (or other controlled potential) is shared among the drain wires 2512*a*, 2512*b* and the shielding film of the cable 2502 by virtue of their mutual electrical connections, the same potential is maintained in the structure due to the common grounding. Note that both termination components 2520, 2522 could advantageously be made smaller (narrower) by eliminating the unused conduction path.

A more complex embodiment demonstrating these techniques is shown in FIGS. 26*a*-26*b*. In those figures, a shielded cable assembly 2601 has a fan-out configuration. The assembly 2601 includes a shielded electrical ribbon cable 2602 connected at a first end to a termination component 2620, and connected at a second end (which is split into three separate fan-out sections) to termination components 2622, 2624, 2626. As best seen in the cross-sectional view of FIG. 26*b*, taken along lines 26*b*-26*b* of FIG. 26*a*, the cable 2602 includes three conductor sets of insulated conductors, one coaxial type and two twinax types, and eight drain wires 2612*a-h*. The eight drain wires are all electrically connected to at least one, and preferably two shielding films in the cable 2602. The coaxial conductor set connects to termination component 2626, one twinax conductor set connects to termination component 2624, and the other twinax conductor set connects to termination component 2622, and all three conductor sets connect to the termination component 2620 at the first end of the cable. All eight of the drain wires may be connected to the termination components at the second end of the cable, i.e., drain wires 2612*a*, 2612*b*, and 2612*c* may be connected to appropriate conductive paths on termination component 2626, and drain wires 2612*d* and 2612*e* may be connected to appropriate conductive paths on termination component 2624, and drain wires 2612*f* and 2612*g* may be connected to appropriate conductive paths on termination component 2622. Advantageously, however, less than all eight of the drain wires can be connected to the termination component 2620 at the first end of the cable. In the figure, only drain wires 2612*a* and 2612*h* are shown as being connected to appropriate conductive paths on the component 2620. By omitting termination connections between the drain wires 2612*b-g* and termination component 2620, the manufacture of the assembly 2601 is simplified and streamlined. Yet, for example, the drain wires 2612*d* and 2612*e* adequately tie the conductive paths to ground potential (or another desired potential) even though neither of them is physically connected to the termination component 2620.

With regard to the parameters n1, n2, m1, and m2 discussed above, the cable assembly 2601 has n1=2, n2=8, m1=1, and m2=3.

Another fan-out shielded cable assembly 2701 is shown in FIGS. 27*a-b*. The assembly 2701 includes a shielded electrical ribbon cable 2702 connected at a first end to a termination component 2720, and connected at a second end (which is split into three separate fan-out sections) to termination components 2722, 2724, 2726. As best seen in the cross-sectional view of FIG. 27*b*, taken along lines 27*b*-27*b* of FIG. 27*a*, the cable 2702 includes three conductor sets of insulated conductors, one coaxial type and two twinax types, and eight drain wires 2712*a-h*. The eight drain wires are all electrically connected to at least one, and preferably two shielding films in the cable 2702. The coaxial conductor set connects to termination component 2726, one twinax conductor set connects to termination component 2724, and the other twinax conductor set connects to termination component 2722, and all three conductor sets connect to the termination component 2720 at the first end of the cable. Six of the drain wires may be connected to the termination components at the second end of the cable, i.e., drain wires 2712*b* and 2712*c* may be connected to appropriate conductive paths on termination component 2726, and drain wires 2712*d* and 2712*e* may be connected to appropriate conductive paths on termination component 2724, and drain wires 2712*f* and 2712*g* may be connected to appropriate conductive paths on termination component 2722. None of those six drain wires are connected to the termination component 2720 on the first end of the cable. At the first end of the cable, the other two drain wires, i.e., drain wires 2712*a* and 2712*h*, are connected to appropriate conductive paths on the component 2720. By omitting termination connections between the drain wires 2712*b-g* and termination component 2720, and between drain wire 2712*a* and termination component 2726, and between drain wire 2712*h* and termination component 2722, the manufacture of the assembly 2701 is simplified and streamlined.

With regard to the parameters n1, n2, m1, and m2 discussed above, the cable assembly 2701 has n1=2, n2=6, m1=1, and m2=3.

Many other embodiments are possible, but in general it can be advantageous to utilize the shield of the cable to connect two separate ground connections (conductors) together to ensure that the grounding is complete and at least one ground is connected to each termination location at each end of the cable, and more than two for a fanout cable. This means that each drain wire does not need to be connected to each termination point. If more than one drain wire is connected at any end, then the connection is made redundant and less prone to failure.

Section 5: Shielded Cables with Mixed Conductor Sets

We now provide further details regarding shielded ribbon cables that can employ mixed conductor sets, e.g., a conductor set adapted for high speed data transmission and another conductor set adapted for power transmission or low speed data transmission. Conductor sets adapted for power transmission or low speed data transmission can be referred to as a sideband.

Some interconnections and defined standards for high speed signal transmission allow for both high speed signal transmission (provided e.g. by twinax or coax wire arrangements) and low speed or power conductors, both of which require insulation on the conductors. An example of this is the SAS standard which defines high speed pairs and "sidebands" included in its mini-SAS 4i interconnection scheme. While the SAS standard indicates sideband usage is outside its scope and vendor-specific, a common sideband use is a SGPIO (Serial General Purpose Input Output) bus, as described in industry specification SFF-8485. SGPIO has a clock rate of only 100 kHz, and does not require high performance shielded wire.

This section therefore focuses on aspects of cables that are tailored to transmit both high speed signals and low speed signals (or power transmission), including cable configuration, termination to a linear contact array, and the termination component (e.g. paddle card) configuration. In general, the shielded electronic ribbon-like cables discussed elsewhere herein can be used with slight modification. Specifically, the disclosed shielded cables can be modified to include insulated wires in the construction that are suitable for low speed signal transmission but not high speed signal transmission, in addition to the conductor sets that are adapted for high speed data transmission, and the drain/ground wires that may also be included. The shielded cable may thus include at least two sets of insulated wires that carry signals whose data rates are significantly different. Of course, in the case of a power conductor, the line does not have a data rate. We also disclose termination components for the combination high speed/low speed shielded cables in which conductive paths for the low speed conductors are re-routed between opposite ends of the termination component, e.g., between the termination end and a connector mating end.

Stated differently, a shielded electrical cable may include a plurality of conductor sets and a first shielding film. The plurality of conductor sets may extend along a length of the cable and be spaced apart from each other along a width of the cable, each conductor set including one or more insulated conductors. The first shielding film may include cover portions and pinched portions arranged such that the cover portions cover the conductor sets and the pinched portions are disposed at pinched portions of the cable on each side of each conductor set. The plurality of conductor sets may include one or more first conductor sets adapted for high speed data transmission and one or more second conductor sets adapted for power transmission or low speed data transmission.

The electrical cable may also include a second shielding film disposed on an opposite side of the cable from the first shielding film. The cable may include a first drain wire in electrical contact with the first shielding film and also extending along the length of the cable. The one or more first conductor sets may include a first conductor set comprising a plurality of first insulated conductors having a center-to-center spacing of $\sigma \mathbf{1}$, and the one or more second conductor sets may include a second conductor set comprising a plurality of second insulated conductors having a center-to-center spacing of $\sigma \mathbf{2}$, and $\sigma \mathbf{1}$ may be greater than $\sigma \mathbf{2}$. The insulated conductors of the one or more first conductor sets may all be arranged in a single plane when the cable is laid flat. Furthermore, the one or more second conductor sets may include a second conductor set having a plurality of the insulated conductors in a stacked arrangement when the cable is laid flat. The one or more first conductor sets may be adapted for maximum data transmission rates of at least 1 Gbps (i.e., about 0.5 GHz), up to e.g. 25 Gbps (about 12.5 GHz) or more, or for a maximum signal frequency of at least 1 GHz, for example, and the one or more second conductor sets may be adapted for maximum data transmission rates that are less than 1 Gbps (about 0.5 GHz), or less than 0.5 Gbps (about 250 MHz), for example, or for a maximum signal frequency of less than 1 GHz or 0.5 GHz, for example. The one or more first may be adapted for maximum data transmission rates of at least 3 Gbps (about 1.5 GHz).

Such an electrical cable may be combined with a first termination component disposed at a first end of the cable. The first termination component may include a substrate and a plurality of conductive paths thereon, the plurality of conductive paths having respective first termination pads arranged on a first end of the first termination component. The shielded conductors of the first and second conductor sets may connect to respective ones of the first termination pads at the first end of the first termination component in an ordered arrangement that matches an arrangement of the shielded conductors in the cable. The plurality of conductive paths may have respective second termination pads arranged on a second end of the first termination component that are in a different arrangement than that of the first termination pads on the first end.

The conductor set(s) adapted for power transmission and/or lower speed data transmission may include groups of, or individual, insulated conductors that do not necessarily need to be shielded from one another, do not necessarily require associated ground or drain wires, and may not need to have a specified impedance. The benefit of incorporating them together in a cable having high speed signal pairs is that they can be aligned and terminated in one step. This differs from conventional cables, which require handling several wire groups without the automatic alignment to a paddle card, for example. The simultaneous stripping and termination process (to a linear array on a single paddle card or linear array of contacts) for both the low speed signals and the high speed signals is particularly advantageous, as is the mixed signal wire cable itself.

FIGS. 28*a-d* are front cross-sectional views of exemplary shielded electrical cables 2802*a*, 2802*b*, 2802*c*, and 2802*d* that can incorporate the mixed signal wire feature. Each of the embodiments preferably include two opposed shielding films as discussed elsewhere herein, with suitable cover portions and pinched portions, and some shielded conductors grouped into conductor sets adapted for high speed data transmission (see conductor sets 2804*a*), and some shielded conductors grouped into conductor sets adapted for low speed data transmission or power transmission (see conductor sets 2804*b*, 2804*c*). Each embodiment also preferably includes one or more drain wires 2812. The high speed conductor sets 2804*a* are shown as twinax pairs, but other configurations are also possible as discussed elsewhere herein. The lower speed insulated conductors are shown as being smaller (having a smaller diameter or transverse dimension) than the high speed insulated conductors, since the former conductors may not need to have a controlled impedance. In alternative embodiments it may be necessary or advantageous to have a larger insulation thickness around the low speed conductors compared to the high speed conductors in the same cable. However, since space is often at a premium, it is usually desirable to make the insulation thickness as small as possible. Note also that wire gauge and plating may be different for the low speed lines compared to the high speed lines in a given cable. In FIGS. 28*a-d*, the high speed and low speed insulated conductors are all arranged in a single plane. In such configurations, it can be advantageous to group multiple low speed insulated conductors together in a single set, as in conductor set 2804*b*, to maintain as small a cable width as possible.

When grouping the low speed insulated conductors into sets, the conductors need not be disposed in exactly the same geometrical plane in order for the cable to retain a generally planar configuration. Shielded cable 2902 of FIG. 29, for example, utilizes low speed insulated conductors stacked together in a compact space to form conductor set 2904*b*, the cable 2902 also including high speed conductor sets 2904*a* and 2904*c*. Stacking the low speed insulated conductors in this manner helps provide a compact and narrow cable width, but may not provide the advantage of having the conductors lined up in an orderly linear fashion (for mating with a linear array of contacts on a termination component) after mass termination. The cable 2902 also includes opposed shielding films 2908 and drain wires 2912, as shown. In alternative embodiments involving different numbers of low speed insulated conductors, stacking arrangements for the low speed insulated conductors such as shown in sets 2904*d-h* of FIG. 29*a* may also be used.

Another aspect of mixed signal wire shielded cable relates to termination components used with the cables. In particular, conductor paths on a substrate of the termination component can be configured to re-route low speed signals from one arrangement on one end of the termination component (e.g. a termination end of the cable) to a different arrangement on an opposite end of the component (e.g. a mating end for a connector). The different arrangement may for example comprise a different order of contacts or of conductor paths on one end relative to another end of the termination component. The arrangement on the termination end of the component may be tailored to match the order or arrangement of conductors in the cable, while the arrangement on an opposite end of the component may be tailored to match a circuit board or connector arrangement different from that of the cable.

The re-routing may be accomplished by utilizing any suitable technique, including in exemplary embodiments using one or more vias in combination with a multi-layer circuit board construction to transition a given conductive path from a first layer to at least a second layer in the printed circuit board, and then optionally transitioning back to the first layer. Some examples are shown in the top views of FIGS. 30*a* and 30*b*.

In FIG. 30*a*, a cable assembly 3001*a* includes a shielded electrical cable 3002 connected to a termination component 3020 such as a paddle card or circuit board, having a substrate and conductive paths (including e.g. contact pads) formed thereon. The cable 3002 includes conductor sets 3004*a*, e.g. in the form of twinax pairs, adapted for high speed data communication. The cable 3002 also includes a sideband comprising a conductor set 3004*b* adapted for low speed data and/or power transmission, the conductor set 3004*b* having four insulated conductors in this embodiment. After the cable 3002 has been mass terminated, the conductors of the various conductor sets have conductor ends that are connected (e.g. by soldering) to respective ends (e.g. contact pads) of the conductive paths on the termination component 3020, at a first end 3020*a* of the component. The contact pads or other ends of the conductive paths corresponding to the sideband of the cable are labeled 3019*a*, 3019*b*, 3019*c*, 3019*d*, and they are arranged in that order from top to bottom of the termination component 3020 (although other contact pads, associated with high speed conductors, are present above and below the sideband contact pads on the first end 3020*a*). The conductive paths for the sideband contact pads 3019*a-d*, which are shown only schematically in the figure, utilize vias and/or other patterned layers of the component 3020 as needed to connect contact pad 3019*a* to contact pad 3021*a* on the second end 3020*b* of the component, and to connect contact pad 3019*b* to contact pad 3021*b* on the second end 3020*b* of the component, and to connect contact pad 3019*c* to contact pad 3021*c* on the second end 3020*b* of the component, and to connect contact pad 3019*d* to contact pad 3021*d* on the second end 3020*b* of the component. In this way, conductor paths on the termination component are configured to re-route low speed signals from conductor set 3004*b* from one arrangement (a-b-c-d) on one end 3020*a* of the termination component to a different arrangement (d-a-c-b) on the opposite end 3020*b* of the component.

FIG. 30*b* shows a top view of an alternative cable assembly 3001*b*, and similar reference numerals are used to identify the same or similar parts. In FIG. 30*b*, the cable 3002 is mass terminated and connected to a termination component 3022 which is similar in design to termination component 3020 of FIG. 30*a*. Like component 3020, component 3022 includes contact pads or other ends of conductive paths corresponding to the sideband of the cable 3002, the contact pads being labeled 3023*a*, 3023*b*, 3023*c*, 3023*d*, and they are arranged in that order from top to bottom of the termination component 3022 (although other contact pads, associated with high speed conductors of the cable, are present above and below the sideband contact pads on the first end 3022*a* of the component 3022). The conductive paths for the sideband contact pads 3023*a-d* are again shown only schematically in the figure. They utilize vias and/or other patterned layers of the component 3022 as needed to connect contact pad 3023*a* to contact pad 3025*a* on the second end 3022*b* of the component, and to connect contact pad 3023*b* to contact pad 3025*b* on the second end 3022*b* of the component, and to connect contact pad 3023*c* to contact pad 3025*c* on the second end 3022*b* of the component, and to connect contact pad 3023*d* to contact pad 3025*d* on the second end 3022*b* of the component. In this way, conductor paths on the termination component are configured to re-route low speed signals from conductor set 3004*b* from one arrangement (a-b-c-d) on one end 3022*a* of the termination component to a different arrangement (a-c-b-d) on the opposite end 3022*b* of the component.

The cable assemblies of FIGS. 30*a* and 30*b* are similar to each other insofar as, in both cases, the termination component physically re-routes conductive paths for low speed signals across other conductive paths for other low speed signals, but not across any conductive paths for high speed signals. In this regard, it is usually not desirable to route low speed signals across a high speed signal path in order to maintain a high quality high speed signal. In some circumstances, however, with proper shielding (e.g. a many layer circuit board and adequate shielding layers), this may be accomplished with limited signal degradation in the high speed signal path as shown in FIG. 31. There, a shielded electrical cable 3102, which has been mass terminated, connects to a termination component 3120. The cable 3102 includes conductor sets 3104*a*, e.g. in the form of twinax pairs, adapted for high speed data communication. The cable 3102 also includes a sideband comprising a conductor set 3104*b* adapted for low speed data and/or power transmission, the conductor set 3004*b* having one insulated conductor in this embodiment. After the cable 3102 has been mass terminated, the conductors of the various conductor sets have conductor ends that are connected (e.g. by soldering) to respective ends (e.g. contact pads) of the conductive paths on the termination component 3120, at a first end 3120*a* of the component. The contact pad or other end of the conductive path corresponding to the sideband of the cable is labeled 3119*a*, and it is arranged immediately above (from the perspective of FIG. 31) contact pads for the middle one of the conductor sets 3104*a*. The conductive path for the sideband contact pad 3119*a*, which is shown only schematically in the figure, utilizes vias and/or other patterned layers of the component 3120 as needed to connect contact pad 3119*a* to contact pad 3121*a* on the second end 3120*b* of the component. In this way, conductor paths on the termination component are configured to re-route a low speed signal from conductor set 3104*b* from one arrangement (immediately above the middle one of conductor sets 3104*a*) on one end 3120*a* of the termination component to a different arrangement (immediately below the contact pads for the middle one of conductor sets 3104*a*) on the opposite end 3120*b* of the component.

Figure 28A:
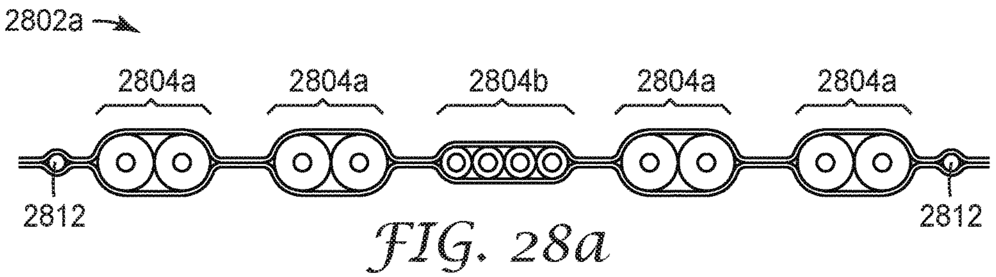
Figure 28B:
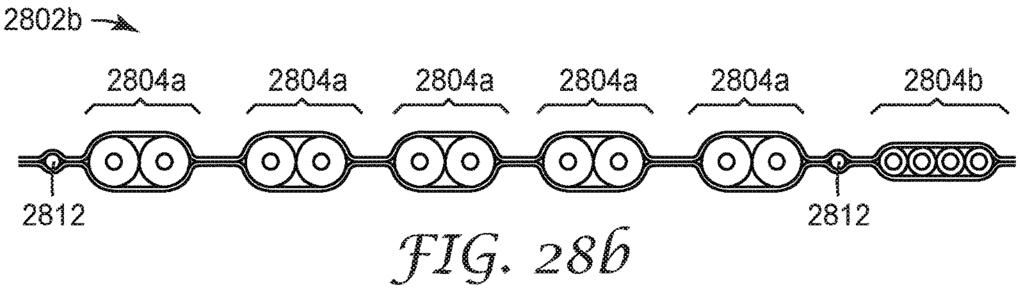
Figure 28C:
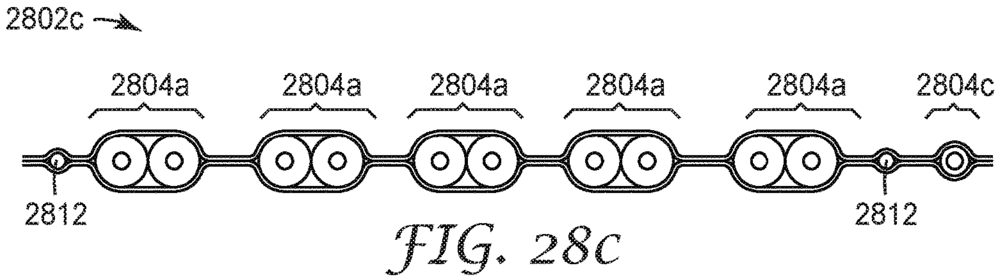
Figure 28D:
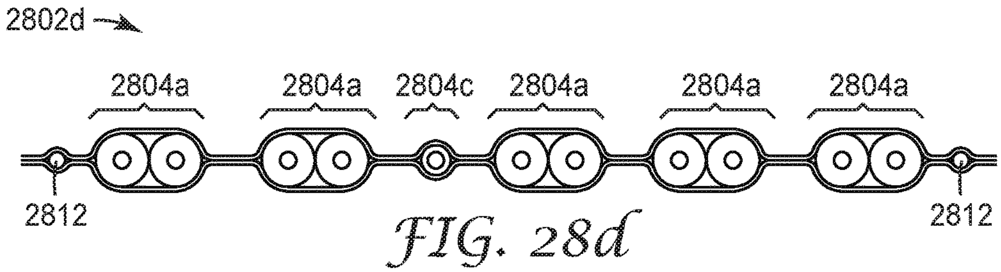

A mixed signal wire shielded electrical cable having the general design of cable 2802*a* in FIG. 28*a* was fabricated. As shown in FIG. 28*a*, the cable included four high speed twinax conductor sets and one low speed conductor set disposed in the middle of the cable. The cable was made using 30 gauge (AWG) silver-plated wires for the high speed signal wires in the twinax conductor sets, and 30 gauge (AWG) tin-plated wires for the low speed signal wire in the low speed conductor set. The outside diameter (OD) of the insulation used for the high speed wires was about 0.028 inches, and the OD of the insulation used for the low speed wires was about 0.022 inches. A drain wire was also included along each edge of the cable as shown in FIG. 28*a*. The cable was mass stripped, and individual wire ends were soldered to corresponding contacts on a mini-SAS compatible paddle card. In this embodiment, all conductive paths on the paddle card were routed from the cable end of the paddle card to the opposite (connector) end without crossing each other, such that the contact pad configuration was the same on both ends of the paddle card. A photograph of the resulting terminated cable assembly is shown in FIG. 32.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The following items are exemplary embodiments of an electrical cable arrangement according to aspects of the present invention.

Item 1 is a shielded electrical ribbon cable, comprising: a plurality of conductor sets extending lengthwise along the cable and being spaced apart from each other along a width of the cable, and each conductor set including one or more insulated conductors, the conductor sets including a first conductor set adjacent a second conductor set; and a first and second shielding film disposed on opposite sides of the cable, the first and second films including cover portions and pinched portions arranged such that, in transverse cross section, the cover portions of the first and second films in combination substantially surround each conductor set, and the pinched portions of the first and second films in combination form pinched portions of the cable on each side of each conductor set; wherein, when the cable is laid flat, a first insulated conductor of the first conductor set is nearest the second conductor set, and a second insulated conductor of the second conductor set is nearest the first conductor set, and the first and second insulated conductors have a center-to-center spacing S; and wherein the first insulated conductor has an outer dimension D1 and the second insulated conductor has an outer dimension D2; and wherein S/Dmin is in a range from 1.7 to 2, where Dmin is the lesser of D1 and D2.

Item 2 is the cable of item 1, wherein each pair of adjacent conductor sets in the plurality of conductor sets has a quantity corresponding to S/Dmin in the range from 1.7 to 2.

Item 3 is the cable of item 1, wherein each of the plurality of conductor sets has only one pair of insulated conductors, and wherein a center-to-center spacing of the pair of insulated conductors for the first conductor set is $\sigma 1$ and a center-to-center spacing of the first and second conductor sets is $\Sigma$, and wherein $\Sigma/\sigma 1$ is in a range from 2.5 to 3.

Item 4 is a shielded electrical ribbon cable, comprising: a plurality of conductor sets extending lengthwise along the cable and being spaced apart from each other along a width of the cable, each conductor set including one or more insulated conductors, the conductor sets including a first conductor set adjacent a second conductor set, the first and second conductor sets each having only one pair of insulated conductors; and a first and second shielding film disposed on opposite sides of the cable, the first and second films including cover portions and pinched portions arranged such that, in transverse cross section, the cover portions of the first and second films in combination substantially surround each conductor set, and the pinched portions of the first and second films in combination form pinched portions of the cable on each side of each conductor set; wherein, when the cable is laid flat, a center-to-center spacing of the pair of insulated conductors for the first conductor set is $\sigma 1$ and a center-to-center spacing of the first and second conductor sets is $\Sigma$, and wherein $\Sigma/\sigma 1$ is in a range from 2.5 to 3.

Item 5 is the cable of item 4, wherein each of the conductor sets has only one pair of insulated conductors, wherein the conductor sets collectively have an average center-to-center spacing of the pair of insulated conductors of $\sigma avg$ and collectively have an average center-to-center spacing of adjacent conductor sets of $\Sigma avg$, and wherein $\Sigma avg/\sigma avg$ is in a range from 2.5 to 3.

Item 6 is the cable of either item 1 or item 4, wherein the cover portions of the first and second shielding films in combination substantially surround each conductor set by encompassing at least 75% of a periphery of each conductor set.

Item 7 is the cable of either item 1 or item 4, wherein the first conductor set has a high frequency isolation between adjacent insulated conductors characterized by a crosstalk C1 at a specified frequency in a range from 3-15 GHz and for a 1 meter cable length, wherein a high frequency isolation between the first and second conductor sets is characterized by a crosstalk C2 at the specified frequency, and wherein C2 is at least 10 dB lower than C1.

Item 8 is the cable of either item 1 or item 4, wherein each shielding film includes a conductive layer disposed on a dielectric substrate.

Item 9 is the cable of either item 1 or item 4, further comprising: a first drain wire in electrical contact with at least one of the first and second shielding films.

Item 10 is the cable of item 9, wherein the first drain wire is spaced apart from the plurality of conductor sets along the width of the cable.

Item 11 is the cable of item 9, wherein, in transverse cross section, second cover portions of the first and second shielding films in combination substantially surround the first drain wire.

Item 12 is the cable of item 9, wherein the first drain wire is characterized by a drain wire distance $\sigma 1$ to a nearest insulated wire of a nearest conductor set, and wherein the nearest conductor set is characterized by a center-to-center spacing of insulated conductors of $\sigma 2$, and wherein $\sigma 1/\sigma 2$ is greater than 0.7.

Item 13 is the cable of item 9, wherein the cable includes no drain wire other than the first drain wire.

Item 14 is the cable of item 9, wherein the plurality of conductor sets includes at least eight conductor sets and each conductor set has only one pair of insulated conductors, and wherein the width of the cable is no greater than 16 mm when the cable is laid flat.

Item 15 is the cable of item 9, further comprising: a second drain wire spaced apart from the plurality of differential pairs along the width of the cable such that the plurality of differential pairs are disposed between the first and second drain wires.

Item 16 is the cable of item 15, wherein the cable includes no drain wire other than the first and second drain wires.

Item 17 is the cable of item 15, wherein the plurality of conductor sets includes at least eight conductor sets and each conductor set has only one pair of insulated conductors, and wherein the width of the cable is no greater than 16 mm when the cable is laid flat.

Item 18 is the cable of either item 1 or item 4, wherein, for each conductor set, the cover portions of the first and second films surround the conductor set except for gaps associated with the pinched cable portion on each side of the conductor set.

Item 19 is the cable of item 18, wherein the gaps are filled with a material that bonds the first and second films together at the flattened cable portions.

Item 20 is the cable of either item 1 or item 4, wherein each conductor set includes a first conductor surrounded by a first insulation and a second conductor surrounded by a second insulation, and wherein, for each conductor set, the cover portions of the first shielding film include a first portion concentric with the first conductor and a second portion concentric with the second conductor.

Item 21 is the cable of either item 1 or item 4 in combination with a substrate having a plurality of conductive paths thereon each extending from a first end to a second end of the substrate, wherein individual conductors of the insulated conductors of the cable attach to corresponding ones of the conductive paths at the first end of the substrate.

Item 22 is the combination of item 21, wherein all of the corresponding conductive paths are disposed on one major surface of the substrate.

Item 23 is the combination of item 21, wherein at least one of the corresponding conductive paths is disposed on one major surface of the substrate, and at least another of the corresponding conductive paths is disposed on an opposed major surface of the substrate.

Item 24 is the combination of item 21, wherein at least one of the conductive paths has a first portion on a first major surface of the substrate at the first end, and a second portion on an opposed second major surface of the substrate at the second end.

Item 25 is the combination of item 21, wherein alternating ones of the conductor sets attach to conductive paths on opposite major surfaces of the substrate.

Item 26 is the combination of item 21, wherein the substrate comprises a paddle card.

Item 27 is a shielded electrical cable, comprising: a plurality of conductor sets extending along a length of the cable and being spaced apart from each other along a width of the cable, each conductor set including one or more insulated conductors; a first shielding film including cover portions and pinched portions arranged such that the cover portions cover the conductor sets and the pinched portions are disposed at pinched portions of the cable on each side of each conductor set; and a first drain wire in electrical contact with the first shielding film and also extending along the length of the cable; wherein electrical contact of the first drain wire to the first shielding film is localized at at least a first treated area.

Item 28 is the cable of item 27, wherein the electrical contact of the first drain wire to the first shielding film at the first treated area is characterized by a DC resistance of less than 2 ohms.

Item 29 is the cable of item 28, wherein the first shielding film covers the first drain wire at the first treated area and at a second area, the second area being at least as long as the first treated area, and wherein a DC resistance between the first drain wire and the first shielding film is greater than 100 ohms at the second area.

Item 30 is the cable of item 29, wherein a dielectric material separates the first drain wire from the first shielding film at the second area, and at the first treated area there is little or no separation of the first drain wire from the first shielding film by the dielectric material.

Item 31 is the cable of item 27, wherein electrical contact of the first drain wire to the first shielding film is also localized at a second treated area spaced apart from the first treated area along the length of the cable.

Item 32 is the cable of item 27, further comprising: a second drain wire in electrical contact with the first shielding film, extending along the length of the cable, and spaced apart from the first drain wire; wherein electrical contact of the second drain wire to the first shielding film is localized at a second treated area.

Item 33 is the cable of item 32, wherein the second treated area is disposed at a different lengthwise position of the cable than the first treated area.

Item 34 is the cable of item 32, wherein the second treated area is disposed at a lengthwise position of the cable at which the first drain wire lacks any localized electrical contact with the first shielding film.

Item 35 is the cable of item 27, further comprising: a second shielding film also including cover portions and pinched portions; wherein the first and second shielding films are disposed on opposite sides of the cable and arranged such that, in transverse cross section, the cover portions of the first and second films in combination substantially surround each conductor set, and the pinched portions of the first and second films in combination form the pinched portions of the cable on each side of each conductor set.

Item 36 is the cable of item 35, wherein the first drain wire is also in electrical contact with the second shielding film in a localized fashion at the first treated area.

Item 37 is the cable of item 35, wherein the cover portions of the first and second shielding films in combination substantially surround each conductor set by encompassing at least 75% of a periphery of each conductor set.

Item 38 is the cable of item 35, wherein, for each conductor set, the cover portions of the first and second shielding films surround the conductor set except for gaps associated with the pinched cable portion on each side of the conductor set.

Item 39 is the cable of item 38, wherein the gaps are filled with a material that bonds the first and second films together at the flattened cable portions.

Item 40 is a method of making a shielded electrical cable, comprising: providing a cable that includes: a plurality of conductor sets extending along a length of the cable and being spaced apart from each other along a width of the cable, each conductor set including one or more insulated conductors; and a first shielding film including cover portions and pinched portions arranged such that the cover portions cover the conductor sets and the pinched portions are disposed at pinched portions of the cable on each side of each conductor set; and a first drain wire extending along the length of the cable; and selectively treating the cable at a first treated area to locally increase or establish electrical contact of the first drain wire to the first shielding film in the first treated area.

Item 41 is the method of item 40, wherein a DC resistance between the first drain wire and the first shielding film at the first treated area is greater than 100 ohms before the selectively treating and is less than 2 ohms after the selectively treating.

Item 42 is the method of item 40, wherein the selectively treating includes selectively applying force to the cable at the first treated area.

Item 43 is the method of item 40, wherein the selectively treating includes selectively heating the cable at the first treated area.

Item 44 is the method of item 40, wherein the cable also includes a second drain wire extending along the length of the cable but spaced apart from the first drain wire, and wherein the selectively treating does not substantially increase or establish electrical contact of the second drain wire to the first shielding film.

Item 45 is the method of item 40, wherein the cable further includes a second shielding film also comprising cover portions and pinched portions, the first and second shielding films being disposed on opposite sides of the cable and arranged such that, in transverse cross section, the cover portions of the first and second films in combination substantially surround each conductor set, and the pinched portions of the first and second films in combination form the pinched portions of the cable on each side of each conductor set, and wherein the first drain wire is disposed between the first and second shielding films.

Item 46 is the method of item 45, wherein the selectively treating also locally increases or establishes electrical contact of the first drain wire to the second shielding film in the first treated area.

Item 47 is a shielded electrical cable, comprising: a plurality of conductor sets extending along a length of the cable and being spaced apart from each other along a width of the cable, each conductor set including one or more insulated conductors; a first shielding film including cover portions and pinched portions arranged such that the cover portions cover the conductor sets and the pinched portions are disposed at pinched portions of the cable on each side of each conductor set; and first and second drain wires extending along the length of the cable, the first and second drain wires being electrically connected to each other at least as a result of both of them being in electrical contact with the first shielding film.

Item 48 is the cable of item 47, further comprising: a second shielding film also including cover portions and pinched portions; wherein the first and second shielding films are disposed on opposite sides of the cable and arranged such that, in transverse cross section, the cover portions of the first and second films in combination substantially surround each conductor set, and the pinched portions of the first and second films in combination form the pinched portions of the cable on each side of each conductor set; and wherein the first and second drain wires are also electrically connected with each other at least as a result of both of them being in electrical contact with the second shielding film.

Item 49 is the cable of item 48, wherein a DC resistance between the first shielding film and the first drain wire is less than 10 ohms, and a DC resistance between the second shielding film and the first drain wire is less than 10 ohms.

Item 50 is the cable of item 49, wherein the DC resistance between the first shielding film and the first drain wire is less than 2 ohms, and the DC resistance between the second shielding film and the first drain wire is less than 2 ohms.

Item 51 is the cable of item 47 in combination with one or more first termination components at a first end of the cable and one or more second termination components at a second end of the cable.

Item 52 is the combination of item 51, wherein the first and second drain wires are members of a plurality of drain wires extending along the length of the cable, wherein a number n1 of the drain wires connect to the one or more first termination components, wherein a number n2 of the drain wires connect to the one or more second termination components, and wherein n1≠n2.

Item 53 is the combination of item 52, wherein the one or more first termination components collectively have a number m1 of first termination components, and wherein the one or more second termination components collectively have a number m2 of second termination components.

Item 54 is the combination of item 53, wherein n2>n1, and m2>m1.

Item 55 is the combination of item 54, wherein m1=1.

Item 56 is the combination of item 53, wherein m1=m2.

Item 57 is the combination of item 56, wherein m1=1.

Item 58 is the combination of item 53, wherein m1<m2.

Item 59 is the combination of item 53, wherein m1>1 and m2>1.

Item 60 is the combination of item 51, wherein the first drain wire electrically connects to the one or more first termination components but does not electrically connect to the one or more second termination components.

Item 61 is the combination of item 60, wherein the second drain wire electrically connects to the one or more second termination components but does not electrically connect to the one or more first termination components.

Item 62 is a shielded electrical cable, comprising: a plurality of conductor sets extending along a length of the cable and being spaced apart from each other along a width of the cable, each conductor set including one or more insulated conductors; and a first shielding film including cover portions and pinched portions arranged such that the cover portions cover the conductor sets and the pinched portions are disposed at pinched portions of the cable on each side of each conductor set; wherein the plurality of conductor sets includes one or more first conductor sets adapted for high speed data transmission and one or more second conductor sets adapted for power transmission or low speed data transmission.

Item 63 is the cable of item 62, further comprising: a second shielding film also including cover portions and pinched portions; wherein the first and second shielding films are disposed on opposite sides of the cable and arranged such that, in transverse cross section, the cover portions of the first and second films in combination substantially surround each conductor set, and the pinched portions of the first and second films in combination form the pinched portions of the cable on each side of each conductor set.

Item 64 is the cable of item 62, further comprising: a first drain wire in electrical contact with the first shielding film and also extending along the length of the cable.

Item 65 is the cable of item 64, wherein a DC resistance between the first shielding film and the first drain wire is less than 10 ohms.

Item 66 is the cable of item 65, wherein the DC resistance between the first shielding film and the first drain wire is less than 2 ohms.

Item 67 is the cable of item 62, wherein the one or more first conductor sets includes a first conductor set comprising a plurality of first insulated conductors having a center-to-center spacing of σ1, and wherein the one or more second conductor sets includes a second conductor set comprising a plurality of second insulated conductors having a center-to-center spacing of σ2, and wherein σ1>σ2.

Item 68 is the cable of item 62, wherein the insulated conductors of the one or more first conductor sets are all arranged in a single plane when the cable is laid flat.

Item 69 is the cable of item 68, wherein the one or more second conductor sets includes a second conductor set having a plurality of the insulated conductors in a stacked arrangement when the cable is laid flat.

Item 70 is the cable of item 62, wherein the one or more first conductor sets are adapted for maximum data transmission rates of at least 1 Gbps and the one or more second conductor sets are adapted for maximum data transmission rates that are less than 1 Gbps.

Item 71 is the cable of item 70, wherein the one or more first conductor sets are adapted for maximum data transmission rates of at least 3 Gbps.

Item 72 is the cable of item 62 in combination with a first termination component disposed at a first end of the cable.

Item 73 is the combination of item 72, wherein the first termination component comprises a substrate and a plurality of conductive paths thereon, the plurality of conductive paths having respective first termination pads arranged on a first end of the first termination component, and wherein the shielded conductors of the first and second conductor sets connect to respective ones of the first termination pads at the first end of the first termination component in an ordered arrangement that matches an arrangement of the shielded conductors in the cable.

Item 74 is the combination of item 73, wherein the plurality of conductive paths have respective second termination pads arranged on a second end of the first termination component in a different arrangement than that of the first termination pads on the first end.

Item 75 is the combination of item 72, wherein the first termination component comprises a paddle card.

Item 76 is a method of terminating a shielded cable, comprising: providing the cable of item 62; and simultaneously stripping insulation material away from the insulated conductors of the one or more first and second conductor sets on a first end of the cable.

Item 77 is the method of item 76, further comprising: providing one or more first termination components including one or more first substrates having a plurality of first conductive paths thereon; and attaching the stripped conductors at the first end of the cable to the plurality of first conductive paths.

Item 78 is the method of item 77, wherein the attaching is carried out such that the stripped conductors attach to the plurality of first conductive paths at the first end of the cable in an ordered arrangement that matches an arrangement of the shielded conductors in the cable.

Item 79 is the method of item 77, wherein the one or more first termination components includes a first paddle card.

Item 80 is the method of item 77, further comprising: simultaneously stripping insulation material away from the insulated conductors of the one or more first and second conductor sets on a second end of the cable opposite the first end of the cable.

Item 81 is the method of item 80, further comprising: providing one or more second termination components including one or more second substrates having a plurality of second conductive paths thereon; and attaching the stripped conductors at the second end of the cable to the plurality of second conductive paths.

Item 82 is the method of item 81, wherein the attaching of the stripped conductors at the second end of the cable to the plurality of second conductive paths is carried out such that the stripped conductors attach to the plurality of second conductive paths at the second end of the cable in an ordered arrangement that matches an arrangement of the shielded conductors in the cable.

Item 83 is the method of item 81, wherein the one or more second termination components includes a second paddle card.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

The invention claimed is:

1. A shielded electrical ribbon cable, comprising:

a plurality of conductor sets extending lengthwise along the cable and arranged generally in a plane along a width of the cable, at least 90% of a periphery of each conductor set surrounded by and fixably coupled to an electrically conductive shield each conductor set including two insulated conductors; and first and second non-conductive polymeric layers disposed on opposite sides of the cable, the first and second polymeric layers including cover portions and pinched portions arranged such that, in transverse cross section, the cover portions of the first and second polymeric layers in combination substantially surround the plurality of conductor sets, and the pinched portions of the first and second polymeric layers in combination form pinched portions of the cable on each side of the cable, the cable comprising a transition portion on each side of the cable defined by the first and second polymeric layers and end conductors of the conductor sets nearest the pinched portions, the transition portions providing gradual transitions between the cover portions and the pinched portions of the first and second polymeric layers such that when the cable is laid flat:

at least one of the first and second polymeric layers has a radius of curvature of at least 50 microns across an entire width of the cable; and for the at least one of the first and second polymeric layers, a ratio of a minimum radius of curvature in the cover portions to a minimum radius of curvature in the transition portions is in a range from 2 to 15, wherein the plurality of conductor sets comprises adjacent first and second conductor sets, the first conductor set having a high frequency isolation between the two insulated conductors characterized by a crosstalk C1 at a specified frequency in a range from 3 to 15 GHz and for a 1 meter cable length, wherein a high frequency isolation between the first and second conductor sets is characterized by a crosstalk C2 at the specified frequency, and wherein C2 is at least 10 dB lower than C1.

2. The ribbon cable of claim 1 further comprising an adhesive layer disposed between the first and second polymeric layers and bonding the two polymeric layers in the pinched portions of the cable.

3. The ribbon cable of claim 1, wherein a maximum separation between the cover portions of the first and second polymeric layers is D, a minimum separation between the pinched portions of the first and second polymeric layers is d1, and d1/D is less than 0.25.

4. The ribbon cable of claim 1 having a skew of less than 20 psec/meter.

5. The ribbon cable of claim 1 having a skew of less than 10 psec/meter.

6. The ribbon cable of claim 1, wherein at least one conductor set in the plurality of conductor sets further includes a ground conductor generally lying in a plane of the two insulated conductors of the conductor set.

7. The ribbon cable of claim 1, wherein a characteristic impedance of the cable remains within 10% of a target characteristic impedance over a cable length of 1 meter.

8. The ribbon cable of claim 1, wherein a maximum separation between the cover portions of the first and second polymeric layers is D, a minimum separation between the pinched portions of the first and second polymeric layers on each side of the cable is d1, a minimum separation between the cover portions of the first and second layers in a region between the conductors of each conductor set is d2, and wherein d1/D is less than 0.25 and d2/D is greater than 0.33.

9. The ribbon cable of claim 1 having an insertion loss of less than −6 dB at a frequency of 5 GHz.

* * * * *